US012720809B2

(12) United States Patent
Yamazaki et al.

(10) Patent No.: US 12,720,809 B2
(45) Date of Patent: Aug. 25, 2026

(54) METAL OXIDE, FORMATION METHOD OF METAL OXIDE, SEMICONDUCTOR DEVICE, AND MANUFACTURING METHOD OF SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Yoshihiro Komatsu, Ebina (JP); Hiromi Sawai, Atsugi (JP); Ryosuke Watanabe, Yamato (JP); Shinobu Kawaguchi, Isehara (JP); Shunichi Ito, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 960 days.

(21) Appl. No.: 17/615,859

(22) PCT Filed: Jun. 8, 2020

(86) PCT No.: PCT/IB2020/055353
§ 371 (c)(1),
(2) Date: Dec. 2, 2021

(87) PCT Pub. No.: WO2020/254910
PCT Pub. Date: Dec. 24, 2020

(65) Prior Publication Data

US 2022/0320339 A1 Oct. 6, 2022

(30) Foreign Application Priority Data

Jun. 21, 2019 (JP) ................................ 2019-115150

(51) Int. Cl.
*H10D 30/67* (2025.01)
*H10D 30/01* (2025.01)

(52) U.S. Cl.
CPC ....... *H10D 30/6755* (2025.01); *H10D 30/031* (2025.01)

(58) Field of Classification Search
None
See application file for complete search history.

(56) References Cited

U.S. PATENT DOCUMENTS 8,890,159 B2 11/2014 Yamazaki et al.
9,123,573 B2 9/2015 Yamazaki et al.
(Continued)

FOREIGN PATENT DOCUMENTS

EP 2880690 A 6/2015
JP 2013-145876 A 7/2013
(Continued)

OTHER PUBLICATIONS

International Search Report (Application No. PCT/IB2020/055353), dated Sep. 8, 2020.
(Continued)

*Primary Examiner* — Alexander G Ghyka
(74) *Attorney, Agent, or Firm* — NIXON PEABODY LLP; Jeffrey L. Costellia

(57) ABSTRACT

A novel metal oxide is provided. The metal oxide includes a c-axis aligned crystal and contains indium, an element M (M is gallium, aluminum, yttrium, or tin), and zinc. In the metal oxide, the diffusion length of hydrogen is 200 nm or less and absorption due to localized states measured by a CPM is 0.01/cm or less. The diffusion length of hydrogen is calculated with the temperature being 400° C. and 1 hour.

7 Claims, 43 Drawing Sheets

(56) References Cited

U.S. PATENT DOCUMENTS

| | | | | |
|---|---|---|---|---|
| 9,331,156 | B2 | 5/2016 | Yamazaki et al. | |
| 9,391,096 | B2 | 7/2016 | Yamazaki et al. | |
| 9,583,570 | B2 | 2/2017 | Yamazaki et al. | |
| 9,954,003 | B2 | 4/2018 | Matsuda et al. | |
| 10,096,718 | B2 | 10/2018 | Asami | |
| 10,153,346 | B2 | 12/2018 | Yamazaki et al. | |
| 10,186,614 | B2 | 1/2019 | Asami | |
| 2013/0153889 | A1 | 6/2013 | Yamazaki et al. | |
| 2014/0203276 | A1 | 7/2014 | Yamazaki et al. | |
| 2017/0301699 | A1 * | 10/2017 | Yamazaki | H10D 30/6755 |
| 2022/0271167 | A1 | 8/2022 | Yamazaki et al. | |

FOREIGN PATENT DOCUMENTS

| | | | | |
|---|---|---|---|---|
| JP | 2014-045178 | A | 3/2014 | |
| JP | 2014-158018 | A | 8/2014 | |
| JP | 2017-147445 | A | 8/2017 | |
| JP | 2017-228777 | A | 12/2017 | |
| KR | 2015-0028760 | A | 3/2015 | |
| KR | 2015-0038279 | A | 4/2015 | |
| TW | 201338156 | | 9/2013 | |
| TW | 201419537 | | 5/2014 | |
| WO | WO-2013/089115 | | 6/2013 | |
| WO | WO-2013180040 | A1 * | 12/2013 | H01L 21/0217 |
| WO | WO-2014/021442 | | 2/2014 | |
| WO | WO-2016/125052 | | 8/2016 | |

OTHER PUBLICATIONS

Written Opinion (Application No. PCT/IB2020/055353), dated Sep. 8, 2020.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

* cited by examiner

FIG. 3A
Intermediate state
New crystalline phase
| Amorphous | Crystalline | Crystal |
| --- | --- | --- |
| ・completely amorphous | ・CAAC<br>・nc<br>・CAC<br>excluding single crystal and poly crystal | ・single crystal<br>・poly crystal |
FIG. 3B
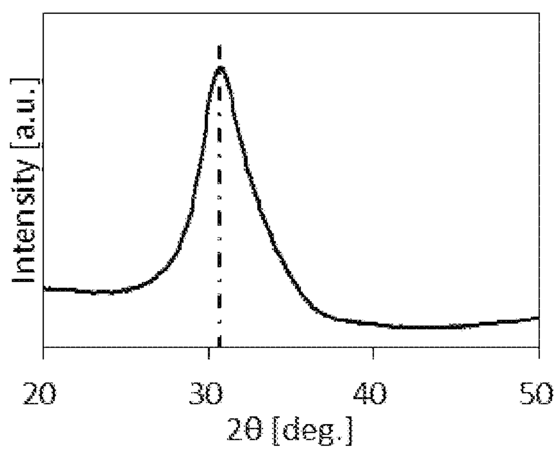
FIG. 3C
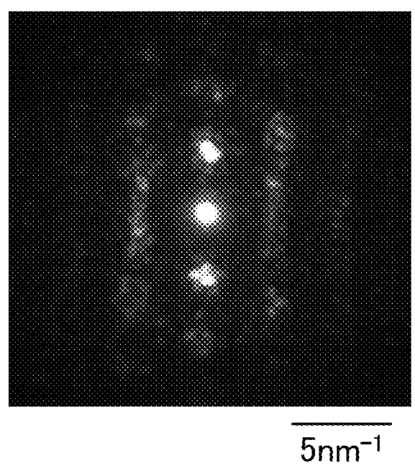

METAL OXIDE, FORMATION METHOD OF METAL OXIDE, SEMICONDUCTOR DEVICE, AND MANUFACTURING METHOD OF SEMICONDUCTOR DEVICE

TECHNICAL FIELD

One embodiment of the present invention relates to a metal oxide and a formation method of the metal oxide. Another embodiment of the present invention relates to a semiconductor device and a manufacturing method of the semiconductor device. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be sometimes said that a display device (a liquid crystal display device, a light-emitting display device, and the like), a projection device, a lighting device, an electro-optical device, a power storage device, a storage device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique by which a transistor is formed using a semiconductor thin film formed over a substrate having an insulating surface has been attracting attention. The transistor is applied to a wide range of electronic devices, such as an integrated circuit (IC) and an image display device (also simply referred to as a display device). A silicon-based semiconductor material is widely known as a semiconductor thin film applicable to the transistor; in addition, an oxide semiconductor has been attracting attention as another material.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, pp. 183-186

[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

An object of one embodiment of the present invention is to provide a novel metal oxide and a formation method thereof. Another object of one embodiment of the present invention is to provide a highly reliable semiconductor device and a manufacturing method thereof. Another object of one embodiment of the present invention is to provide a semiconductor device with favorable electrical characteristics and a manufacturing method thereof. Another object of one embodiment of the present invention is to provide a semiconductor device with a small variation in transistor characteristics and a manufacturing method thereof. Another object of one embodiment of the present invention is to provide a semiconductor device that can be miniaturized or highly integrated, and a manufacturing method thereof. Another object of one embodiment of the present invention is to provide a semiconductor device with a high on-state current and a manufacturing method thereof. Another object of one embodiment of the present invention is to provide a semiconductor device having excellent frequency characteristics and a manufacturing method thereof. Another object of one embodiment of the present invention is to provide a semiconductor device with low power consumption and a manufacturing method thereof.

Note that the description of these objects does not preclude the existence of other objects. One embodiment of the present invention does not have to achieve all of these objects. Other objects are apparent from and can be derived from the description of the specification, the drawings, the claims, and the like.

Means for Solving the Problems

One embodiment of the present invention is a metal oxide including a c-axis aligned crystal. The metal oxide includes indium, an element M (M is gallium, aluminum, yttrium, or tin), and zinc. The diffusion length of hydrogen in the metal oxide is 200 nm or less. In the metal oxide, absorption due to a localized state calculated by a CPM is $1\times10^{-2}$ $cm^{-1}$ or less.

In the above metal oxide, the diffusion length of hydrogen is preferably calculated with the temperature being 400° C. and 1 hour.

Another embodiment of the present invention is a transistor including the above-described metal oxide in a channel formation region.

Another embodiment of the present invention is a semiconductor device which includes a metal oxide; a first conductor and a second conductor in contact with the metal oxide; a third conductor overlapping the metal oxide; and an insulator positioned between the metal oxide and the third conductor. The metal oxide includes indium, an element M (M is gallium, aluminum, yttrium, or tin), and zinc. The metal oxide includes a c-axis aligned crystal. The diffusion length of hydrogen in the metal oxide is 200 nm or less. In the metal oxide, absorption due to a localized state calculated by a CPM is $1\times10^{-2}$ $cm^{-1}$ or less.

Another embodiment of the present invention is a semiconductor device which includes a metal oxide; a first conductor and a second conductor over the metal oxide; an insulator positioned between the first conductor and the second conductor and positioned over the metal oxide; and a third conductor over the insulator. The metal oxide includes indium, an element M (M is gallium, aluminum, yttrium, or tin), and zinc. The metal oxide includes a c-axis aligned crystal. The diffusion length of hydrogen in the metal oxide is 200 nm or less. In the metal oxide, absorption due to a localized state calculated by a CPM is $1\times10^{-2}$ $cm^{-1}$ or less.

In the above semiconductor device, the diffusion length of hydrogen is preferably calculated with the temperature being 400° C. and 1 hour.

Another embodiment of the present invention is a formation method of a metal oxide which includes a step of depositing a metal oxide film over a substrate; a step of performing heat treatment at a temperature higher than or equal to 500° C. and lower than or equal to 600° C. after the metal oxide film is deposited; and a step of processing the metal oxide film by a lithography method to form an island-like metal oxide. The metal oxide film is deposited by a sputtering method using an In-M-Zn oxide target (M is gallium, aluminum, yttrium, or tin) with the temperature of the substrate being higher than or equal to 200° C. and lower than or equal to 400° C.

In the above formation method of the metal oxide, it is preferable that as the heat treatment, first heat treatment be performed in a nitrogen gas atmosphere and second heat treatment be then performed in an oxygen gas atmosphere.

Another embodiment of the present invention is a formation method of a semiconductor device which includes a step of depositing a metal oxide film over a substrate; a step of performing heat treatment at a temperature higher than or equal to 500° C. and lower than or equal to 600° C. after the metal oxide film is deposited; a step of forming a conductive film over the metal oxide film; a step of processing the conductive film and the metal oxide film by a lithography method to form an island-like conductive layer and an island-like metal oxide; a step of forming a first insulator and a second insulator; a step of processing the second insulator, the first insulator, and the conductive layer to form an opening exposing the metal oxide in the second insulator and the first insulator and to form a first conductor and a second conductor; and a step of forming a third insulator and a third conductor. The metal oxide film is deposited by a sputtering method using an In-M-Zn oxide target (M is gallium, aluminum, yttrium, or tin) with the temperature of the substrate being higher than or equal to 200° C. and lower than or equal to 400° C.

In the above manufacturing method of the semiconductor device, it is preferable that as the heat treatment, first heat treatment be performed in a nitrogen gas atmosphere and second heat treatment be then performed in an oxygen gas atmosphere.

Effect of the Invention

According to one embodiment of the present invention, a novel metal oxide and a formation method thereof can be provided. According to one embodiment of the present invention, a highly reliable semiconductor device and a manufacturing method thereof can be provided. According to one embodiment of the present invention, a semiconductor device with favorable electrical characteristics and a manufacturing method thereof can be provided. According to one embodiment of the present invention, a semiconductor device with a small variation in transistor characteristics and a manufacturing method thereof can be provided. According to one embodiment of the present invention, a semiconductor device that can be miniaturized or highly integrated, and a manufacturing method thereof can be provided. According to one embodiment of the present invention, a semiconductor device with a high on-state current and a manufacturing method thereof can be provided. According to one embodiment of the present invention, a semiconductor device having excellent frequency characteristics and a manufacturing method thereof can be provided. According to one embodiment of the present invention, a semiconductor device with low power consumption and a manufacturing method thereof can be provided.

Note that the description of these effects does not preclude the existence of other effects. One embodiment of the present invention does not have to have all of these effects. Note that effects other than these will be apparent from and can be derived from the description of the specification, the drawings, the claims, and the like.

BRIEF DESCRIPTION OF THE DRAWINGS

FIG. 3A is a diagram illustrating the classification of crystal structures of IGZO. FIG. 3B is a diagram illustrating an XRD spectrum of a CAAC-IGZO film. FIG. 3C is a diagram illustrating a nanobeam electron diffraction pattern of a CAAC-IGZO film.

MODE FOR CARRYING OUT THE INVENTION

Figure 1A:
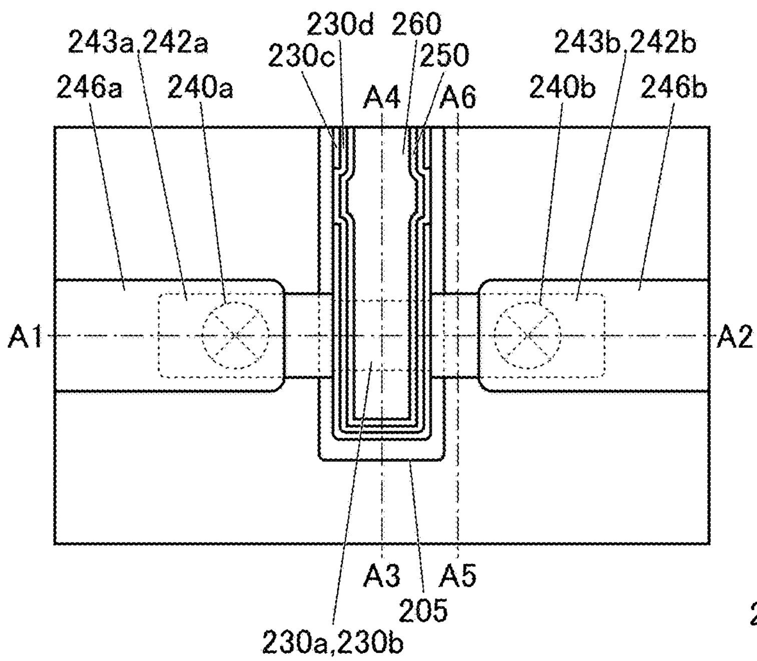
FIG. 1A is a top view of a semiconductor device.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. In addition, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "below", are used for convenience to describe the positional relation between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than one shown in drawings or text is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which a current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap each other, or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, a length of a channel formation region in a direction perpendicular to the channel length direction in a region where a semiconductor (or a portion where current flows in a semiconductor when a transistor is in an on state) and a gate electrode overlap each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of the semiconductor. For example, an element with a concentration lower than 0.1 atomic % is regarded as an impurity. When an impurity is contained, for example, the density of defect states in a semiconductor increases and the crystallinity decreases in some cases. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, in the case of an oxide semiconductor, oxygen vacancies (referred to as $V_O$ in some cases) are formed by entry of impurities in some cases, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, "normally off" means that a drain current per micrometer of channel width flowing through a transistor when no potential is applied to a gate or the gate is supplied with a ground potential is $1\times10^{-20}$ A or lower at room temperature, $1\times10^{-18}$ A or lower at 85° C., or $1\times10^{-16}$ A or lower at 125° C.

Embodiment 1

In this embodiment, a metal oxide, a formation method of the metal oxide, a semiconductor device including the metal oxide, and a manufacturing method thereof are described with reference to FIG. 1A to FIG. 19B.

<Metal Oxide and Formation Method Thereof

A metal oxide that can be used in a semiconductor layer of a transistor and a formation method of the metal oxide are described in this section.

In the transistor, as the semiconductor layer including a channel formation region, a metal oxide functioning as a semiconductor (hereinafter also referred to as an oxide semiconductor) is preferably used.

The metal oxide functioning as a semiconductor has a band gap of preferably 2 eV or higher, further preferably 2.5 eV or higher. With the use of a metal oxide having such a wide band gap, the off-state current of the transistor can be reduced.

A transistor using an oxide semiconductor in a channel formation region has an extremely low leakage current (off-state current) in the off state; hence, a semiconductor device with low power consumption can be provided. An oxide semiconductor can be deposited by a sputtering method or the like, and thus can be used for a transistor included in a highly integrated semiconductor device.

For example, as the oxide semiconductor, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, cobalt, and the like) is preferably used. In—Ga oxide, In—Zn oxide, or indium oxide may be used as the oxide semiconductor.

Here, the case where the oxide semiconductor is an In-M-Zn oxide that contains indium (In), an element M, and zinc (Zn) is considered. Note that the element M is aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, cobalt, or the like. Note that two or more of the above elements may be used in combination as the element M in some cases.

A transistor using an oxide semiconductor is likely to change its electrical characteristics when impurities and oxygen vacancies ($V_O$) exist in a channel formation region in the oxide semiconductor, which might degrade the reliability. Examples of impurities contained in the oxide semiconductor include hydrogen, nitrogen, an alkali metal, an alkaline earth metal, iron, nickel, and silicon.

In particular, hydrogen contained in the oxide semiconductor may react with oxygen bonded to a metal atom to form $H_2O$ and oxygen vacancies. In some cases, hydrogen in the vicinity of an oxygen vacancy forms a defect that is an oxygen vacancy into which hydrogen has entered (hereinafter sometimes referred to as $V_OH$), which generates an electron serving as a carrier. Furthermore, bonding of part of hydrogen to oxygen bonded to a metal atom causes generation of an electron serving as a carrier in some cases. Thus, a transistor using an oxide semiconductor containing hydrogen tends to have normally on characteristics (characteristics with which, even when no voltage is applied to the gate electrode, the channel exists and current flows through the transistor).

A defect that is an oxygen vacancy into which hydrogen has entered ($V_OH$) can function as a donor in the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases. In addition, "carrier concentration" in this specification and the like can be replaced with "carrier density".

In view of the above, hydrogen and oxygen vacancies are preferably reduced as much as possible in the channel formation region in the oxide semiconductor. Specifically, the hydrogen concentration of the channel formation region in the oxide semiconductor, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. Moreover, the carrier concentration is preferably reduced in the channel formation region in the oxide semiconductor, and the channel formation region is preferably i-type (intrinsic) or substantially i-type.

In view of the above, diffusion of hydrogen is preferably inhibited in the metal oxide used for the channel formation region of the transistor. Note that a metal oxide in which diffusion of hydrogen is inhibited can be rephrased as a metal oxide in which the diffusion length of hydrogen is small. Here, diffusion of hydrogen is inhibited presumably in such a manner that oxygen vacancies in the metal oxide are reduced and the frequency of diffusion of hydrogen via oxygen vacancies resultantly decreases. In this specification, inhibiting diffusion of hydrogen is also referred to as "freezing" hydrogen.

When the metal oxide in which diffusion of hydrogen is inhibited is used for a channel formation region of a transistor, entry of hydrogen into the channel formation region can be inhibited and a highly reliable transistor can be manufactured. In addition, it is possible to inhibit hydrogen in a source region or a drain region from diffusing into the channel formation region and to inhibit the carrier concentrations of the channel formation region, the source region, and the drain region from varying between transistors. Thus, a semiconductor device with less variations in transistor characteristics can be manufactured.

The diffusion length of hydrogen in the metal oxide can be calculated using an activation energy and a frequency factor calculated from an Arrhenius plot of a temperature and a diffusion coefficient that is estimated from results obtained by SIMS, for example. Note that a method for calculating the diffusion length of hydrogen in the metal oxide will be described in detail in a later-described Example. Specifically, the diffusion length of hydrogen in the metal oxide is 200 nm or less, preferably 100 nm or less, further preferably 60 nm or less. Note that the diffusion length of hydrogen is calculated with the temperature being 400° C. and 1 hour.

Furthermore, the amount of oxygen vacancies contained in the metal oxide is preferably reduced. When the metal oxide in which the amount of oxygen vacancies is reduced is used for a channel formation region of a transistor, the channel formation region has a reduced carrier concentration and can be i-type (intrinsic) or substantially i-type. Thus, a semiconductor device including a transistor with favorable electrical characteristics can be manufactured.

The amount of oxygen vacancies contained in the metal oxide can be evaluated by a constant photocurrent method (CPM), for example. By a CPM, deep defect states due to oxygen vacancies contained in the metal oxide can be evaluated. Note that deep defect states due to oxygen vacancies mean, for example, localized states which are formed in a range between a position at a distance of 0.5 eV from the valence band maximum of the metal oxide toward the conduction band side and a position at a distance of 0.5 eV from the conduction band minimum of the metal oxide toward the valence band side. Specifically, absorption due to localized states in the metal oxide calculated by a CPM is set to less than $2\times10^{-2}$ cm$^{-1}$, preferably less than $1\times10^{-2}$ cm$^{-1}$.

Note that the above metal oxide preferably includes a c-axis-aligned crystal. The metal oxide including a c-axis-aligned crystal is, for example, a CAAC-OS (c-axis aligned crystalline oxide semiconductor) which will be described later.

Thus, a semiconductor device including a transistor with favorable electrical characteristics can be manufactured. Furthermore, a semiconductor device including a highly reliable transistor can be manufactured. In addition, a semiconductor device with less variations in transistor characteristics can be manufactured.

Next, a method for forming the above-described metal oxide is described.

First, a metal oxide including a c-axis-aligned crystal is deposited. The metal oxide can be deposited by a sputtering method, a chemical vapor deposition (CVD) method, a molecular beam epitaxy (MBE) method, a pulsed laser deposition (PLD) method, an atomic layer deposition (ALD) method, or the like. In particular, a sputtering method is preferably used for the deposition.

In the case where the above metal oxide is deposited by a sputtering method, the above In-M-Zn oxide target or the like is used. Furthermore, oxygen or a mixed gas of oxygen and a rare gas is used as the sputtering gas. Increasing the proportion of oxygen contained in the sputtering gas can improve the crystallinity of the metal oxide. For example, the proportion of oxygen contained in the sputtering gas is higher than 30% and lower than or equal to 100%, preferably higher than or equal to 70% and lower than or equal to 100%.

In the case where the metal oxide is deposited by a sputtering method, the crystallinity of the metal oxide can be improved by depositing the metal oxide while the substrate is heated. For example, the substrate is heated so that the temperature of the substrate becomes higher than or equal to 100° C. and lower than 500° C., preferably higher than or equal to 200° C. and lower than or equal to 400° C.

Then, the above metal oxide is subjected to heat treatment at such a temperature as not to polycrystallize the metal oxide. Such a temperature as not to polycrystallize the metal oxide is, specifically, higher than or equal to 250° C. and lower than or equal to 650° C., preferably higher than or equal to 450° C. and lower than or equal to 600° C., further preferably higher than or equal to 500° C. and lower than 600° C. Performing heat treatment at the above temperature causes structural relaxation in the metal oxide. At this time, the amount of oxygen vacancies can be reduced and diffusion of hydrogen can be inhibited, without polycrystallization of the metal oxide.

Note that when heat treatment is performed at a temperature higher than or equal to 600° C. and lower than 700° C., the metal oxide is not polycrystallized but the crystallinity in the metal oxide becomes different from that in the case where heat treatment is performed at a temperature lower than 600° C., and there is a high probability that a reduction in the amount of oxygen vacancies is inhibited or oxygen vacancies are formed. Furthermore, heat treatment performed at a temperature of 700° C. or higher tends to polycrystallize the metal oxide. A polycrystal has a crystal grain boundary, which serves as a recombination center to trap carriers. It is thus highly likely that a reduction in the on-state current of a transistor, a reduction in the field-effect mobility, or the like is caused. Furthermore, heat treatment performed at a temperature lower than 250° C. might fail to reduce the hydrogen concentration in the metal oxide sufficiently.

The above heat treatment is preferably performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas is approximately 20%. The heat treatment may be performed under reduced pressure. Alternatively, the heat treatment may be performed in such a manner that heat treatment is performed in a nitrogen gas or inert gas atmosphere, and then heat treatment is performed in an atmosphere containing an oxidizing gas at 10 ppm or more, 1% or more, or 10% or more in order to compensate for released oxygen. For example, it is preferable that as the heat treatment, treatment be performed in a nitrogen atmosphere for 1 hour and then, treatment be successively performed in an oxygen atmosphere for 1 hour.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment performed using a highly purified gas can prevent entry of moisture or the like into the metal oxide as much as possible.

The above heat treatment can further improve the crystallinity of the metal oxide. Thus, it is possible to form a dense metal oxide with high crystallinity and a reduced amount of oxygen vacancies in which diffusion of hydrogen is inhibited.

The above is the description of the formation method of the above metal oxide.

Here, the aforementioned CAAC-OS is described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and traps carriers and thus decreases the on-state current and field-effect mobility of a transistor, for example. Hence, the CAAC-OS in which no clear grain boundary is observed is one of crystalline oxides having a crystal structure suitable for a semiconductor layer of a transistor. Note that Zn is preferably contained to form the CAAC-OS. For example, In—Zn oxide and In—Ga—Zn oxide are suitable because they can inhibit generation of a grain boundary as compared with indium oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Hence, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

<Structure Example of Semiconductor Device>

Figure 1C:
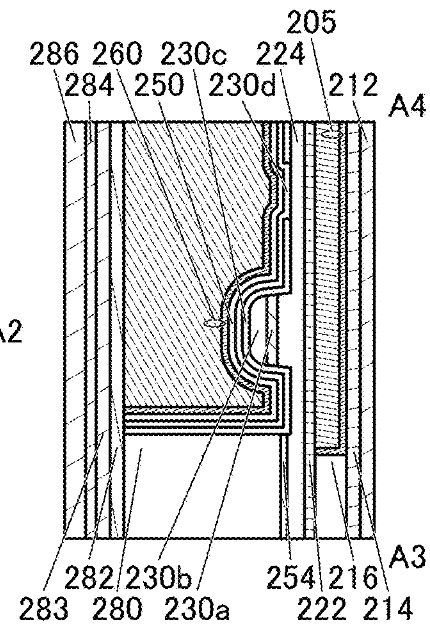
FIG. 1B to FIG. 1D are cross-sectional views of the semiconductor device.
Figure 1B:
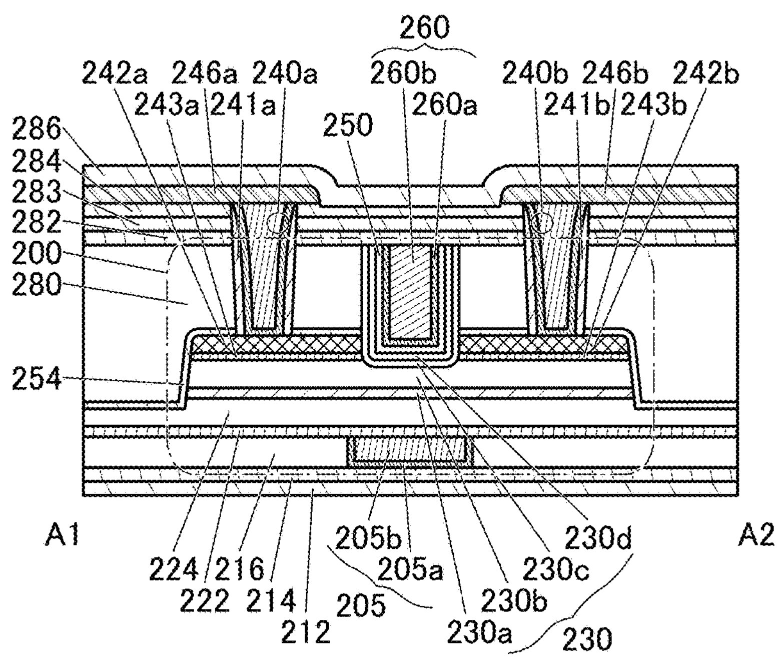
Figure 1D:
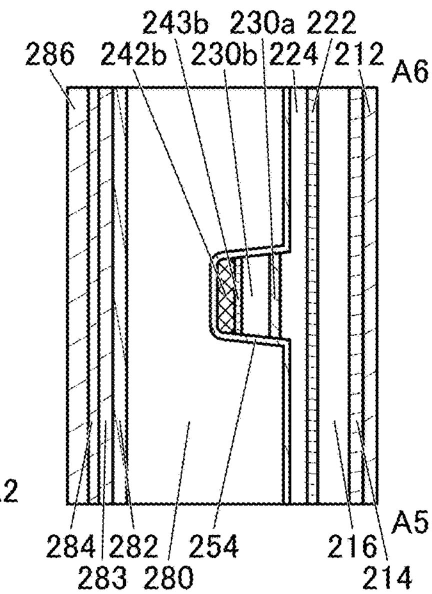

A structure of a semiconductor device that includes a transistor 200 including the above-described metal oxide is described with reference to FIG. 1A to FIG. 1D. FIG. 1A to FIG. 1D are a top view and cross-sectional views of a semiconductor device including the transistor 200. FIG. 1A is a top view of the semiconductor device. FIG. 1B to FIG. 1D are cross-sectional views of the semiconductor device. Here, FIG. 1B is a cross-sectional view of a portion indicated by the dashed-dotted line A1-A2 in FIG. 1A, and is also a cross-sectional view of the transistor 200 in the channel length direction. FIG. 1C is a cross-sectional view of a portion indicated by the dashed-dotted line A3-A4 in FIG. 1A, and is also a cross-sectional view of the transistor 200 in the channel width direction. FIG. 1D is a cross-sectional view of a portion indicated by the dashed-dotted line A5-A6 in FIG. 1A. Note that for clarity of the drawing, some components are not shown in the top view of FIG. 1A.

The semiconductor device in this embodiment includes an insulator 212 over a substrate (not illustrated), an insulator 214 over the insulator 212, an insulator 216 over the insulator 214, the transistor 200 over the insulator 214 and the insulator 216, an insulator 254 over the transistor 200, an insulator 280 over the insulator 254, an insulator 282 over the insulator 280, an insulator 283 over the insulator 282, and an insulator 284 over the insulator 283. The insulator 212, the insulator 214, the insulator 216, the insulator 254, the insulator 280, the insulator 282, the insulator 283, and the insulator 284 function as interlayer films. The semiconductor device also includes a conductor 240*a* and a conductor 240*b* that are electrically connected to the transistor 200 and function as plugs. An insulator 241*a* is provided in contact with a side surface of the conductor 240*a*, and an insulator 241*b* is provided in contact with a side surface of the conductor 240*b*. A conductor 246*a* that is electrically connected to the conductor 240*a* and functions as a wiring and a conductor 246*b* that is electrically connected to the conductor 240*b* and functions as a wiring are provided over the insulator 284, the conductor 240*a*, and the conductor 240*b*. An insulator 286 is provided over the conductor 246*a*, the conductor 246*b*, and the insulator 284.

The insulator 241*a* is provided in contact with a side wall of an opening in the insulator 254, the insulator 280, the insulator 282, the insulator 283, and the insulator 284; a first conductor of the conductor 240*a* is provided in contact with a side surface of the insulator 241*a*; and a second conductor of the conductor 240*a* is provided on the inner side thereof. The insulator 241*b* is provided in contact with a side wall of an opening in the insulator 254, the insulator 280, the insulator 282, the insulator 283, and the insulator 284; a first conductor of the conductor 240*b* is provided in contact with a side surface of the insulator 241*b*; and a second conductor of the conductor 240*b* is provided on the inner side thereof. Here, the level of a top surface of the conductor 240*a* (the conductor 240*b*) and the level of a top surface of the insulator 284 in a region overlapped by the conductor 246*a* (the conductor 246*b*) can be substantially the same. Note that in the semiconductor device shown in FIG. 1A to FIG. 1D, the first conductor of the conductor 240*a* and the second conductor of the conductor 240*a* are stacked and the first conductor of the conductor 240*b* and the second conductor of the conductor 240*b* are stacked; however, this embodiment is not limited thereto. For example, each of the conductor 240*a* and the conductor 240*b* may be provided as a single layer or to have a stacked-layer structure of three or more layers. In the case where a component has a stacked-layer structure, layers may be distinguished by ordinal numbers corresponding to the formation order.

[Transistor 200]

As shown in FIG. 1A to FIG. 1D, the transistor 200 includes a conductor 205 (a conductor 205*a* and a conductor 205*b*) positioned to be embedded in the insulator 214 and/or the insulator 216; an insulator 222 over the insulator 216 and the conductor 205; an insulator 224 over the insulator 222; an oxide 230*a* over the insulator 224; an oxide 230*b* over the oxide 230*a*; an oxide 243*a*, an oxide 243*b*, and an oxide 230*c* over the oxide 230*b*; a conductor 242*a* over the oxide 243*a*; a conductor 242*b* over the oxide 243*b*; an oxide 230*d* over the oxide 230*c*; an insulator 250 over the oxide 230*d*; and a conductor 260 (a conductor 260*a* and a conductor 260*b*) positioned over the insulator 250 and overlapping part of the oxide 230*c*. The oxide 230*c* is in contact with a side surface of the oxide 243*a*, a side surface of the oxide 243*b*, a side surface of the conductor 242*a*, and a side surface of the conductor 242*b*. The insulator 282 is in contact with top surfaces of the conductor 260, the insulator 250, the oxide 230*d*, the oxide 230*c*, and the insulator 280.

An opening reaching the oxide 230*b* is provided in the insulator 280 and the insulator 254. The oxide 230*c*, the oxide 230*d*, the insulator 250, and the conductor 260 are provided in the opening. In the channel length direction of the transistor 200, the conductor 260, the insulator 250, the oxide 230*d*, and the oxide 230*c* are provided between the conductor 242*a* and the oxide 243*a* and the conductor 242*b* and the oxide 243*b*. The insulator 250 includes a region in contact with a side surface of the conductor 260 and a region in contact with a bottom surface of the conductor 260. The oxide 230*c* includes a region in contact with the oxide 230*b*, a region overlapping the side surface of the conductor 260 with the oxide 230*d* and the insulator 250 therebetween, and a region overlapped by the bottom surface of the conductor 260 with the oxide 230*d* and the insulator 250 therebetween.

The oxide 230 preferably includes the oxide 230*a* positioned over the insulator 224, the oxide 230*b* positioned over the oxide 230*a*, the oxide 230*c* that is positioned over the oxide 230*b* and is at least partly in contact with the oxide 230*b*, and the oxide 230*d* positioned over the oxide 230*c*.

Although a structure in which the oxide 230 has a four-layer stacked structure of the oxide 230*a*, the oxide 230*b*, the oxide 230*c*, and the oxide 230*d* in the transistor 200 is described, this embodiment is not limited thereto. For example, the oxide 230 may be a single layer of the oxide 230*b* or have a two-layer structure of the oxide 230*a* and the oxide 230*b*; a two-layer structure of the oxide 230*b* and the oxide 230*c*; a three-layer structure of the oxide 230*a*, the oxide 230*b*, and the oxide 230*c*; a three-layer structure of the oxide 230*a*, the oxide 230*b*, and the oxide 230*d*; or a stacked-layer structure including five or more layers. Alternatively, each of the oxide 230*a*, the oxide 230*b*, the oxide 230*c*, and the oxide 230*d* may have a stacked-layer structure.

The conductor 260 functions as a first gate (also referred to as top gate) electrode, and the conductor 205 functions as a second gate (also referred to as back gate) electrode. The insulator 250, the insulator 224, and the insulator 222 function as gate insulators. The conductor 242*a* functions as one of a source electrode and a drain electrode, and the conductor 242*b* functions as the other of the source electrode and the drain electrode. The oxide 230 functions as a channel formation region.

Figure 2:
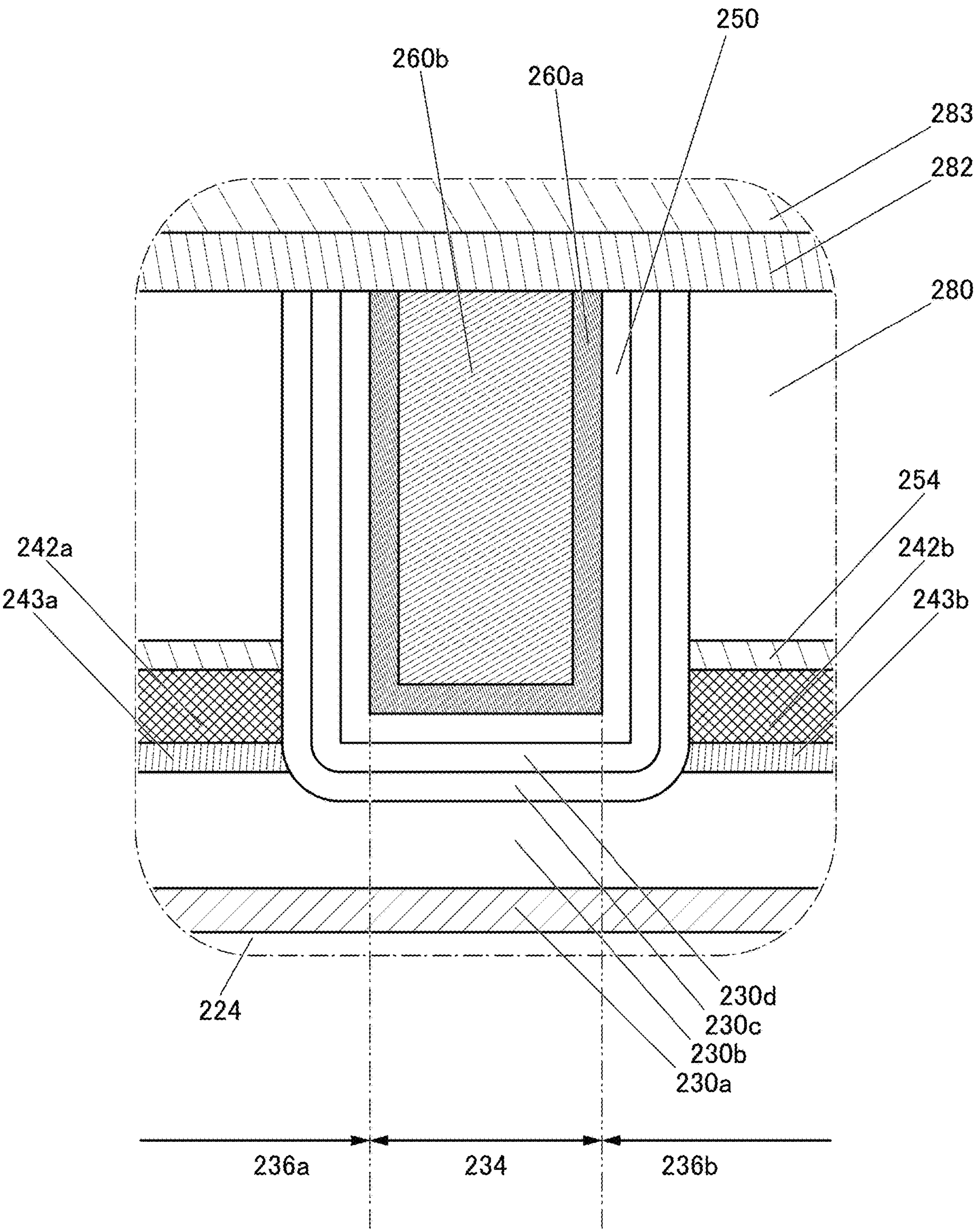
FIG. 2 is a cross-sectional view of a semiconductor device.

Here, FIG. 2 is an enlarged view of the vicinity of the channel formation region in FIG. 1B. As shown in FIG. 2, the oxide 230 includes a region 234 functioning as the channel formation region of the transistor 200 and a region 236*a* and a region 236*b* that function as a source region and a drain region and are provided such that the region 234 is sandwiched therebetween. At least part of the region 234 is overlapped by the conductor 260. The conductor 242*a* and the conductor 242*b* are provided over the oxide 230*b*, and lower-resistance regions are formed in the vicinity of the conductor 242*a* of the region 236*a* and in the vicinity of the conductor 242*b* of the region 236*b*.

The region 236*a* and the region 236*b* functioning as the source region and the drain region are each a region that has a low oxygen concentration or contains impurities such as hydrogen, nitrogen, and a metal element, for example, and thus has an increased carrier concentration and a reduced resistance. In other words, the region 236*a* and the region 236*b* are each a region having a higher carrier concentration and a lower resistance than the region 234. The region 234 functioning as the channel formation region is a higher-resistance region with a lower carrier concentration because it has a higher oxygen concentration or a lower impurity concentration than the region 236*a* and the region 236*b*, for example. A region where the oxygen concentration is higher than or equal to that of the region 236*a* (the region 236*b*) and lower than or equal to that of the region 234 may be formed between the region 234 and the region 236*a* (the region 236*b*).

Although the width of the region 234 in the channel length direction is equal to the width of the conductor 260 in FIG. 2, this embodiment is not limited thereto. The width of the region 234 is smaller than the width of the conductor 260 in some cases, and the width of the region 234 is larger than the width of the conductor 260 in other cases.

In the oxide 230, the boundaries between the regions are difficult to detect clearly in some cases. The concentration of impurities such as hydrogen, nitrogen, and a metal element detected in each region might not only gradually change between the regions, but also continuously change within each region. That is, the region closer to the channel formation region preferably has a lower concentration of impurities such as hydrogen, nitrogen, and a metal element.

To increase the oxygen concentration in the region 234, an insulator containing oxygen that is released by heating (hereinafter referred to as excess oxygen in some cases) is provided in the vicinity of the oxide semiconductor so that oxygen can be supplied from the insulator to the oxide semiconductor when heat treatment is performed. As a result, oxygen vacancies in the channel formation region contained in the oxide semiconductor can be repaired with supplied oxygen. Furthermore, supplied oxygen reacts with hydrogen remaining in the oxide semiconductor, so that the hydrogen can be removed as $H_2O$ (dehydration can be caused). This can inhibit formation of $V_OH$ in the oxide semiconductor.

However, when an excess amount of oxygen is supplied to the source region or the drain region, the carrier concentration in the source region or the drain region is reduced, so that the on-state current or field-effect mobility of the transistor 200 might be decreased, for example. Furthermore, uneven in-plane distribution of the amount of oxygen supplied to source regions or drain regions would cause variations in characteristics of the semiconductor device including the transistors.

Hence, the region 234 functioning as the channel formation region in the oxide semiconductor is preferably i-type or substantially i-type with a reduced carrier concentration, whereas the region 236*a* and the region 236*b* functioning as the source region and the drain region are preferably n-type with a high carrier concentration.

In the transistor 200, the above-described metal oxide is preferably used as the oxide 230 (the oxide 230*a*, the oxide 230*b*, the oxide 230*c*, and the oxide 230*d*) including the channel formation region. It is particularly preferable to use the above-described metal oxide as the oxide 230*b*.

The use of the above-described metal oxide as the oxide 230*b* can inhibit diffusion of hydrogen in the channel formation region and inhibit diffusion of hydrogen from the source region into the drain region or that from the drain region into the source region. Accordingly, the i-type or substantially i-type region and the n-type region can be maintained in the oxide semiconductor. Therefore, a semiconductor device including a highly reliable transistor can be manufactured. In addition, a semiconductor device with less variations in transistor characteristics can be manufactured.

Note that the above-described metal oxide is favorably used in a transistor whose channel length is reduced. The use of the above-described metal oxide can inhibit diffusion of hydrogen from a source region into a drain region or that from the drain region into the source region also in the transistor whose channel length is reduced. Accordingly, the i-type or substantially i-type region and the n-type region can be maintained in the oxide semiconductor. Specifically, the channel length can be 500 nm or less, preferably 300 nm or less, further preferably 150 nm or less. It is needless to say that the above-described metal oxide may be used in a transistor whose channel length exceeds 500 nm.

Since the above-described metal oxide has a dense structure with high crystallinity, diffusion of oxygen in the metal oxide can be inhibited. The use of the above-described metal oxide as the oxide 230*b* inhibits diffusion of oxygen in the oxide 230*b*. It is thus possible to inhibit the oxygen supplied to the region 234 through the oxide 230*c* from diffusing into the region 236*a* and the region 236*b* functioning as the source region and the drain region. As a result, formation of an offset region between the region 234 and the region 236*a* or the region 236*b* can be inhibited, and a transistor with a high on-state current can be manufactured.

Since oxygen in the oxide 230*b* is inhibited from diffusing, diffusion of oxygen into the conductor 242*a* (the conductor 242*b*) that is in contact with the oxide 230*b* through the oxide 243*a* (the oxide 243*b*) can be inhibited. Thus, it is possible to inhibit oxidation of the conductor 242*a* and the conductor 242*b* and inhibit an increase in the contact resistance between the transistor and a wiring. Consequently, the transistor can have favorable electrical characteristics and reliability.

Note that the above-described metal oxide may be used as the oxide 230*a*. The use of the above-described metal oxide as the oxide 230*a* makes it possible to inhibit diffusion of hydrogen into the oxide 230*b* from components formed below the oxide 230*a*.

The above-described metal oxide may be used as the oxide 230*c*. The use of the above-described metal oxide as the oxide 230*c* makes it possible to inhibit diffusion of impurities into the oxide 230*b* from components formed above the oxide 230*c*.

As described above, when the above-described metal oxide is used for the channel formation region of the transistor, a transistor that has stable electrical characteristics with a small variation in electrical characteristics and improved reliability can be provided.

The oxide 230 preferably has a stacked-layer structure of a plurality of oxide layers with different chemical compositions. Moreover, the oxide 230 preferably has a stacked-layer structure of a plurality of oxide layers containing a common element (as a main component) besides oxygen.

Specifically, the atomic ratio of the element M to In in the metal oxide used as the oxide 230*a* or the oxide 230*d* is preferably higher than the atomic ratio of the element M to In in the metal oxide used as the oxide 230*b* or the oxide 230*c*. The higher the atomic ratio of the element M to In is, the more likely the diffusion of impurities or oxygen is to be inhibited. Thus, including the oxide 230*a* below the oxide 230*b* makes it possible to inhibit diffusion of impurities into the oxide 230*b* from the components formed below the oxide 230*a*. Moreover, including the oxide 230*d* over the oxide 230*c* makes it possible to inhibit diffusion of impurities into the oxide 230*c* from the components formed above the oxide 230*d*.

In other words, the atomic ratio of In to the element M in the metal oxide used as the oxide 230*b* or the oxide 230*c* is preferably higher than the atomic ratio of In to the element M in the metal oxide used as the oxide 230*a* or the oxide 230*d*. When a metal oxide having a high content of indium is used for the channel formation region, the on-state current of the transistor can be increased. In that case, a main carrier path is the oxide 230*b*, the oxide 230*c*, or the vicinity thereof, e.g., the interface between the oxide 230*b* and the oxide 230*c*. The density of defect states at the interface between the oxide 230*b* and the oxide 230*c* can be made low when the oxide 230*b* and the oxide 230*c* contain a common element (as a main component) besides oxygen, whereby the influence of interface scattering on carrier conduction is small and a high on-state current can be obtained.

In order to make the oxide 230*b*, the oxide 230*c*, or the vicinity thereof, e.g., the interface between the oxide 230*b* and the oxide 230*c*, serve as a main carrier path, the conduction band minimum of each of the oxide 230*b* and the oxide 230*c* is preferably more apart from the vacuum level than the conduction band minimum of each of the oxide 230*a* and the oxide 230*d* is. In other words, the electron affinity of each of the oxide 230*b* and the oxide 230*c* is preferably larger than the electron affinity of each of the oxide 230*a* and the oxide 230*d*.

The oxide 230*b* and the oxide 230*c* preferably have crystallinity. It is particularly preferable to use the above-described CAAC-OS as the oxide 230*b* and the oxide 230*c*. The oxide 230*d* may also have crystallinity.

The use of the CAAC-OS as the oxide 230*b* or the oxide 230*c* can reduce impurities and oxygen vacancies in the region where the channel is formed in the oxide semiconductor. Accordingly, a transistor that has stable electrical characteristics with a small variation in electrical characteristics and improved reliability can be provided.

Furthermore, extraction of oxygen from the oxide 230*b* by the source electrode or the drain electrode can be inhibited. This can reduce oxygen extraction from the oxide 230*b* even when heat treatment is performed; thus, the transistor 200 is stable with respect to high temperatures in a manufacturing process (what is called thermal budget).

The CAAC-OS has a property of making oxygen move easily in the direction perpendicular to the c-axis in the crystal of the above-described metal oxide. Thus, oxygen contained in the oxide 230*c* can be efficiently supplied to the oxide 230*b*.

The CAAC-OS is a metal oxide having a dense structure with high crystallinity and a small amount of impurities or defects (e.g., oxygen vacancies). In particular, after the formation of a metal oxide, heat treatment is performed at such a temperature as not to polycrystallize the metal oxide (e.g., 400° C. to 600° C.), whereby a CAAC-OS having a dense structure with higher crystallinity can be obtained. When the density of the CAAC-OS is increased in such a manner, diffusion of impurities or oxygen in the CAAC-OS can be further reduced.

When the above-described metal oxide is used as the oxide 230*b*, diffusion of impurities and oxygen in the oxide 230*b* can be reduced. Accordingly, it is possible to reduce diffusion of the oxygen that has been supplied to the region 234 of the oxide 230*b* into the region 236*a* and the region 236*b* of the oxide 230*b*.

As described above, oxygen is selectively supplied to the region 234 functioning as the channel formation region so that the region 234 becomes i-type or substantially i-type, and oxygen is inhibited from diffusing into the region 236*a* and the region 236*b* functioning as the source region and the drain region, so that the region 236*a* and the region 236*b* can remain n-type. As a result, changes in the electrical characteristics of the transistor 200 can be inhibited, and thus in-plane variations in electrical characteristics of the transistors 200 can be inhibited.

The oxide 230*d* preferably contains at least one of the metal elements contained in the metal oxide used as the oxide 230*c*, and further preferably contains all of these metal elements. For example, it is preferable that an In-M-Zn oxide, In—Zn oxide, or indium oxide be used as the oxide 230*c*, and an In-M-Zn oxide, an M-Zn oxide, or an oxide of the element M be used as the oxide 230*d*. Accordingly, the density of defect states at the interface between the oxide 230*c* and the oxide 230*d* can be decreased.

The oxide 230*d* is preferably a metal oxide that inhibits diffusion or passage of oxygen more readily than the oxide 230*c*. Providing the oxide 230*d* between the insulator 250 and the oxide 230*c* can inhibit diffusion of oxygen contained in the insulator 280 into the insulator 250. Thus, the oxygen can be efficiently supplied to the oxide 230*b* through the oxide 230*c*. Furthermore, oxidation of the conductor 260 due to supply of the oxygen to the conductor 260 through the insulator 250 can be inhibited.

When the atomic ratio of In to the metal element as the main component in the metal oxide used as the oxide 230*d* is lower than the atomic ratio of In to the metal element as the main component in the metal oxide used as the oxide 230*c*, diffusion of In to the insulator 250 side can be inhibited. Since the insulator 250 functions as a gate insulator, the transistor exhibits poor characteristics when In enters the insulator 250 and the like. Thus, the oxide 230*d* provided between the oxide 230*c* and the insulator 250 enables a semiconductor device to have high reliability.

Here, the conduction band minimum gradually changes at junction portions of the oxide 230*a*, the oxide 230*b*, the oxide 230*c*, and the oxide 230*d*. In other words, the conduction band minimum at the junction portions of the oxide 230*a*, the oxide 230*b*, the oxide 230*c*, and the oxide 230*d* continuously changes or is continuously connected. To obtain this, the density of defect states in a mixed layer formed at the interface between the oxide 230*a* and the oxide 230*b*, the interface between the oxide 230*b* and the oxide 230*c*, and the interface between the oxide 230*c* and the oxide 230*d* is preferably decreased.

For example, when the oxide 230*a* and the oxide 230*b*, the oxide 230*b* and the oxide 230*c*, and the oxide 230*c* and the oxide 230*d* contain the same element as a main component in addition to oxygen, a mixed layer with a low density of defect states can be formed. For example, in the case where the oxide 230*b* is an In-M-Zn oxide, it is preferable to use an In-M-Zn oxide, an M-Zn oxide, an oxide of the element M, In—Zn oxide, indium oxide, or the like as the oxide 230*a*, the oxide 230*c*, and the oxide 230*d*.

Specifically, as the oxide 230*a*, a metal oxide with a composition In:M:Zn=1:3:4 [atomic ratio] or in the neighborhood thereof, or In:M:Zn=1:1:0.5 [atomic ratio] or in the neighborhood thereof is used. As each of the oxide 230*b* and the oxide 230*c*, a metal oxide with a composition In:M:Zn=1:1:1 [atomic ratio] or in the neighborhood thereof, or In:M:Zn=4:2:3 [atomic ratio] or in the neighborhood thereof is used. As the oxide 230*d*, a metal oxide with a composition In:M:Zn=1:3:4 [atomic ratio] or in the neighborhood thereof, M:Zn=2:1 [atomic ratio] or in the neighborhood thereof, M:Zn=2:5 [atomic ratio] or in the neighborhood thereof, or an oxide of the element M is used. Note that a composition in the neighborhood includes the range of ±30% of an intended atomic ratio. Gallium is preferably used as the element M.

When the oxide 230*a*, the oxide 230*b*, the oxide 230*c*, and the oxide 230*d* have the above compositions, the density of defect states at the interface between the oxide 230*a* and the oxide 230*b*, the interface between the oxide 230*b* and the oxide 230*c*, and the interface between the oxide 230*c* and the oxide 230*d* can be made low. Thus, the influence of interface scattering on carrier conduction is small, and the transistor 200 can have a high on-state current and excellent frequency characteristics.

In a cross-sectional view of the transistor in the channel length direction, it is preferable that a groove portion be provided in the oxide 230*b* and the oxide 230*c* including the CAAC-OS be embedded in the groove. At this time, the oxide 230*c* is provided to cover the inner wall (the side wall and the bottom surface) of the groove portion.

It is preferable that the depth of the groove portion of the oxide 230*b* be substantially the same as the thickness of the oxide 230*c*. In other words, the top surface of the oxide 230*c* in a region overlapping the oxide 230*b* is preferably substantially level with the interface between the oxide 230*b* and the oxide 243*a* or the oxide 243*b*. For example, with a bottom surface of the insulator 222 as a reference, the difference between the level of the interface between the oxide 230*b* and the oxide 243*a* or the oxide 243*b* and the level of the interface between the oxide 230*c* and the oxide 230*d* is preferably smaller than or equal to the thickness of the oxide 230*c*, further preferably smaller than or equal to half of the thickness of the oxide 230*c*.

Such a structure reduces the effect of impurities and defects such as $V_OH$ in the transistor and enables a channel to be formed in the oxide 230*c*. As a result, the transistor can have favorable electrical characteristics. Furthermore, a semiconductor device with a small variation in transistor characteristics and high reliability can be provided.

Moreover, impurities at the interface between the oxide 230*b* and the oxide 230*c* and in the vicinity thereof are preferably reduced or removed. In the case where the element M is not aluminum, it is particularly preferable that impurities such as aluminum and silicon be reduced or removed because such impurities hinder an improvement in the crystallinity or c-axis alignment of the oxide 230*c* and the oxide 230*b*. For example, the concentration of aluminum atoms at the interface between the oxide 230*b* and the oxide 230*c* and in the vicinity thereof is preferably lower than or equal to 2.0 atomic %, further preferably lower than or equal to 1.5 atomic %, still further preferably lower than or equal to 1.0 atomic %.

Note that in a metal oxide, a region having become an amorphous-like oxide semiconductor (a-like OS) where an improvement in crystallinity or c-axis alignment is hindered by impurities such as aluminum and silicon is referred to as a non-CAAC region in some cases. In the non-CAAC region, a large amount of $V_OH$ is generated; thus, it is highly probable that the transistor easily becomes normally on. Accordingly, the non-CAAC region is preferably reduced in size or removed.

By contrast, since a dense crystal structure is formed in the oxide 230*b* and the oxide 230*c* each having a CAAC structure, it is difficult for $V_OH$ to exist stably. Furthermore, in oxygen adding treatment described later, excess oxygen is supplied to the oxide 230*b* and the oxide 230*c*, whereby $V_OH$ and $V_O$ in the oxide 230*b* and the oxide 230*c* can be reduced. When the oxide 230*b* and the oxide 230*c* each have a CAAC structure as described above, the transistor can be inhibited from becoming normally on.

FIG. 2 shows the structure in which a side surface of the opening in which the conductor 260 and the like are embedded is substantially perpendicular to the formation surface of the oxide 230*b* including the groove portion of the oxide 230*b*; this embodiment is not limited thereto. The opening may have a U-shape with a bottom portion having a gentle curve.

Here, in the oxide 230*c*, it is preferable that the c-axis of the CAAC structure be substantially perpendicular to the formation surface or the top surface of the oxide 230*c*. Thus, the oxide 230*c* includes a region where crystal layers extend to be substantially parallel to the bottom surface and the side surface of the opening. The oxide 230*d* further preferably has a crystal structure similar to that of the oxide 230*c*.

An angle formed between the a-b plane of the CAAC structure of the oxide 230*c* in the groove portion and the a-b plane of the CAAC structure of the oxide 230*b* is preferably 60° or less, further preferably 45° or less, still further preferably 30° or less. By making the angle formed between the a-b plane of the CAAC structure of the oxide 230*c* in the groove portion and the a-b plane of the CAAC structure of the oxide 230*b* small, the crystallinity of the oxide 230*c* in the groove portion can be increased.

Note that an oxide including the non-CAAC region is not necessarily formed to be surrounded by the oxide 230*b*, the oxide 243*a*, the oxide 230*c*, and the oxide 230*d*, and is sometimes formed to be sandwiched between the oxide 230*b* and the oxide 230*c*.

As shown in FIG. 1C, a curved surface may be provided between a side surface of the oxide 230*b* and a top surface of the oxide 230*b* in the cross-sectional view of the transistor 200 in the channel width direction. That is, an end portion of the side surface and an end portion of the top surface may be curved (such a shape is hereinafter also referred to as a rounded shape).

The radius of curvature of the curved surface is preferably greater than 0 nm and less than the thickness of the oxide 230*b* in the region overlapped by the conductor 242*a* or the conductor 242*b* or less than half of the length of a region of the top surface of the oxide 230*b* that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the groove portion with the insulator 250 and the conductor 260, which are formed in a later step. Furthermore, a reduction in the length of the region of the top surface of the oxide 230*b* that does not have the curved surface can be prevented, and a decrease in the on-state current and mobility of the transistor 200 can be inhibited. Thus, a semiconductor device with favorable electrical characteristics can be provided.

Note that the oxide 230*c* may be provided for each of the transistors 200. That is, the oxide 230*c* of the transistor 200 is not necessarily in contact with the oxide 230*c* of the adjacent transistor 200. The oxide 230*c* of the transistor 200 may be apart from the oxide 230*c* of the adjacent transistor 200. In other words, a structure in which the oxide 230*c* is not located between the transistor 200 and the adjacent transistor 200 may be employed.

When the above structure is employed for the semiconductor device where a plurality of transistors 200 are located in the channel width direction, the oxide 230*c* is independently provided in each transistor 200. Accordingly, generation of a parasitic transistor between the transistor 200 and the adjacent transistor 200 can be inhibited, and generation of a leakage path along the conductor 260 can be inhibited. Thus, a semiconductor device that has favorable electrical characteristics and can be miniaturized or highly integrated can be provided.

For example, when a distance between a side end portion of the oxide 230*c* of the transistor 200 and a side end portion of the oxide 230*c* of the adjacent transistor 200, which face each other in the channel width direction of the transistor 200, is denoted by $L_1$, $L_1$ is made greater than 0 nm. When a distance between a side end portion of the oxide 230*a* of the transistor 200 and a side end portion of the oxide 230*a* of the adjacent transistor 200, which face each other in the channel width direction of the transistor 200, is denoted by $L_2$, a value of a ratio of $L_1$ to $L_2$ ($L_1/L_2$) is preferably greater than 0 and less than 1, further preferably greater than or equal to 0.1 and less than or equal to 0.9, still further preferably greater than or equal to 0.2 and less than or equal to 0.8. Note that $L_2$ may be a distance between a side end portion of the oxide 230*b* of the transistor 200 and a side end portion of the oxide 230*b* of the adjacent transistor 200, which face each other.

By a reduction in the ratio of $L_1$ to $L_2$ ($L_1/L_2$), even when misalignment of a region where the oxide 230*c* is not located between the transistor 200 and the adjacent transistor 200 occurs, the oxide 230*c* of the transistor 200 can be apart from the oxide 230*c* of the adjacent transistor 200.

By an increase in the ratio of $L_1$ to $L_2$ ($L_1/L_2$), even when the interval between the transistor 200 and the adjacent transistor 200 is decreased, the width of the minimum feature size can be secured, and further miniaturization or higher integration of the semiconductor device can be achieved.

Note that each of the conductor 260 and the insulator 250 may be shared by the adjacent transistors 200. In other words, the conductor 260 of the transistor 200 includes a region continuous with the conductor 260 of the adjacent transistor 200. In addition, the insulator 250 of the transistor 200 includes a region continuous with the insulator 250 of the adjacent transistor 200.

In the above structure, the oxide 230*d* includes a region in contact with the insulator 224 between the transistor 200 and the adjacent transistor 200. Note that the oxide 230*d* of the transistor 200 may be apart from the oxide 230*d* of the adjacent transistor 200. In that case, the insulator 250 includes a region in contact with the insulator 224 between the transistor 200 and the adjacent transistor 200.

The insulator 212, the insulator 214, the insulator 254, the insulator 282, the insulator 283, the insulator 284, and the insulator 286 preferably function as barrier insulating films that inhibit diffusion of impurities such as water and hydrogen from the substrate side or from above the transistor 200 into the transistor 200. Thus, for the insulator 212, the insulator 214, the insulator 254, the insulator 282, the insulator 283, the insulator 284, and the insulator 286, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms (an insulating material through which the impurities are unlikely to pass). Alternatively, it is preferable to use an insulating material having a function of inhibiting diffusion of oxygen (e.g., at least one of an oxygen atom, an oxygen molecule, and the like) (an insulating material through which the oxygen is unlikely to pass).

Note that in this specification, a barrier insulating film refers to an insulating film having a barrier property. A barrier property in this specification means a function of inhibiting diffusion of a targeted substance (also referred to as having low permeability). Alternatively, a barrier property in this specification means a function of trapping and fixing (also referred to as gettering) a targeted substance.

For example, silicon nitride or the like is preferably used for the insulator 212, the insulator 283, and the insulator 284, and aluminum oxide or the like is preferably used for the insulator 214, the insulator 254, and the insulator 282. Accordingly, impurities such as water and hydrogen can be inhibited from diffusing to the transistor 200 side from the substrate side through the insulator 212 and the insulator 214. Moreover, oxygen contained in the insulator 224 or the like can be inhibited from diffusing to the substrate side through the insulator 212 and the insulator 214. In this manner, the transistor 200 is preferably surrounded by the insulator 212, the insulator 214, the insulator 254, the insulator 282, the insulator 283, and the insulator 284 having a function of inhibiting diffusion of oxygen and impurities such as water and hydrogen.

The resistivities of the insulator 212, the insulator 284, and the insulator 286 are preferably low in some cases. For example, by setting the resistivities of the insulator 212, the insulator 284, and the insulator 286 to approximately $1\times10^{13}$ Ωcm, the insulator 212, the insulator 284, and the insulator 286 can sometimes reduce charge up of the conductor 205, the conductor 242*a*, the conductor 242*b*, the conductor 260, the conductor 246*a*, or the conductor 246*b* in treatment using plasma or the like in the manufacturing process of a semiconductor device. The resistivities of the insulator 212, the insulator 284, and the insulator 286 are preferably higher than or equal to $1\times10^{10}$ Ωcm and lower than or equal to $1\times10^{15}$ Ωcm.

Either the insulator 283 or the insulator 284 is not necessarily provided.

The insulator 216 and the insulator 280 preferably have a lower permittivity than the insulator 214. When a material with a low permittivity is used for an interlayer film, parasitic capacitance generated between wirings can be reduced. For example, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide is used as appropriate for the insulator 216 and the insulator 280. In particular, silicon oxide and silicon oxynitride, which have thermal stability, are preferable. Materials such as silicon oxide, silicon oxynitride, and porous silicon oxide are particularly preferable because a region containing oxygen released by heating can be easily formed.

The conductor 205 (the conductor 205*a* and the conductor 205*b*) functions as the second gate electrode in some cases. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is positioned to be overlapped by the oxide 230 and the conductor 260.

As shown in FIG. 1A, the conductor 205 is preferably provided to be larger than a region of the oxide 230 that is not overlapped by the conductor 242*a* or the conductor 242*b*. As shown in FIG. 1C, it is particularly preferable that the conductor 205 extend to a region beyond end portions of the oxide 230*a* and the oxide 230*b* that intersect with the channel width direction. That is, the conductor 205 and the conductor 260 preferably overlap each other with the insulators therebetween beyond a side surface of the oxide 230 in the channel width direction. With this structure, the channel formation region of the oxide 230 can be electrically surrounded by the electric field of the conductor 260 functioning as the first gate electrode and the electric field of the conductor 205 functioning as the second gate electrode. In this specification, a transistor structure in which a channel formation region is electrically surrounded by electric fields of a first gate electrode and a second gate electrode is referred to as a surrounded channel (S-channel) structure.

In this specification and the like, the S-channel transistor refers to a transistor structure in which a channel formation region is electrically surrounded by electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

As shown in FIG. 1C, the conductor 205 is extended to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Here, for the conductor 205*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom, an oxygen molecule, and the like).

When a conductive material having a function of inhibiting diffusion of oxygen is used for the conductor 205*a*, the conductivity of the conductor 205*b* can be inhibited from being lowered because of oxidation. As a conductive material having a function of inhibiting diffusion of oxygen, for example, tantalum, tantalum nitride, ruthenium, or ruthenium oxide is preferably used. Thus, the conductor 205*a* is a single layer or stacked layers of the above conductive materials. For example, the conductor 205*a* may be a stack of tantalum, tantalum nitride, ruthenium, or ruthenium oxide and titanium or titanium nitride.

The conductor 205*b* is preferably formed using a conductive material containing tungsten, copper, or aluminum as its main component. Although shown as a single layer, the conductor 205*b* may have a stacked-layer structure and may be, for example, a stack of any of the above conductive materials and titanium or titanium nitride.

Although the transistor 200 having a structure in which the conductor 205*a* and the conductor 205*b* are stacked as the conductor 205 is shown, this embodiment is not limited thereto. For example, the conductor 205 may have a single-layer structure or a stacked-layer structure of three or more layers. In the case where a component has a stacked-layer structure, layers may be distinguished by ordinal numbers corresponding to the formation order.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

As the insulator 222, an insulator containing an oxide of one or both of aluminum and hafnium, which is an insulating material, is preferably used. The insulator containing an oxide of one or both of aluminum and hafnium has a barrier property against oxygen, hydrogen, and water. It is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used as the insulator 222.

For example, a single layer or stacked layers of an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used for the insulator 222. With miniaturization and high integration of transistors, a problem such as leakage current may arise because of a thinner gate insulator. When a high-k material is used for the insulator functioning as a gate insulator, a gate potential during operation of the transistor can be reduced while the physical thickness of the gate insulator is maintained.

It is preferable that the insulator 224 in contact with the oxide 230 release oxygen by heating. Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

Specifically, for the insulator 224, it is preferable to use an insulating material including a region containing oxygen in excess of that in the stoichiometric composition (hereinafter also referred to as an excess-oxygen region) or an insulating material containing excess oxygen. An oxide film that includes an excess-oxygen region or excess oxygen is an oxide film in which the amount of released oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS (Thermal Desorption Spectroscopy) analysis. Note that the temperature of the film surface in the TDS analysis preferably ranges from 100° C. to 700° C. or from 100° C. to 400° C.

One or more of heat treatment, microwave treatment, and RF treatment may be performed in a state in which the insulator including an excess-oxygen region and the oxide 230 are in contact with each other. By the treatment, water or hydrogen in the oxide 230 can be removed. Note that part of hydrogen diffuses into or is trapped (also referred to as gettering) by the conductor 242*a* and the conductor 242*b* in some cases.

For the microwave treatment, for example, an apparatus including a power supply that generates high-density plasma or an apparatus including a power supply that applies RF to the substrate side is suitably used. For example, the use of a gas containing oxygen and high-density plasma enables high-density oxygen radicals to be generated, and RF application to the substrate side allows the oxygen radicals generated by the high-density plasma to be efficiently introduced into the oxide 230 or an insulator in the vicinity of the oxide 230. The pressure in the microwave treatment is higher than or equal to 133 Pa, preferably higher than or equal to 200 Pa, further preferably higher than or equal to 400 Pa. As a gas introduced into an apparatus for performing the microwave treatment, oxygen and argon are used, for example, and the microwave treatment is performed with an oxygen flow rate ratio ($O_2/(O_2+Ar)$) lower than or equal to 50%, preferably higher than or equal to 10% and lower than or equal to 30%.

In a manufacturing process of the transistor 200, heat treatment is preferably performed with a surface of the oxide 230 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies. The heat treatment may be performed under reduced pressure. Alternatively, the heat treatment may be performed in such a manner that heat treatment is performed in a nitrogen gas or inert gas atmosphere, and then heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then heat treatment is successively performed in a nitrogen gas or inert gas atmosphere.

Note that oxygen adding treatment performed on the oxide 230 can promote a reaction in which oxygen vacancies in the oxide 230 are repaired with supplied oxygen. Furthermore, hydrogen remaining in the oxide 230 reacts with supplied oxygen, so that the hydrogen can be removed as $H_2O$ (dehydration can be caused). This can inhibit recombination of hydrogen remaining in the oxide 230 with oxygen vacancies and formation of $V_OH$.

Note that the insulator 222 and the insulator 224 may each have a stacked-layer structure of two or more layers. In that case, without limitation to a stacked-layer structure formed of the same material, a stacked-layer structure formed of different materials may be employed.

The oxide 243*a* and the oxide 243*b* may be provided over the oxide 230*b*.

The oxide 243*a* and the oxide 243*b* preferably have a function of inhibiting the passage of oxygen. The oxide 243*a* (the oxide 243*b*) having a function of inhibiting the passage of oxygen is preferably provided between the oxide 230*b* and the conductor 242*a* (the conductor 242*b*) functioning as the source electrode or the drain electrode, in which case the electric resistance between the conductor 242*a* (the conductor 242*b*) and the oxide 230*b* can be reduced. Such a structure can improve the electrical characteristics of the transistor 200 and the reliability of the transistor 200. In the case where the electric resistance between the oxide 230*b* and the conductor 242*a* (the conductor 242*b*) can be sufficiently reduced, the oxide 243*a* (the oxide 243*b*) is not necessarily provided.

A metal oxide containing the element M may be used as the oxide 243*a* and the oxide 243*b*. In particular, aluminum, gallium, yttrium, or tin is preferably used as the element M. The concentration of the element M in the oxide 243*a* and the oxide 243*b* is preferably higher than that in the oxide 230*b*. Gallium oxide may be used as the oxide 243*a* and the oxide 243*b*. A metal oxide such as an In-M-Zn oxide may be used as the oxide 243*a* and the oxide 243*b*. Specifically, the atomic ratio of the element M to In in the metal oxide used as the oxide 243*a* and the oxide 243*b* is preferably higher than the atomic ratio of the element M to In in the metal oxide used as the oxide 230*b*. The thicknesses of the oxide 243*a* and the oxide 243*b* are preferably greater than or equal to 0.5 nm and less than or equal to 5 nm, further preferably greater than or equal to 1 nm and less than or equal to 3 nm, still further preferably greater than or equal to 1 nm and less than or equal to 2 nm. The oxide 243*a* and the oxide 243*b* preferably have crystallinity. With the oxide 243*a* and the oxide 243*b* having crystallinity, release of oxygen in the oxide 230 can be favorably inhibited. When the oxide 243*a* and the oxide 243*b* have a hexagonal crystal structure, for example, release of oxygen in the oxide 230 can sometimes be inhibited.

The conductor 242*a* is provided over the oxide 243*a*, and the conductor 242*b* is provided over the oxide 243*b*.

For the conductor 242*a* and the conductor 242*b*, for example, a nitride containing tantalum, a nitride containing titanium, a nitride containing molybdenum, a nitride containing tungsten, a nitride containing tantalum and aluminum, a nitride containing titanium and aluminum, or the like is preferably used. In this embodiment, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

A curved surface is sometimes included between the side surface of the conductor 242*a* (the conductor 242*b*) and a top surface of the conductor 242*a* (the conductor 242*b*). That is, an end portion of the side surface and an end portion of the top surface may be curved. The radius of curvature of the curved surface at the end portion of each of the conductor 242*a* and the conductor 242*b* is greater than or equal to 3 nm and less than or equal to 10 nm, preferably greater than or equal to 5 nm and less than or equal to 6 nm, for example. When the end portions are not angular, coverage with films in later deposition steps is improved.

When the oxide 243*a* (the oxide 243*b*) is not provided, the contact between the conductor 242*a* (the conductor 242*b*) and the oxide 230*b* or the oxide 230*c* may make oxygen in the oxide 230*b* or the oxide 230*c* diffuse into the conductor 242*a* (the conductor 242*b*), resulting in oxidation of the conductor 242*a* (the conductor 242*b*). It is highly probable that oxidation of the conductor 242*a* and the conductor 242*b* lowers the conductivity of the conductor 242*a* and the conductor 242*b*. Note that diffusion of oxygen in the oxide 230*b* or the oxide 230*c* into the conductor 242*a* and the conductor 242*b* can be rephrased as absorption of oxygen in the oxide 230*b* or the oxide 230*c* by the conductor 242*a* and the conductor 242*b*.

When oxygen in the oxide 230*b* or the oxide 230*c* diffuses into the conductor 242*a* and the conductor 242*b*, a layer is sometimes formed between the conductor 242*a* and the oxide 230*b* and between the conductor 242*b* and the oxide 230*b* or between the conductor 242*a* and the oxide 230*c* and between the conductor 242*b* and the oxide 230*c*. The layer contains more oxygen than the conductor 242*a* or the conductor 242*b* does, and thus the layer is assumed to have an insulating property. In this case, a three-layer structure of the conductor 242*a* or the conductor 242*b*, the layer, and the oxide 230*b* or the oxide 230*c* can be regarded as a three-layer structure of a metal, an insulator, and a semiconductor and can be referred to as a MIS (Metal-Insulator-Semiconductor) structure or a diode-connected structure mainly formed of the MIS structure.

Note that hydrogen contained in the oxide 230*b*, the oxide 230*c*, or the like diffuses into the conductor 242*a* or the conductor 242*b* in some cases. In particular, when a nitride containing tantalum is used for the conductor 242*a* and the conductor 242*b*, hydrogen contained in the oxide 230*b*, the oxide 230*c*, or the like is likely to diffuse into the conductor 242*a* or the conductor 242*b*, and the hydrogen that has diffused is bonded to nitrogen contained in the conductor 242*a* or the conductor 242*b* in some cases. That is, hydrogen contained in the oxide 230*b*, the oxide 230*c*, or the like is sometimes absorbed by the conductor 242*a* or the conductor 242*b*.

The insulator 254 is provided to cover a side surface of the oxide 230*a*, the side surface of the oxide 230*b*, the side surface of the oxide 243*a*, the side surface of the oxide 243*b*, the side surface of the conductor 242*a*, the top surface of the conductor 242*a*, the side surface of the conductor 242*b*, and the top surface of the conductor 242*b*.

The insulator 254 preferably has a function of inhibiting diffusion of oxygen. For example, the insulator 254 preferably has a function of inhibiting oxygen diffusion more than the insulator 280. An insulator containing an oxide of one or both of aluminum and hafnium is preferably deposited as the insulator 254, for example.

Moreover, as the insulator 254, aluminum oxide or hafnium oxide is preferably deposited in an oxygen-containing atmosphere by a bias sputtering method. The bias sputtering method is a method in which sputtering is performed while RF power is applied to a substrate. The potential of the substrate supplied with the RF power becomes a negative potential (referred to as a bias potential) with respect to a plasma potential, and cations in plasma are accelerated by the bias potential and implanted into the substrate. The bias potential can be controlled by the amount of RF power applied to the substrate. Therefore, aluminum oxide or hafnium oxide is deposited by the bias sputtering method in an oxygen-containing atmosphere, whereby oxygen can be implanted into the insulator 224.

Note that in the bias sputtering method, the amount of oxygen implanted into the insulator 224 serving as a base of the insulator 254 can be controlled with the amount of RF power applied to the substrate. For example, as the RF power, a bias with a power density of 0.31 $W/cm^2$ or more, preferably 0.62 $W/cm^2$ or more, further preferably 1.86 $W/cm^2$ or more is applied to the substrate. In other words, the implantation amount of oxygen can be changed to be appropriate for the characteristics of the transistor, with the RF power used in depositing the insulator 254. Moreover, an appropriate amount of oxygen for improving the reliability of the transistor can be implanted. The RF frequency is preferably 10 MHz or higher. The typical frequency is 13.56 MHz. The higher the RF frequency is, the less damage the substrate gets. Thus, the amount of oxygen to be implanted into the insulator 224 can be controlled by adjusting the RF power applied to the substrate, so that the optimal amount of oxygen can be implanted into the insulator 224.

Note that a bias applied to the substrate in the bias sputtering method is not limited to the RF power and may be a DC voltage.

As described above, the insulator 254 has a function of implanting oxygen into the film serving as a base, but the insulator 254 itself has a function of inhibiting the passage of oxygen. Accordingly, when the insulator 280 is formed over the insulator 254 and oxygen is diffused from the insulator 280 in a later step, the oxygen can be prevented from directly diffusing from the insulator 280 into oxide layers to be the oxide 230*a*, the oxide 230*b*, the oxide 243*a*, and the oxide 243*b* and a conductive layer to be the conductor 242*a* and the conductor 242*b*.

Providing the above-described insulator 254 can separate the oxide 230*a*, the oxide 230*b*, the oxide 243*a*, the oxide 243*b*, the conductor 242*a*, and the conductor 242*b* from the insulator 280. Thus, oxygen can be inhibited from directly diffusing from the insulator 280 into the oxide 230*a*, the oxide 230*b*, the oxide 243*a*, the oxide 243*b*, the conductor 242*a*, and the conductor 242*b*. Accordingly, a reduction in the carrier concentration in the source region and the drain region of the oxide 230 due to supply of excess oxygen to the source region and the drain region can be prevented. Furthermore, the conductor 242*a* and the conductor 242*b* can be inhibited from being excessively oxidized to have increased resistivity, and thus a reduction in on-state current can be inhibited.

The insulator 250 is preferably positioned in contact with at least part of the oxide 230*d*. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride are preferable because they are thermally stable.

Like the insulator 224, the insulator 250 is preferably formed using an insulator that releases oxygen by heating. When an insulator that releases oxygen by heating is provided as the insulator 250 in contact with at least part of the oxide 230*d*, oxygen can be effectively supplied to the channel formation region of the oxide 230 and oxygen vacancies in the channel formation region of the oxide 230 can be reduced. Thus, a transistor that has stable electrical characteristics with a small variation in electrical characteristics and improved reliability can be provided. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Although the insulator 250 is illustrated as a single layer in FIG. 1B and FIG. 1C, a stacked-layer structure of two or more layers may be employed. Note that the insulator 250 having a stacked-layer structure will be described later.

A metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, the reduction in the amount of oxygen supplied to the oxide 230 can be inhibited. Moreover, oxidation of the conductor 260 due to oxygen in the insulator 250 can be inhibited.

Note that the above-described metal oxide preferably has a function of part of the first gate electrode. With the above-described metal oxide, the on-state current of the transistor 200 can be increased without a reduction in the influence of the electric field from the conductor 260. For example, a metal oxide that can be used as the oxide 230 can be used as the above-described metal oxide. In that case, when the conductor 260*a* is deposited by a sputtering method, the above-described metal oxide can have a reduced electric resistance value to be a conductor. Such a conductor can be referred to as an OC (Oxide Conductor) electrode.

With the above-described metal oxide, the on-state current of the transistor 200 can be increased without a reduction in the influence of the electric field from the conductor 260.

The conductor 260 preferably includes the conductor 260*a* and the conductor 260*b* positioned over the conductor 260*a*. For example, the conductor 260*a* is preferably positioned to cover a bottom surface and a side surface of the conductor 260*b*. As shown in FIG. 1B and FIG. 1C, the top surface of the conductor 260 is positioned to be substantially level with the top surface of the insulator 250, the top surface of the oxide 230*d*, and the top surface of the oxide 230*c*. Although the conductor 260 has a two-layer structure of the conductor 260*a* and the conductor 260*b* in FIG. 1B and FIG. 1C, the conductor 260 may have a single-layer structure or a stacked-layer structure of three or more layers.

For the conductor 260*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule, and a copper atom. Alternatively, it is preferable to use a conductive material having a function of inhibiting diffusion of oxygen (e.g., at least one of an oxygen atom, an oxygen molecule, and the like).

When the conductor 260*a* has a function of inhibiting diffusion of oxygen, the conductivity of the conductor 260*b* can be inhibited from being lowered because of oxidation due to oxygen contained in the insulator 250. As a conductive material having a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260*b*. The conductor 260*b* may have a stacked-layer structure, for example, a stacked-layer structure of titanium or titanium nitride and the above conductive material.

In the transistor 200, the conductor 260 is formed in a self-aligned manner to fill the opening formed in the insulator 280 and the like. The formation of the conductor 260 in this manner allows the conductor 260 to be positioned certainly in a region between the conductor 242*a* and the conductor 242*b* without alignment.

As shown in FIG. 1C, in the channel width direction of the transistor 200, the level of the bottom surface of the conductor 260 in a region where the conductor 260 and the oxide 230*b* do not overlap each other is preferably lower than the level of a bottom surface of the oxide 230*b*. When the conductor 260 functioning as the gate electrode covers a side surface and a top surface of the channel formation region of the oxide 230*b* with the insulator 250 and the like therebetween, the electric field of the conductor 260 is likely to act on the entire channel formation region of the oxide 230*b*. Thus, the on-state current of the transistor 200 can be increased and the frequency characteristics of the transistor 200 can be improved. When the bottom surface of the insulator 222 is a reference, the difference between the level of the bottom surface of the conductor 260 in a region where the oxide 230*a* and the oxide 230*b* are not overlapped by the conductor 260 and the level of the bottom surface of the oxide 230*b* is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 254. The top surface of the insulator 280 may be planarized.

The concentration of impurities such as water and hydrogen in the insulator 280 is preferably reduced. Moreover, the insulator 280 preferably has a low hydrogen concentration and includes an excess-oxygen region or excess oxygen, and may be provided using a material similar to that for the insulator 216, for example. The insulator 280 may have a stacked-layer structure of the above materials; for example, a stacked-layer structure of silicon oxide deposited by a sputtering method and silicon oxynitride deposited thereover by a CVD method can be employed. Furthermore, silicon nitride may be stacked thereover.

For the conductor 240*a* and the conductor 240*b*, a conductive material containing tungsten, copper, or aluminum as its main component is preferably used.

The conductor 240*a* and the conductor 240*b* may each have a stacked-layer structure. In the case where the conductor 240*a* and the conductor 240*b* each have a stacked-layer structure, a conductive material having a function of inhibiting passage of impurities such as water and hydrogen is preferably used for a conductor in contact with the insulator 284, the insulator 283, the insulator 282, the insulator 280, and the insulator 254. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 284 can be inhibited from entering the oxide 230 through the conductor 240*a* and the conductor 240*b*.

For the insulator 241*a* and the insulator 241*b*, for example, an insulator such as silicon nitride, aluminum oxide, or silicon nitride oxide is used. Since the insulator 241*a* and the insulator 241*b* are provided in contact with the insulator 254, impurities such as water and hydrogen contained in the insulator 280 or the like can be inhibited from entering the oxide 230 through the conductor 240*a* and the conductor 240*b*. In particular, silicon nitride is suitable because of having a high blocking property against hydrogen. Furthermore, oxygen contained in the insulator 280 can be prevented from being absorbed by the conductor 240*a* and the conductor 240*b*.

The conductor 246*a* functioning as a wiring may be provided in contact with the top surface of the conductor 240*a*, and the conductor 246*b* functioning as a wiring may be provided in contact with the top surface of the conductor 240*b*. For the conductor 246*a* and the conductor 246*b*, a conductive material containing tungsten, copper, or aluminum as its main component is preferably used. Furthermore, the conductor may have a stacked-layer structure and may be a stack of titanium or titanium nitride and any of the above conductive materials, for example. Note that the conductor may be formed to be embedded in an opening provided in an insulator.

The insulator 286 is provided over the conductor 246*a*, the conductor 246*b*, and the insulator 284. Thus, a top surface of the conductor 246*a*, a side surface of the conductor 246*a*, a top surface of the conductor 246*b*, and a side surface of the conductor 246*b* are in contact with the insulator 286, and a bottom surface of the conductor 246*a* and a bottom surface of the conductor 246*b* are in contact with the insulator 284. In other words, each of the conductor 246*a* and the conductor 246*b* can be surrounded by the insulator 284 and the insulator 286. With such a structure, the passage of oxygen from the outside can be inhibited and the oxidation of the conductor 246*a* and the conductor 246*b* can be prevented. Furthermore, the above structure is preferable because impurities such as water and hydrogen can be prevented from diffusing from the conductor 246*a* and the conductor 246*b* to the outside.

<Constituent Materials for Semiconductor Device>

Constituent materials that can be used for the semiconductor device are described below.

[Substrate]

As the substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

[Insulator]

Examples of an insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as leakage current may arise because of a thinner gate insulator. When a high-k material is used for the insulator functioning as a gate insulator, the voltage during operation of the transistor can be reduced while the physical thickness of the gate insulator is maintained. By contrast, when a material with a low relative permittivity is used for the insulator functioning as an interlayer film, the parasitic capacitance generated between wirings can be reduced. Thus, a material is preferably selected depending on the function of the insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using a metal oxide is surrounded by an insulator having a function of inhibiting passage of oxygen and impurities such as hydrogen, the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies contained in the oxide 230 can be compensated for.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is particularly preferable to use a conductive material containing oxygen and a metal element contained in the metal oxide where the channel is formed. Alternatively, a conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

[Metal Oxide]

The oxide 230 is preferably formed using a metal oxide functioning as a semiconductor (an oxide semiconductor). A metal oxide that can be used as the oxide 230 of the present invention is described below.

The metal oxide preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

Note that in this specification and the like, a metal oxide containing nitrogen is also collectively referred to as a metal oxide in some cases. A metal oxide containing nitrogen may be referred to as a metal oxynitride.

«Classification of Crystal Structures»

First, the classification of crystal structures of an oxide semiconductor is described with reference to FIG. 3A. FIG. 3A is a diagram illustrating the classification of crystal structures of an oxide semiconductor, typically IGZO (a metal oxide containing In, Ga, and Zn).

As shown in FIG. 3A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 3A are in an intermediate state between "Amorphous" and "Crystal", and belong to a new boundary region (new crystalline phase). That is, these structures are completely different from "Amorphous", which is energetically unstable, and "Crystal".

A crystal structure of a film or a substrate can be analyzed with an X-ray diffraction (XRD) spectrum. FIG. 3B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 3B and obtained by GIXD measurement is hereinafter simply referred to as an XRD spectrum. The CAAC-IGZO film in FIG. 3B has a composition in the neighborhood of In:Ga:Zn=4:2:3 [atomic ratio]. The CAAC-IGZO film in FIG. 3B has a thickness of 500 nm.

In FIG. 3B, the horizontal axis represents 2θ [deg.], and the vertical axis represents intensity [a.u.]. As shown in FIG. 3B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 3B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 3C shows a diffraction pattern of a CAAC-IGZO film. FIG. 3C shows a diffraction pattern obtained with the NBED method in which an electron beam is incident in the direction parallel to the substrate. The CAAC-IGZO film in FIG. 3C has a composition in the neighborhood of In:Ga:Zn=4:2:3 [atomic ratio]. In the nanobeam electron diffraction method, electron diffraction is performed with a probe diameter of 1 nm.

As shown in FIG. 3C, a plurality of spots indicating c-axis alignment are observed in the diffraction pattern of the CAAC-IGZO film.

«Structure of Oxide Semiconductor»

Oxide semiconductors may be classified in a manner different from that in FIG. 3A when classified in terms of the crystal structure. For example, oxide semiconductors are classified into a single crystal oxide semiconductor and a non-single-crystal oxide semiconductor. Examples of the non-single-crystal oxide semiconductor include the above-described CAAC-OS and nc-OS. Other examples of the non-single-crystal oxide semiconductor include a polycrystalline oxide semiconductor, an a-like OS, and an amorphous oxide semiconductor.

Here, the above-described nc-OS and a-like OS are described in detail.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has a higher hydrogen concentration in the film than the nc-OS and the CAAC-OS.

«Composition of Oxide Semiconductor»

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. As another example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of this embodiment.

«Transistor Including Oxide Semiconductor»

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Moreover, an oxide semiconductor having a low carrier concentration may be referred to as a highly purified intrinsic or substantially highly purified intrinsic oxide semiconductor. Note that in this specification and the like, the case where the carrier concentration of the metal oxide in the channel formation region is lower than or equal to $1\times10^{16}$ $cm^{-3}$ is defined as a substantially highly purified intrinsic state.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

In a transistor using an oxide semiconductor, when impurities and oxygen vacancies exist in a channel formation region of the oxide semiconductor, the resistance of the oxide semiconductor is reduced in some cases. In addition, the electrical characteristics easily vary, and the reliability is degraded in some cases.

In a transistor using an oxide semiconductor in the channel formation region, when a low-resistance region is formed in the channel formation region, leakage current (parasitic channel) between the source electrode and the drain electrode of the transistor is likely to be generated in the low-resistance region. Furthermore, the parasitic channel facilitates generation of defects of transistor characteristics, such as normally on of transistors, an increase in leakage current, and a change (shift) of threshold voltage caused by stress application. When the processing accuracy of the transistor is low, the parasitic channel varies between transistors, whereby a variation in transistor characteristics occurs.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film also be reduced.

«Impurities»

Here, the influence of each impurity in the oxide semiconductor is described.

Entry of impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. When the channel formation region contains oxygen vacancies, the transistor tends to have normally on characteristics (characteristics with which, even when no voltage is applied to the gate electrode, the channel exists and current flows through the transistor).

In a transistor using a metal oxide, the electrical characteristics vary due to impurities and oxygen vacancies in the metal oxide, whereby the transistor tends to have normally on characteristics. In the case where the transistor is driven in a state where excess oxygen exceeding the proper amount is included in the metal oxide, the valence of the excess oxygen atoms is changed and the electrical characteristics of the transistor vary, so that reliability is decreased in some cases.

If impurities exist in the channel formation region of the oxide semiconductor, the crystallinity of the channel formation region might decrease, and the crystallinity of an oxide provided in contact with the channel formation region might decrease. Low crystallinity of the channel formation region tends to result in deterioration in stability or reliability of the transistor. Moreover, if the crystallinity of the oxide provided in contact with the channel formation region is low, an interface state might be formed and the stability or reliability of the transistor might deteriorate.

Examples of impurities in a metal oxide include hydrogen, nitrogen, an alkali metal, an alkaline earth metal, iron, nickel, and silicon.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by SIMS) are lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally on characteristics. Thus, the concentration of an alkali metal or an alkaline earth metal in the oxide semiconductor, which is obtained using SIMS, is lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

When an oxide semiconductor with sufficiently reduced impurities is used for the channel formation region of the transistor, stable electrical characteristics can be given.

<Variation Example 1 of Semiconductor Device>

An example of a semiconductor device is described below with reference to FIG. 4A to FIG. 4D.

Figure 4A:
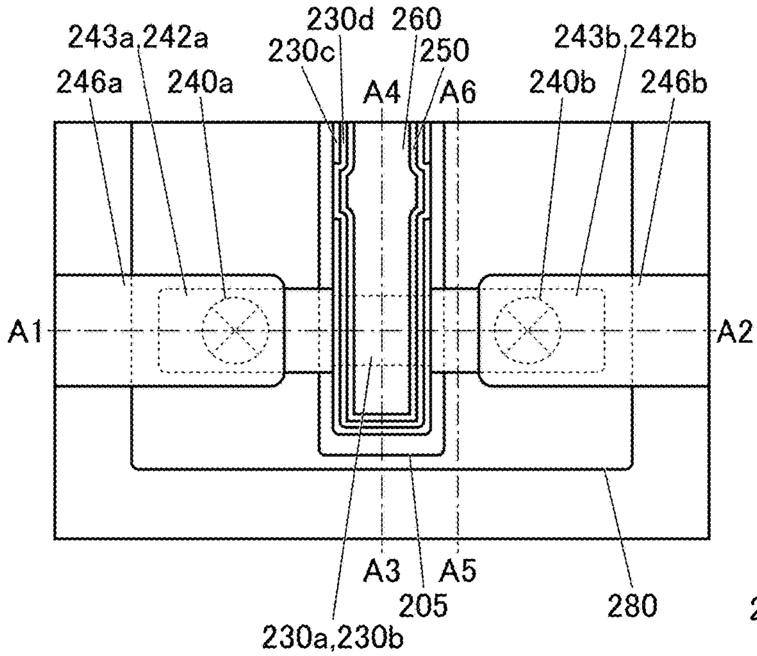
FIG. 4A is a top view of a semiconductor device.
Figure 4C:
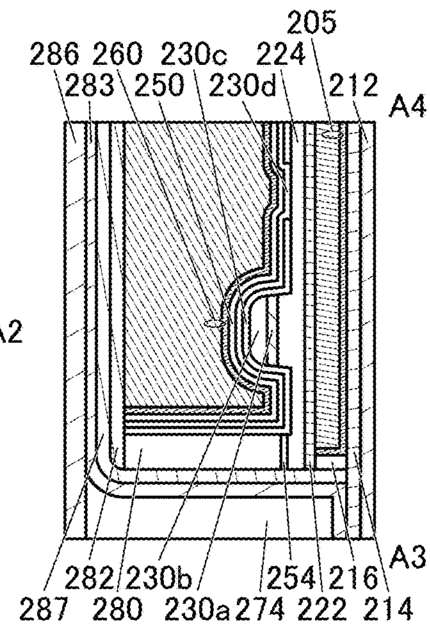
FIG. 4B to FIG. 4D are cross-sectional views of the semiconductor device.
Figure 4B:
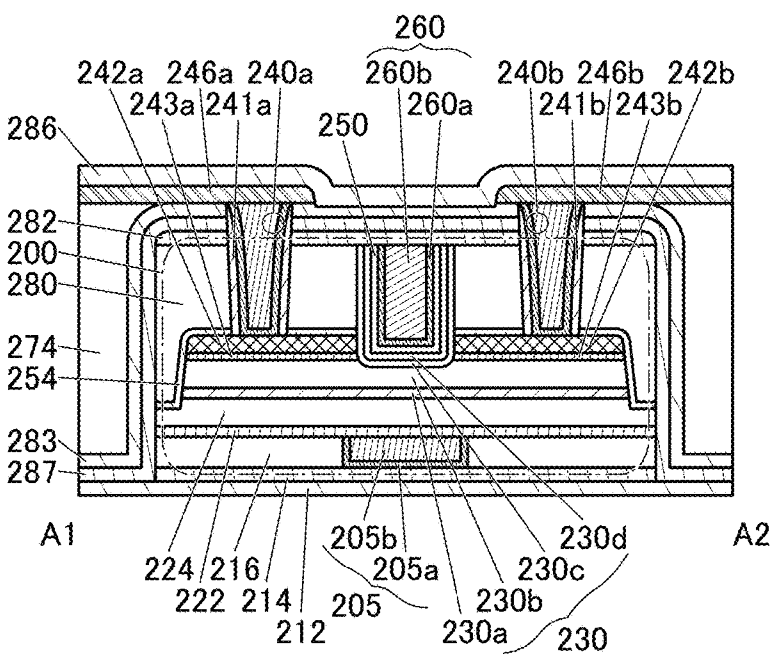
Figure 4D:
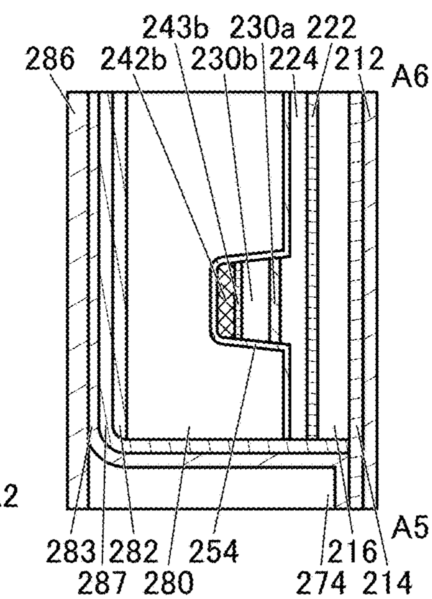
Figure 5A:
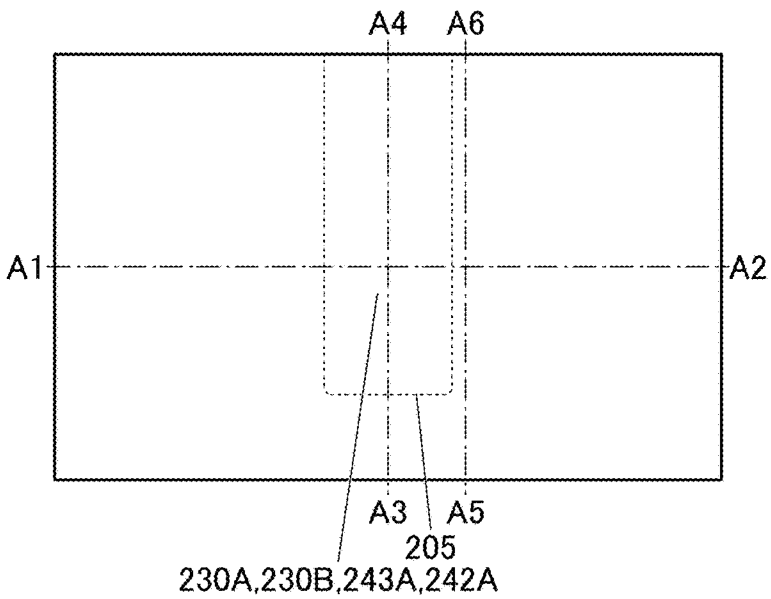
FIG. 5A is a top view showing a method for manufacturing a semiconductor device.
Figure 5C:
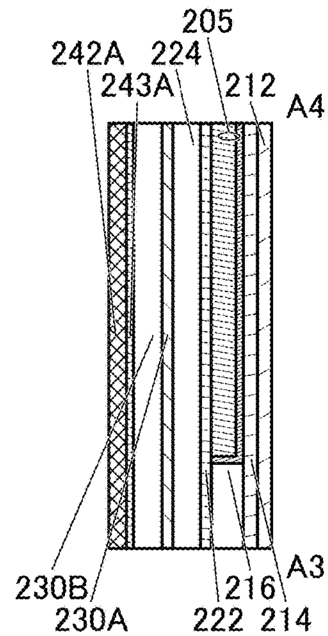
FIG. 5B to FIG. 5D are cross-sectional views showing the method for manufacturing the semiconductor device.
Figure 5B:
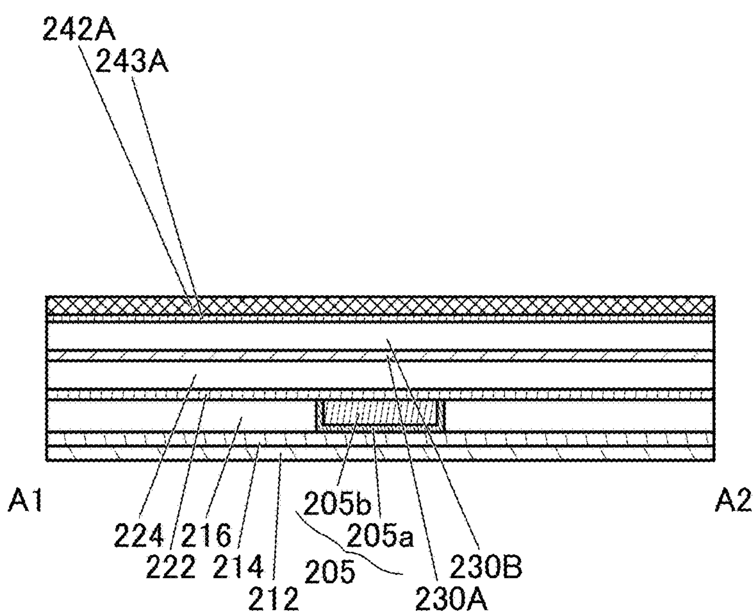
Figure 5D:
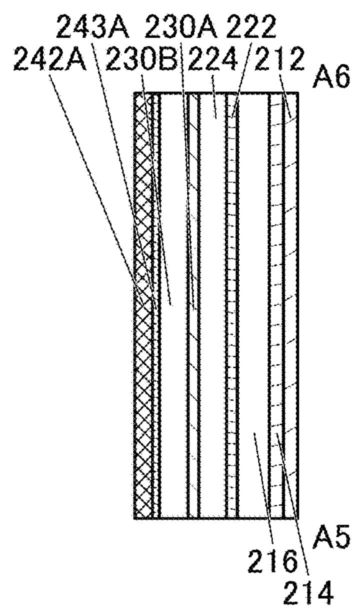
Figure 6A:
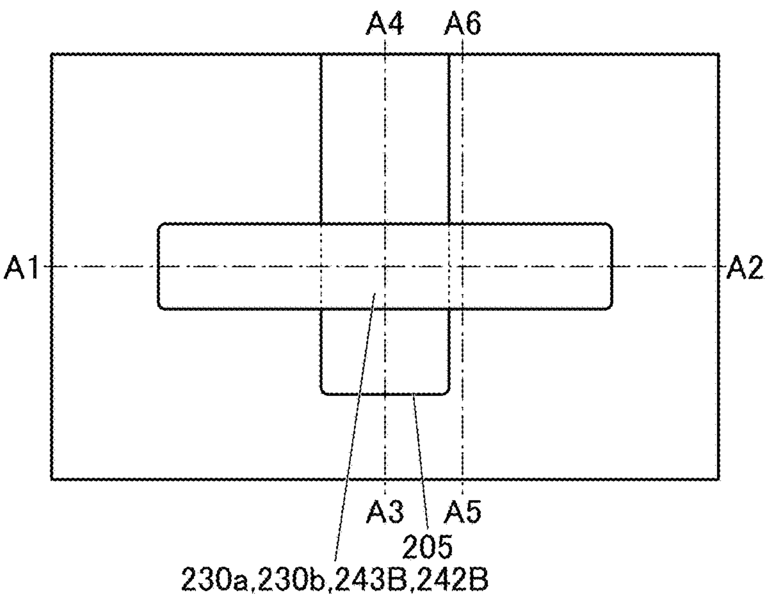
FIG. 6A is a top view showing a method for manufacturing a semiconductor device.
Figure 6C:
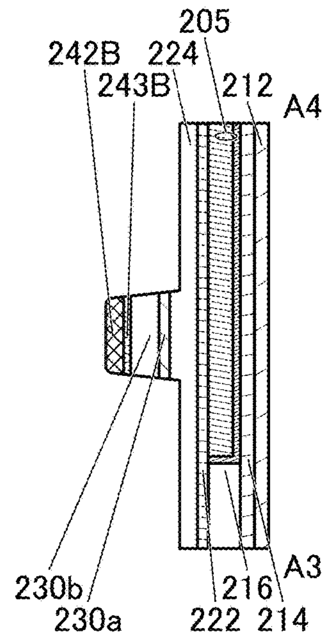
FIG. 6B to FIG. 6D are cross-sectional views showing the method for manufacturing the semiconductor device.
Figure 6B:
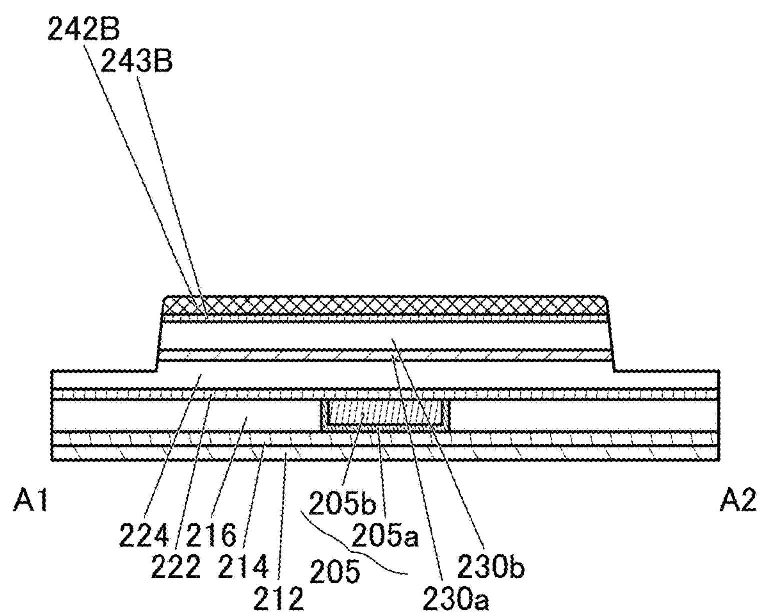
Figure 6D:
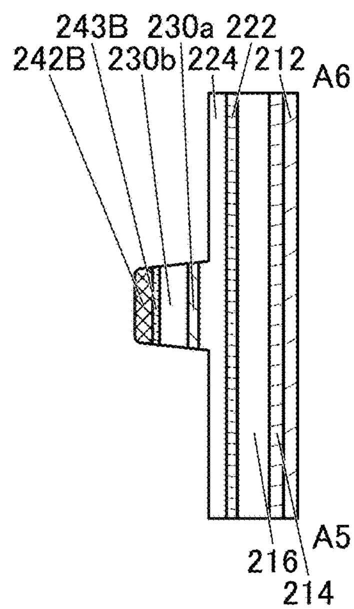

FIG. 4A shows a top view of the semiconductor device. FIG. 4B is a cross-sectional view corresponding to a portion indicated by the dashed-dotted line A1-A2 in FIG. 4A. FIG. 4C is a cross-sectional view corresponding to a portion indicated by the dashed-dotted line A3-A4 in FIG. 4A. FIG. 4D is a cross-sectional view corresponding to a portion indicated by the dashed-dotted line A5-A6 in FIG. 4A. For clarity of the drawing, some components are not shown in the top view of FIG. 4A.

Note that in the semiconductor device shown in FIG. 4A to FIG. 4D, components having the same functions as the components included in the semiconductor device described in <Structure example of semiconductor device> are denoted by the same reference numerals. Note that the materials described in detail in <Structure example of semiconductor device> can also be used as constituent materials for the semiconductor device in this section.

The semiconductor device shown in FIG. 4A to FIG. 4D is a variation example of the semiconductor device shown in FIG. 1A to FIG. 1D. The semiconductor device shown in FIG. 4A to FIG. 4D is different from the semiconductor device shown in FIG. 1A to FIG. 1D in the shape of the insulator 283. It is also different in that an insulator 287 and an insulator 274 are included. It is also different in that the insulator 284 is not included.

In the semiconductor device shown in FIG. 4A to FIG. 4D, the insulator 214, the insulator 216, the insulator 222, the insulator 224, the insulator 254, the insulator 280, and the insulator 282 are patterned. The insulator 287 and the insulator 283 cover the insulator 214, the insulator 216, the insulator 222, the insulator 224, the insulator 254, the insulator 280, and the insulator 282. That is, the insulator 287 is in contact with a top surface of the insulator 212, a side surface of the insulator 214, a side surface of the insulator 216, a side surface of the insulator 222, a side surface of the insulator 224, a side surface of the insulator 254, a side surface of the insulator 280, a side surface of the insulator 282, and a top surface of the insulator 282, and the insulator 283 is in contact with a top surface and a side surface of the insulator 287. Accordingly, the oxide 230, the insulator 214, the insulator 216, the insulator 222, the insulator 224, the insulator 254, the insulator 280, and the insulator 282 are isolated from the outside by the insulator 287, the insulator 283, and the insulator 212. In other words, the transistor 200 is provided in a region sealed by the insulator 287, the insulator 283, and the insulator 212.

For example, it is preferable that the insulator 214, the insulator 282, and the insulator 287 be formed using a material having a function of trapping and fixing hydrogen, and the insulator 212 and the insulator 283 be formed using a material having a function of inhibiting diffusion of hydrogen and oxygen. Typically, aluminum oxide can be used for the insulator 214, the insulator 282, and the insulator 287. Moreover, typically, silicon nitride can be used for the insulator 212 and the insulator 283.

With the above structure, entry of hydrogen contained in a region outside the sealed region into the sealed region can be inhibited. Thus, the hydrogen concentration in the transistor can be kept low.

Although the transistor 200 in which the insulator 212, the insulator 287, and the insulator 283 each have a single-layer structure is shown in FIG. 4A to FIG. 4D, this embodiment is not limited thereto. For example, each of the insulator 212, the insulator 287, and the insulator 283 may have a stacked-layer structure of two or more layers.

The insulator 287 is not necessarily provided. With such a structure, the transistor 200 is located in a region sealed by the insulator 212 and the insulator 283. With this structure, entry of hydrogen contained in a region outside the sealed region into the sealed region can be further inhibited. Thus, the hydrogen concentration in the transistor can be further kept low.

The insulator 274 functions as an interlayer film. The permittivity of the insulator 274 is preferably lower than that of the insulator 214. When a material with a low permittivity is used for an interlayer film, parasitic capacitance generated between wirings can be reduced. The insulator 274 can be provided using a material similar to that for the insulator 280, for example.

<Method for Manufacturing Semiconductor Device>

Next, a method for manufacturing the semiconductor device that is one embodiment of the present invention and is shown in FIG. 4A to FIG. 4D is described with reference to FIG. 5A to FIG. 17D.

FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, and FIG. 17A are top views. FIG. 5B, FIG. 6B, FIG. 7B, FIG. 8B, FIG. 9B, FIG. 10B, FIG. 11B, FIG. 12B, FIG. 13B, FIG. 14B, FIG. 15B, FIG. 16B, and FIG. 17B are cross-sectional views corresponding to portions indicated by the dashed-dotted lines A1-A2 in FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, and FIG. 17A, respectively, and are also cross-sectional views of the transistor 200 in the channel length direction. FIG. 5C, FIG. 6C, FIG. 7C, FIG. 8C, FIG. 9C, FIG. 10C, FIG. 11C, FIG. 12C, FIG. 13C, FIG. 14C, FIG. 15C, FIG. 16C, and FIG. 17C are cross-sectional views corresponding to portions indicated by the dashed-dotted lines A3-A4 in FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, and FIG. 17A, respectively, and are also cross-sectional views of the transistor 200 in the channel width direction. FIG. 5D, FIG. 6D, FIG. 7D, FIG. 8D, FIG. 9D, FIG. 10D, FIG. 11D, FIG. 12D, FIG. 13D, FIG. 14D, FIG. 15D, FIG. 16D, and FIG. 17D are cross-sectional views corresponding to portions indicated by the dashed-dotted lines A5-A6 in FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, and FIG. 17A, respectively. Note that for clarity of the drawings, some components are not shown in the top views of FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, and FIG. 17A.

First, a substrate (not illustrated) is prepared, and the insulator 212 is deposited over the substrate. The insulator 212 can be deposited by a sputtering method, a CVD method, an MBE method, a PLD method, an ALD method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

Using a plasma CVD method, a high-quality film can be obtained at a relatively low temperature. A thermal CVD method is a deposition method that does not use plasma and thus causes less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. By contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As an ALD method, a thermal ALD method, in which a precursor and a reactant react with each other only by a thermal energy, a PEALD (Plasma Enhanced ALD) method, in which a reactant excited by plasma is used, and the like can be used.

An ALD method, which enables one atomic layer to be deposited at a time using self-regulating characteristics of atoms, has advantages such as deposition of an extremely thin film, deposition on a component with a high aspect ratio, deposition of a film with a small number of defects such as pinholes, deposition with excellent coverage, and low-temperature deposition. The use of plasma in a PEALD (Plasma Enhanced ALD) method is sometimes preferable because deposition at a lower temperature is possible. Note that a precursor used in the ALD method sometimes contains impurities such as carbon. Thus, in some cases, a film provided using the ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object to be processed. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the flow rate ratio of the source gases. For example, using a CVD method and an ALD method, a film with a certain composition can be deposited depending on the flow rate ratio of the source gases. Moreover, for example, by a CVD method and an ALD method, a film whose composition is continuously changed can be deposited by changing the flow rate ratio of the source gases during the deposition. In the case of depositing while changing the flow rate ratio of the source gases, as compared to the case of depositing with the use of a plurality of deposition chambers, the time taken for the deposition can be shortened because the time taken for transfer and pressure adjustment is omitted. Thus, the productivity of the semiconductor device can be increased in some cases.

In this embodiment, for the insulator 212, silicon nitride is deposited by a sputtering method. When an insulator through which copper is unlikely to pass, such as silicon nitride, is used for the insulator 212 in such a manner, even in the case where a metal that is likely to diffuse, such as copper, is used for a conductor in a layer (not illustrated) below the insulator 212, diffusion of the metal into an upper portion through the insulator 212 can be inhibited. The use of an insulator through which impurities such as water and hydrogen are unlikely to pass, such as silicon nitride, can inhibit diffusion of impurities such as water and hydrogen contained in a layer below the insulator 212.

Then, the insulator 214 is deposited over the insulator 212. The insulator 214 can be deposited by a sputtering method, a CVD method, an MBE method, a PLD method, an ALD method, or the like. In this embodiment, aluminum oxide is used for the insulator 214.

It is preferable that the hydrogen concentration of the insulator 214 be lower than that of the insulator 212. When silicon nitride is deposited by a sputtering method for the insulator 212, silicon nitride having a low hydrogen concentration can be formed. The insulator 214 formed using aluminum oxide can have a lower hydrogen concentration than the insulator 212.

The transistor 200 is formed over the insulator 214 in a later step. It is preferable that a film adjacent to the transistor 200 have a relatively low hydrogen concentration and a film with a relatively high hydrogen concentration be positioned away from the transistor 200.

Next, the insulator 216 is deposited over the insulator 214. The insulator 216 can be deposited by a sputtering method, a CVD method, an MBE method, a PLD method, an ALD method, or the like. In this embodiment, silicon oxide or silicon oxynitride is used for the insulator 216. The insulator 216 is preferably deposited by a deposition method using a gas in which hydrogen atoms are reduced or removed. In this case, the hydrogen concentration of the insulator 216 can be reduced.

Then, an opening reaching the insulator 214 is formed in the insulator 216. A groove and a slit, for example, are included in the category of the opening. A region where an opening is formed is referred to as an opening portion in some cases. Wet etching may be used for the formation of the opening; however, dry etching is preferably used for microfabrication. As the insulator 214, it is preferable to select an insulator that functions as an etching stopper film used in forming the groove by etching the insulator 216. For example, in the case where silicon oxide or silicon oxynitride is used as the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the conductor 205*a* is deposited. The conductive film preferably includes a conductor that has a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be deposited by a sputtering method, a CVD method, an MBE method, a PLD method, an ALD method, or the like.

In this embodiment, the conductive film to be the conductor 205*a* has a multilayer structure. First, tantalum nitride is deposited by a sputtering method, and titanium nitride is stacked over the tantalum nitride. When such metal nitrides are used for a lower layer of the conductor 205*b*, even in the case where a metal that is likely to diffuse, such as copper, is used for a conductive film to be the conductor 205*b* described below, outward diffusion of the metal from the conductor 205*a* can be inhibited.

Next, the conductive film to be the conductor 205*b* is deposited. The conductive film can be deposited by a plating method, a sputtering method, a CVD method, an MBE method, a PLD method, an ALD method, or the like. In this embodiment, for the conductive film, a low-resistance conductive material such as copper is deposited.

Then, CMP treatment is performed, thereby removing part of the conductive film to be the conductor 205*a* and part of the conductive film to be the conductor 205*b* to expose the insulator 216. As a result, the conductor 205*a* and the conductor 205*b* remain only in the opening portion. Thus, the conductor 205 whose top surface is flat can be formed (see FIG. 5A to FIG. 5D). Note that the insulator 216 is partly removed by the CMP treatment in some cases.

Although the conductor 205 is embedded in the opening of the insulator 216 in the above description, one embodiment of the present invention is not limited thereto. For example, the surface of the conductor 205 may be exposed in the following manner: the conductor 205 is formed over the insulator 214, the insulator 216 is deposited over the conductor 205, and the insulator 216 is subjected to CMP treatment so that the insulator 216 is partly removed.

Then, the insulator 222 is deposited over the insulator 216 and the conductor 205. An insulator containing an oxide of one or both of aluminum and hafnium is preferably deposited as the insulator 222. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Sequentially, heat treatment is preferably performed. The heat treatment is performed at higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas is approximately 20%. The heat treatment may be performed under reduced pressure. Alternatively, the heat treatment may be performed in such a manner that heat treatment is performed in a nitrogen gas or inert gas atmosphere, and then heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment performed using a highly purified gas can prevent entry of moisture or the like into the insulator 222 and the like as much as possible.

In this embodiment, as the heat treatment, after the deposition of the insulator 222, heat treatment at 400° C. for 1 hour is performed with a flow rate of a nitrogen gas of 4 slm and a flow rate of an oxygen gas of 1 slm. By the heat treatment, impurities such as water and hydrogen contained in the insulator 222 can be removed, for example. In the case where an oxide containing hafnium is used as the insulator 222, the heat treatment can improve the crystallinity of the insulator 222. The heat treatment can also be performed after the deposition of the insulator 224, for example.

Then, the insulator 224 is deposited over the insulator 222. The insulator 224 can be deposited by a sputtering method, a CVD method, an MBE method, a PLD method, an ALD method, or the like. In this embodiment, for the insulator 224, a silicon oxide film or a silicon oxynitride film is deposited using a CVD method. The insulator 224 is preferably deposited with a deposition method using a gas in which hydrogen atoms are reduced or removed. This reduces the hydrogen concentration of the insulator 224. The hydrogen concentration is preferably reduced because the insulator 224 becomes the insulator 224 that is in contact with the oxide 230*a* in a later step.

Here, in order to form an excess-oxygen region in the insulator 224, plasma treatment with oxygen may be performed under reduced pressure. The plasma treatment with oxygen is preferably performed with an apparatus including a power source for generating high-density plasma using microwaves, for example. Alternatively, a power source for applying an RF (Radio Frequency) to the substrate side may be included. The use of high-density plasma enables high-density oxygen radicals to be generated, and application of the RF to the substrate side allows the oxygen radicals generated by the high-density plasma to be efficiently introduced into the insulator 224. Alternatively, after plasma treatment with an inert gas is performed using the apparatus, plasma treatment with oxygen may be performed in order to compensate for released oxygen. Note that impurities such as water and hydrogen contained in the insulator 224 can be removed by selecting the conditions of the plasma treatment as appropriate. In that case, the heat treatment does not need to be performed.

Here, after aluminum oxide is deposited over the insulator 224 by a sputtering method, for example, the aluminum oxide may be subjected to CMP treatment until the insulator 224 is reached. The CMP treatment can planarize and smooth a surface of the insulator 224. When the CMP treatment is performed on the aluminum oxide positioned over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can prevent deterioration in the coverage with an oxide deposited later and a decrease in the yield of the semiconductor device in some cases. Moreover, it is preferable to deposit aluminum oxide over the insulator 224 by a sputtering method, in which case oxygen can be added to the insulator 224.

Next, an oxide film 230A and an oxide film 230B are deposited in this order over the insulator 224 (see FIG. 5A to FIG. 5D). Note that it is preferable to deposit the oxide film 230A and the oxide film 230B successively without exposure to the atmospheric environment. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

For example, in the case where the oxide film 230A and the oxide film 230B are deposited by a sputtering method, oxygen or a mixed gas of oxygen and a rare gas is used as the sputtering gas. Increasing the proportion of oxygen contained in the sputtering gas can increase the amount of excess oxygen in the deposited oxide films. In the case where the oxide films are deposited by a sputtering method, a target of the above-described In-M-Zn oxide or the like can be used.

In particular, when the oxide film 230A is deposited, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when the deposition is performed while the substrate is heated, the crystallinity of the oxide film can be improved.

In this embodiment, the oxide film 230A is deposited by a sputtering method using an oxide target with In:Ga:Zn=1:3:4 [atomic ratio]. The oxide film 230B is deposited by a sputtering method using an oxide target with In:Ga:Zn=4:2:4.1 [atomic ratio]. Note that each of the oxide films is preferably formed to have characteristics required for the oxide 230*a* and the oxide 230*b* by selecting the deposition conditions and the atomic ratios as appropriate.

Then, an oxide film 243A is deposited over the oxide film 230B (see FIG. 5A to FIG. 5D). The oxide film 243A can be deposited by a sputtering method, a CVD method, an MBE method, a PLD method, an ALD method, or the like. The atomic ratio of Ga to In in the oxide film 243A is preferably higher than the atomic ratio of Ga to In in the oxide film 230B. In this embodiment, the oxide film 243A is deposited by a sputtering method using an oxide target with In:Ga:Zn=1:3:4 [atomic ratio].

Note that the insulator 222, the insulator 224, the oxide film 230A, the oxide film 230B, and the oxide film 243A are preferably deposited without exposure to the air. For example, a multi-chamber deposition apparatus is used.

Next, heat treatment is preferably performed. For the heat treatment, the heat treatment conditions explained in <Metal oxide and formation method thereof can be employed.

In this embodiment, as the heat treatment, treatment is performed at 550° C. in a nitrogen atmosphere for 1 hour and then treatment is successively performed at 550° C. in an oxygen atmosphere for 1 hour. By the heat treatment, impurities such as water and hydrogen in the oxide film 230A, the oxide film 230B, and the oxide film 243A can be removed, for example. Furthermore, the heat treatment improves the crystallinity of the oxide film 230B, thereby offering a dense structure with a higher density. Thus, diffusion of oxygen or impurities in the oxide film 230B can be inhibited.

Then, a conductive film 242A is deposited over the oxide film 243A (see FIG. 5A to FIG. 5D). The conductive film 242A can be deposited by a sputtering method, a CVD method, an MBE method, a PLD method, an ALD method, or the like. Note that heat treatment may be performed before the deposition of the conductive film 242A. This heat treatment may be performed under reduced pressure, and the conductive film 242A may be successively deposited without exposure to the air. Such treatment can remove moisture and hydrogen adsorbed onto the surface of the oxide film 243A and the like, and can also reduce the moisture concentration and the hydrogen concentration in the oxide film 230A, the oxide film 230B, and the oxide film 243A. The temperature of the heat treatment is preferably higher than or equal to 100° C. and lower than or equal to 400° C. In this embodiment, the temperature of the heat treatment is 200° C.

Next, the oxide film 230A, the oxide film 230B, the oxide film 243A, and the conductive film 242A are processed to have an island shape by a lithography method to form the oxide 230*a*, the oxide 230*b*, an oxide layer 243B, and a conductive layer 242B. For the processing, a dry etching method or a wet etching method can be employed. Processing using a dry etching method is suitable for microfabrication. The oxide film 230A, the oxide film 230B, the oxide film 243A, and the conductive film 242A may be processed under different conditions. Note that in this step, the thickness of the insulator 224 in a region not overlapped by the oxide 230*a* is reduced in some cases (see FIG. 6A to FIG. 6D).

Here, the oxide 230*a*, the oxide 230*b*, the oxide layer 243B, and the conductive layer 242B are formed to at least partly overlap the conductor 205. It is preferable that the side surfaces of the oxide 230*a*, the oxide 230*b*, the oxide layer 243B, and the conductive layer 242B be substantially perpendicular to a top surface of the insulator 222. When the side surfaces of the oxide 230*a*, the oxide 230*b*, the oxide layer 243B, and the conductive layer 242B are substantially perpendicular to the top surface of the insulator 222, a plurality of transistors 200 can be provided in a smaller area and at a higher density. Alternatively, a structure may be employed in which an angle formed by the side surfaces of the oxide 230*a*, the oxide 230*b*, the oxide layer 243B, and the conductive layer 242B and the top surface of the insulator 222 is an acute angle. With such a shape, coverage with the insulator 254 and the like can be improved in a later step, so that defects such as voids can be reduced.

There is a curved surface between the side surface of the conductive layer 242B and a top surface of the conductive layer 242B. That is, an end portion of the side surface and an end portion of the top surface are preferably curved. The radius of curvature of the curved surface at the end portion of the conductive layer 242B is greater than or equal to 3 nm and less than or equal to 10 nm, preferably greater than or equal to 5 nm and less than or equal to 6 nm, for example. When the end portions are not angular, coverage with films in later deposition steps is improved.

Figure 7A:
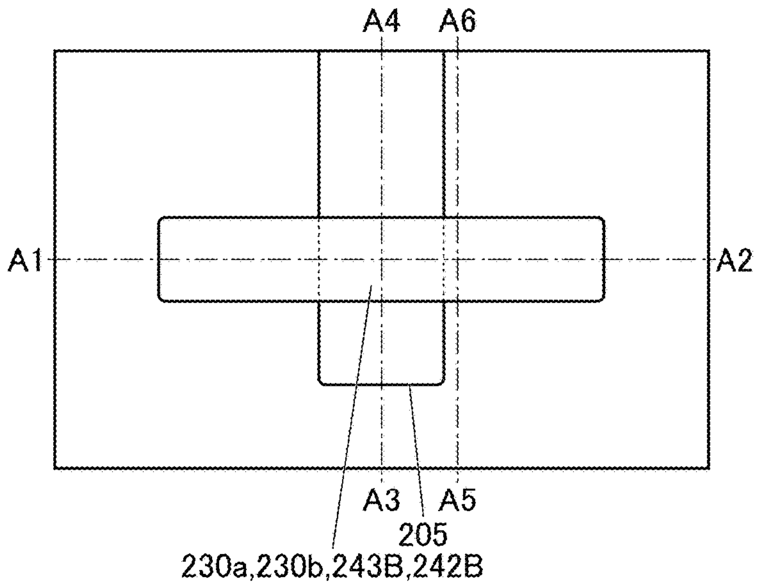
FIG. 7A is a top view showing a method for manufacturing a semiconductor device.
Figure 7C:
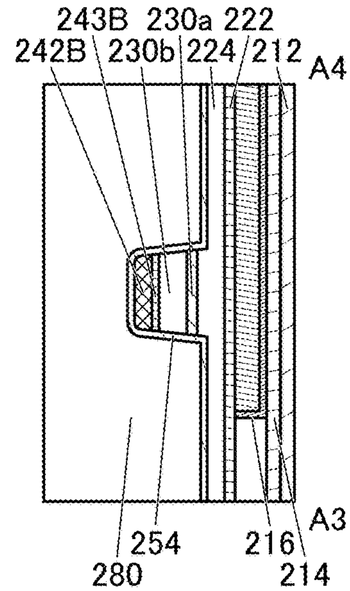
FIG. 7B to FIG. 7D are cross-sectional views showing the method for manufacturing the semiconductor device.
Figure 7B:
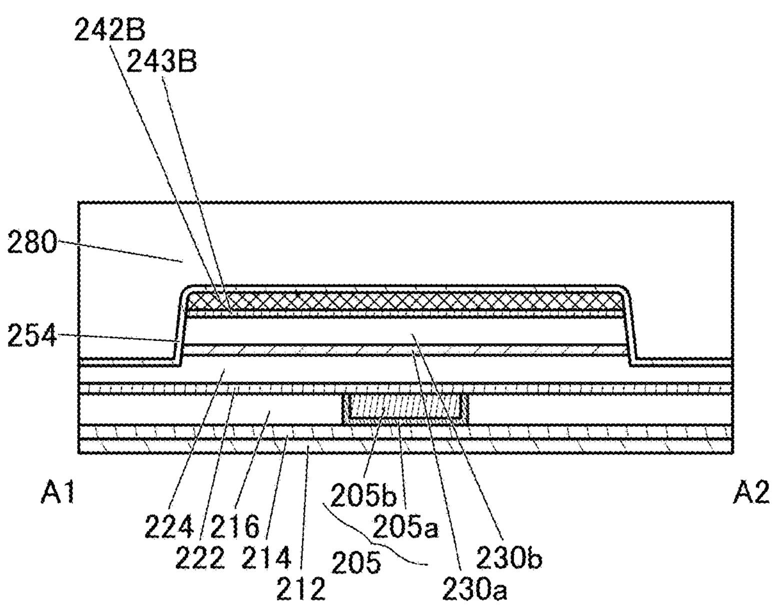
Figure 7D:
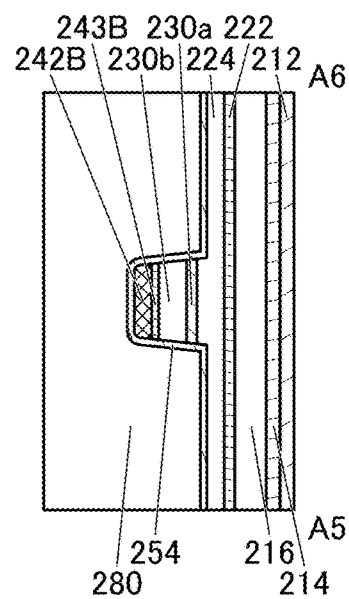
Figure 8A:
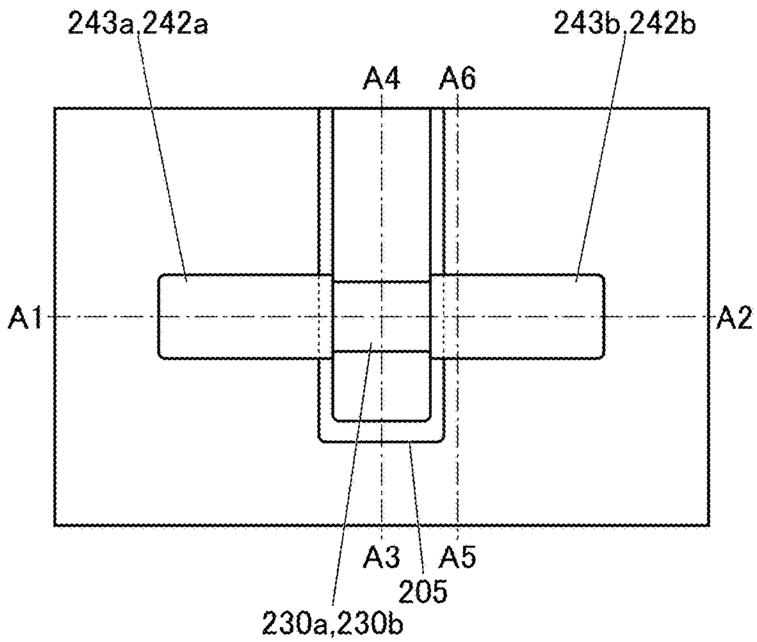
FIG. 8A is a top view showing a method for manufacturing a semiconductor device.
Figure 8C:
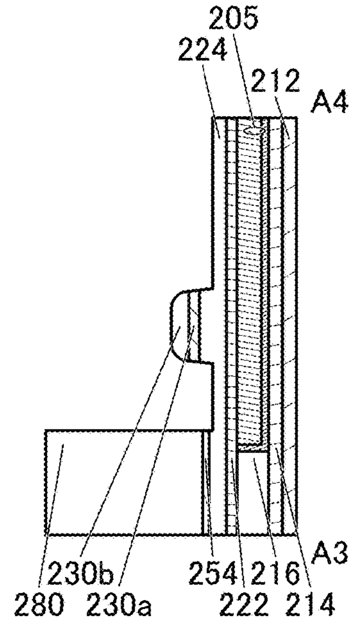
FIG. 8B to FIG. 8D are cross-sectional views showing the method for manufacturing the semiconductor device.
Figure 8B:
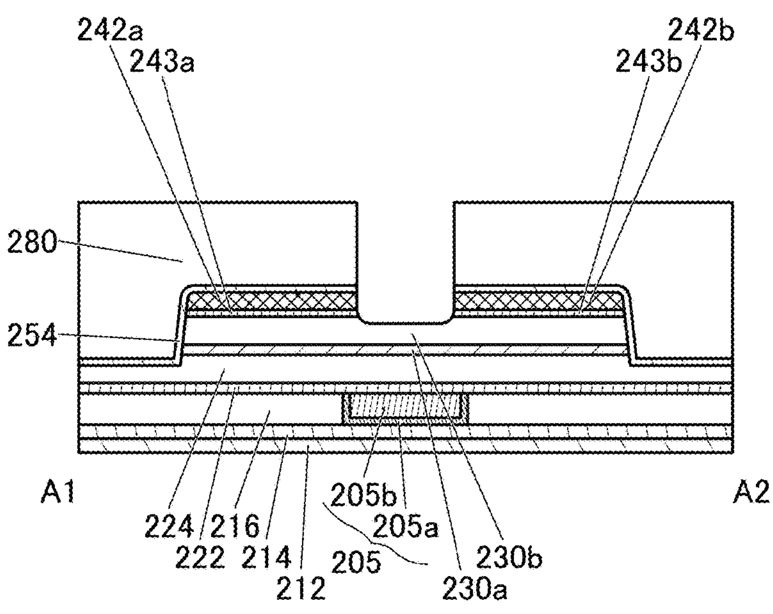
Figure 8D:
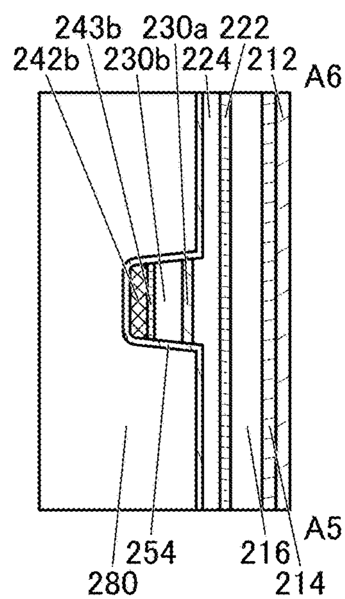

Next, the insulator 254 is deposited over the insulator 224, the oxide 230*a*, the oxide 230*b*, the oxide layer 243B, and the conductive layer 242B (see FIG. 7B to FIG. 7D). The insulator 254 can be deposited by a sputtering method, a CVD method, an MBE method, a PLD method, an ALD method, or the like. In this embodiment, as the insulator 254, aluminum oxide is deposited by a sputtering method.

Next, an insulating film to be the insulator 280 is deposited over the insulator 254. The insulating film can be deposited by a sputtering method, a CVD method, an MBE method, a PLD method, an ALD method, or the like. For example, as the insulating film, a silicon oxide film is deposited by a sputtering method, and a silicon oxide film is deposited thereover by a PEALD method or a thermal ALD method. The insulating film is preferably deposited by a deposition method using a gas in which hydrogen atoms are reduced or removed. Thus, the hydrogen concentration of the insulator 280 can be reduced. Note that heat treatment may be performed before the insulating film is deposited. The heat treatment may be performed under reduced pressure, and the insulating film may be successively deposited without exposure to the air. Such treatment can remove moisture and hydrogen adsorbed onto a surface of the insulator 254 and the like, and further can reduce the moisture concentration and the hydrogen concentration in the oxide 230*a*, the oxide 230*b*, the oxide layer 243B, and the insulator 224. For the heat treatment, the conditions for the above heat treatment can be used.

Next, the insulating film is subjected to CMP treatment, so that the insulator 280 having a flat top surface is formed (see FIG. 7B to FIG. 7D). Note that as in the insulator 224, aluminum oxide may be deposited over the insulator 280 by a sputtering method, for example, and the aluminum oxide may be subjected to CMP until the insulator 280 is reached.

Here, microwave treatment may be performed. The microwave treatment is preferably performed under an atmosphere containing oxygen and reduced pressure. By performing the microwave treatment, the hydrogen concentration in each of the oxide 230*b* and the oxide 230*a* can be lowered. Part of hydrogen is gettered by the conductor 242*a* and the conductor 242*b* through the insulator 254 in some cases. Moreover, $V_O$ in the oxide 230*a* and the oxide 230*b* can be repaired or filled.

After the microwave treatment, heat treatment may be performed with the reduced pressure being maintained. Such treatment enables hydrogen in the insulator 280, the oxide 230*b*, and the oxide 230*a* to be removed efficiently. Note that the temperature of the heat treatment is preferably higher than or equal to 300° C. and lower than or equal to 500° C.

Performing the microwave treatment improves the film quality of the insulator 280, thereby inhibiting diffusion of hydrogen, water, impurities, and the like. Accordingly, hydrogen, water, impurities, and the like can be inhibited from diffusing into the oxide 230 through the insulator 280 by a later step after the formation of the insulator 280, heat treatment, or the like.

Then, part of the insulator 280, part of the insulator 254, part of the conductive layer 242B, and part of the oxide layer 243B are processed to form an opening reaching the oxide 230*b*. The opening is preferably formed to overlap the conductor 205. The conductor 242*a*, the conductor 242*b*, the oxide 243*a*, and the oxide 243*b* are formed by the formation of the opening (see FIG. 8A to FIG. 8D).

An upper portion of the oxide 230*b* is removed when the opening is formed. When part of the oxide 230*b* is removed, a groove portion is formed in the oxide 230*b*. The groove portion may be formed in the step of forming the opening or in a step different from the step of forming the opening in accordance with the depth of the groove portion.

The part of the insulator 280, the part of the insulator 254, the part of the conductive layer 242B, the part of the oxide layer 243B, and the part of the oxide 230*b* can be processed with a dry etching method or a wet etching method. Processing using a dry etching method is suitable for microfabrication. The processing may be performed under different conditions. For example, the part of the insulator 280 may be processed by a dry etching method, the part of the insulator 254 may be processed by a wet etching method, and the part of the oxide layer 243B, the part of the conductive layer 242B, and the part of the oxide 230*b* may be processed by a dry etching method. Processing of the part of the oxide layer 243B and the part of the conductive layer 242B and processing of the part of the oxide 230*b* may be performed under different conditions.

When the oxide 230*b* is partly removed to form a groove portion with a dry etching method, a strong bias power is preferably applied. A bias power density is, for example, preferably more than or equal to 0.03 W/cm$^2$, further preferably more than or equal to 0.06 W/cm$^2$. The dry etching treatment time is set as appropriate depending on the depth of the groove portion.

Here, it is preferable to remove impurities that have been attached onto the surfaces of the oxide 230*a*, the oxide 230*b*, and the like or have diffused into the oxide 230*a*, the oxide 230*b*, and the like. The impurities result from components contained in the insulator 280, the insulator 254, and the conductive layer 242B; components contained in a member of an apparatus used to form the opening; and components contained in a gas or a liquid used for etching, for instance. Examples of the impurities include aluminum, silicon, tantalum, fluorine, and chlorine.

In order to remove the impurities and the like, cleaning treatment is performed. Examples of the cleaning method include wet cleaning using a cleaning solution and the like, plasma treatment using plasma, and cleaning by heat treatment, and any of these cleaning methods may be performed in appropriate combination. The cleaning treatment sometimes makes the groove portion deeper.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

Note that in this specification and the like, in some cases, an aqueous solution in which commercial hydrofluoric acid is diluted with pure water is referred to as diluted hydrofluoric acid, and an aqueous solution in which commercial ammonia water is diluted with pure water is referred to as diluted ammonia water. The concentration, temperature, and the like of the aqueous solution are adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid is higher than or equal to 0.01 ppm and lower than or equal to 100 ppm, preferably higher than or equal to 0.1 ppm and lower than or equal to 10 ppm.

For the ultrasonic cleaning, it is preferable to use a frequency of 200 kHz or higher, further preferably 900 kHz or higher. Damage to the oxide 230*b* and the like can be reduced with this frequency.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water.

As the cleaning treatment in this embodiment, wet cleaning using diluted hydrofluoric acid is performed and then, wet cleaning using pure water or carbonated water is performed. The cleaning treatment can remove impurities that have been attached onto the surfaces of the oxide 230*a*, the oxide 230*b*, and the like or have diffused into the oxide 230*a*, the oxide 230*b*, and the like. Furthermore, the crystallinity of the oxide 230*c* formed over the oxide 230*b* can be increased.

By the processing such as dry etching or the cleaning treatment, the thickness of the insulator 224 in a region that is overlapped by the opening and is not overlapped by the oxide 230*b* may become smaller than the thickness of the insulator 224 in a region that is overlapped by the oxide 230*b*.

After the etching or the cleaning treatment, heat treatment may be performed. The heat treatment is performed at higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230*a* and the oxide 230*b* to reduce oxygen vacancies. Moreover, such heat treatment can improve the crystallinity of the oxide 230*b* and also improve the crystallinity of the oxide 230*c* that is formed in the groove portion of the oxide 230*b*. The heat treatment may be performed under reduced pressure. Alternatively, heat treatment may be performed in an oxygen atmosphere, and then heat treatment may be successively performed in a nitrogen atmosphere without exposure to the air.

Next, an oxide film 230C is deposited. Heat treatment may be performed before the oxide film 230C is deposited. It is preferable that the heat treatment be performed under reduced pressure and the oxide film 230C be deposited successively without exposure to the air. Preferably, the heat treatment is performed in an atmosphere containing oxygen. Such treatment can remove moisture and hydrogen adsorbed onto the surface of the oxide 230*b* or the like and can also reduce the moisture concentration and the hydrogen concentration in the oxide 230*a* and the oxide 230*b*. The temperature of the heat treatment is preferably higher than or equal to 100° C. and lower than or equal to 400° C. In this embodiment, the temperature of the heat treatment is 200° C.

Here, the oxide film 230C is preferably provided in contact with at least the inner wall of the groove portion formed in the oxide 230*b*, part of the side surface of the oxide 243*a*, part of the side surface of the oxide 243*b*, part of the side surface of the conductor 242*a*, part of the side surface of the conductor 242*b*, part of the side surface of the insulator 254, and part of the side surface of the insulator 280. The conductor 242*a* (the conductor 242*b*) is surrounded by the oxide 243*a* (the oxide 243*b*), the insulator 254, and the oxide film 230C; thus, a reduction in the conductivity of the conductor 242*a* (the conductor 242*b*) due to the oxidation thereof in the following steps can be inhibited.

The oxide film 230C can be deposited by a sputtering method, a CVD method, an MBE method, a PLD method, an ALD method, or the like. The oxide film 230C is deposited by a deposition method similar to that for the oxide film 230A or the oxide film 230B in accordance with the characteristics required for the oxide film 230C. In this embodiment, the oxide film 230C is deposited by a sputtering method using an oxide target with In:Ga:Zn=4:2:3 [atomic ratio], an oxide target with In:Ga:Zn=5:1:3 [atomic ratio], an oxide target with In:Ga:Zn=10:1:3 [atomic ratio], or an indium oxide target.

Part of oxygen contained in the sputtering gas is sometimes supplied to the oxide 230*a* and the oxide 230*b* during the deposition of the oxide film 230C. Alternatively, part of oxygen contained in the sputtering gas is sometimes supplied to the insulator 280 during the deposition of the oxide film 230C. Therefore, the proportion of oxygen contained in the sputtering gas for the oxide film 230C is higher than or equal to 70%, preferably higher than or equal to 80%, further preferably 100%. By depositing the oxide film 230C in such an atmosphere containing much oxygen, the oxide film 230C is likely to be a CAAC-OS.

The oxide film 230C is preferably deposited while the substrate is heated. In that case, the substrate temperature is set to higher than or equal to 200° C., so that oxygen vacancies in the oxide film 230C and the oxide 230*b* can be reduced. When the deposition is performed while the substrate is heated, the crystallinity of the oxide film 230C and the oxide 230*b* can be improved.

Figure 9A:
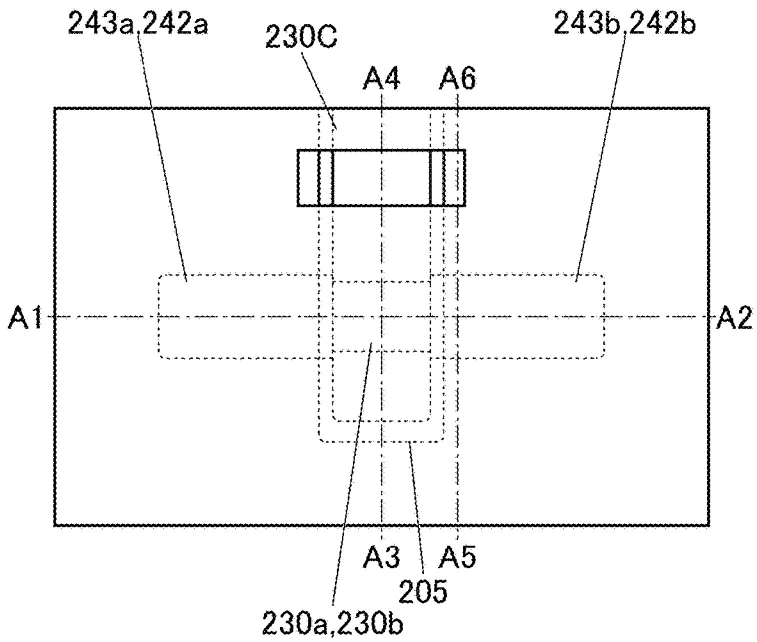
FIG. 9A is a top view showing a method for manufacturing a semiconductor device.
Figure 9C:
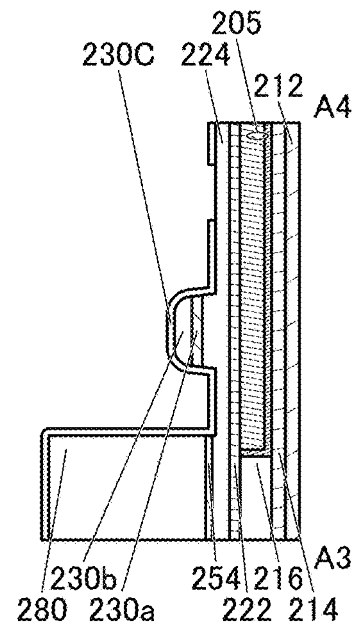
FIG. 9B to FIG. 9D are cross-sectional views showing the method for manufacturing the semiconductor device.
Figure 9B:
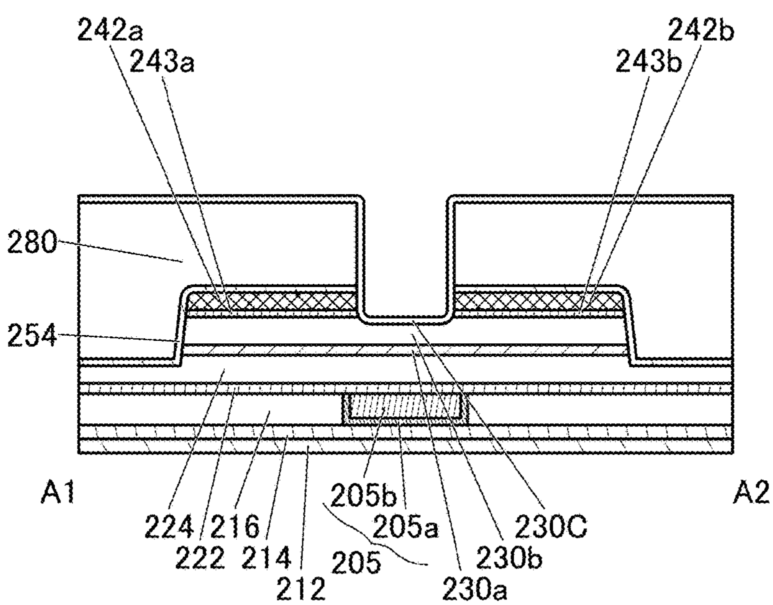
Figure 9D:
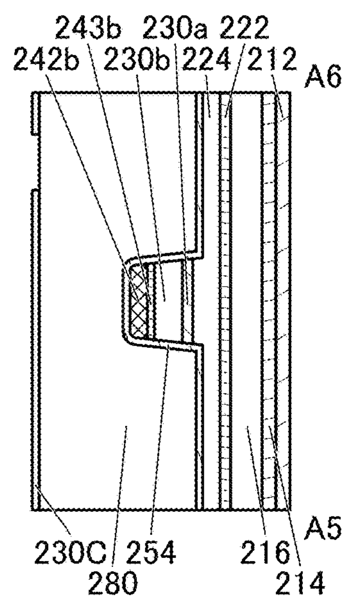
Figure 10A:
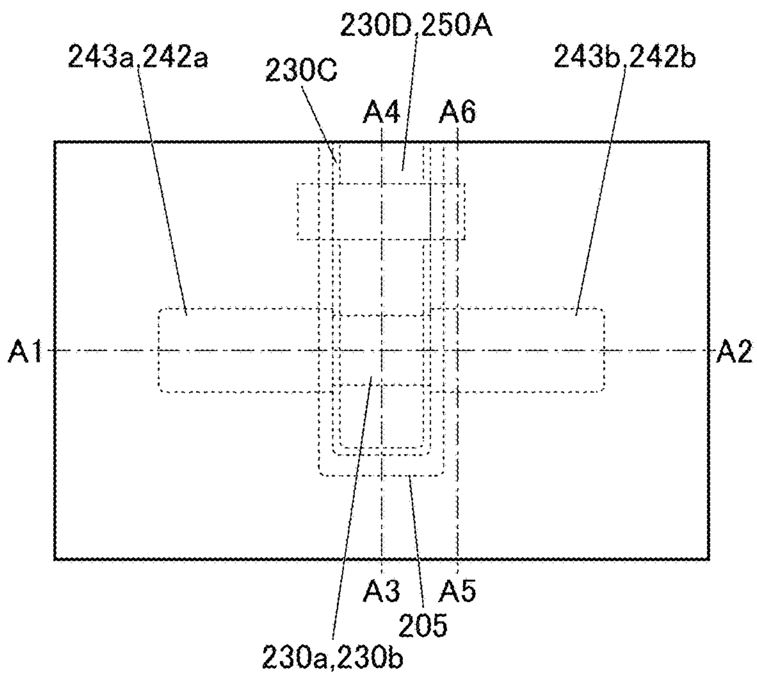
FIG. 10A is a top view showing a method for manufacturing a semiconductor device.
Figure 10C:
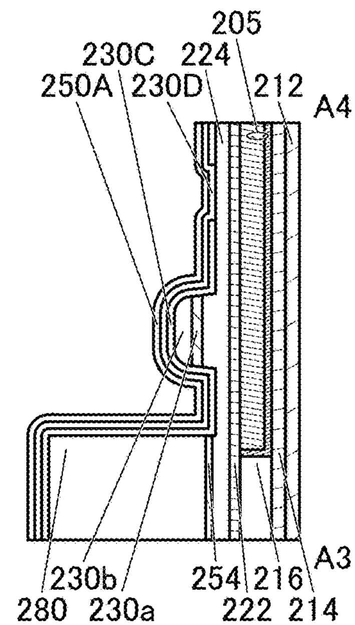
FIG. 10B to FIG. 10D are cross-sectional views showing the method for manufacturing the semiconductor device.
Figure 10B:
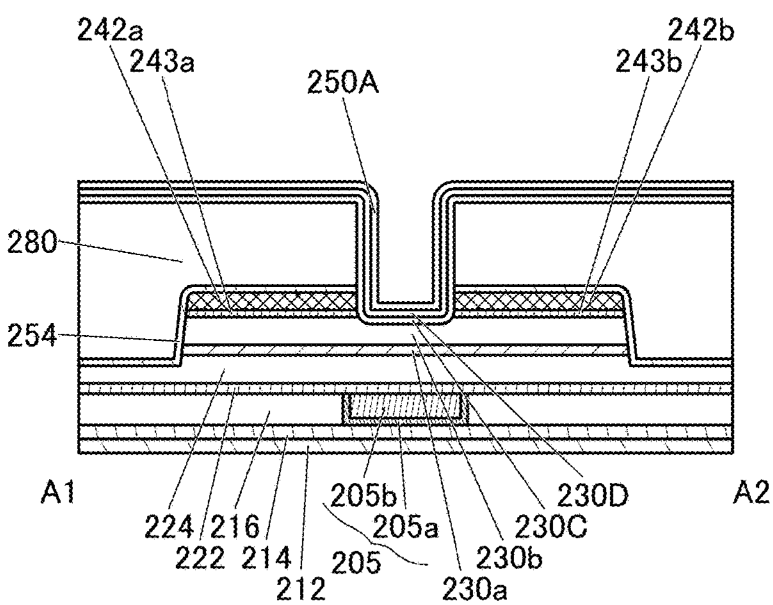
Figure 10D:
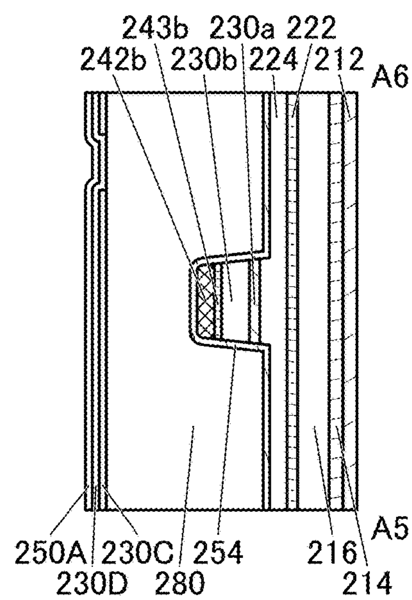
Figure 11A:
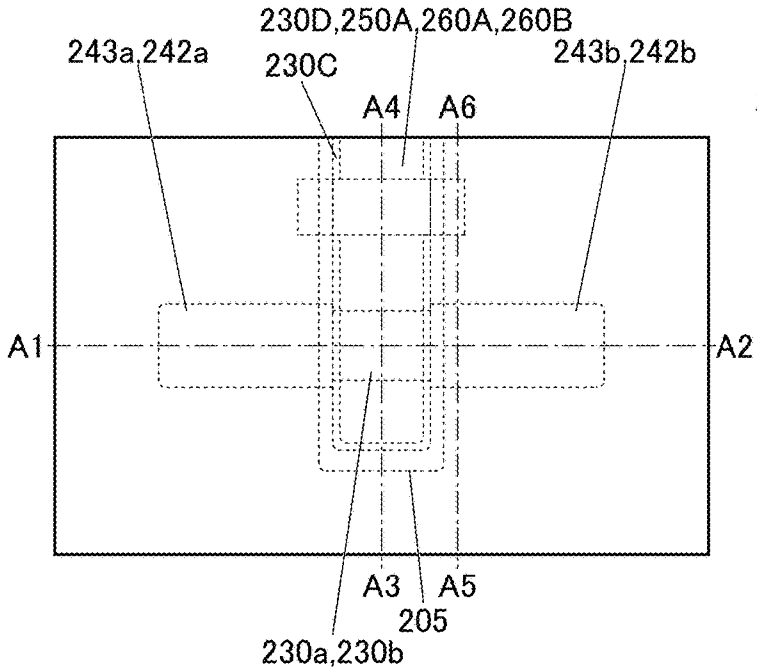
FIG. 11A is a top view showing a method for manufacturing a semiconductor device.
Figure 11C:
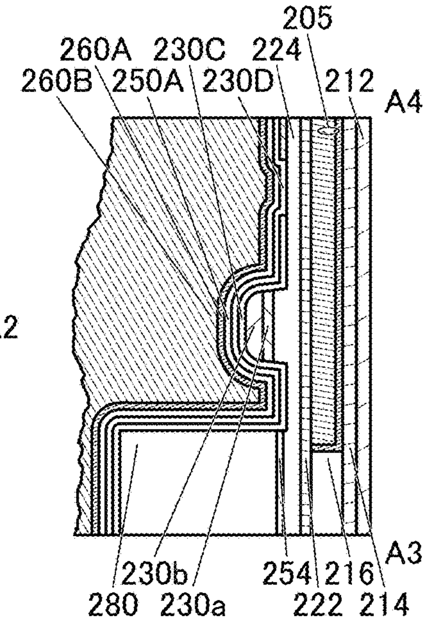
FIG. 11B to FIG. 11D are cross-sectional views showing the method for manufacturing the semiconductor device.
Figure 11B:
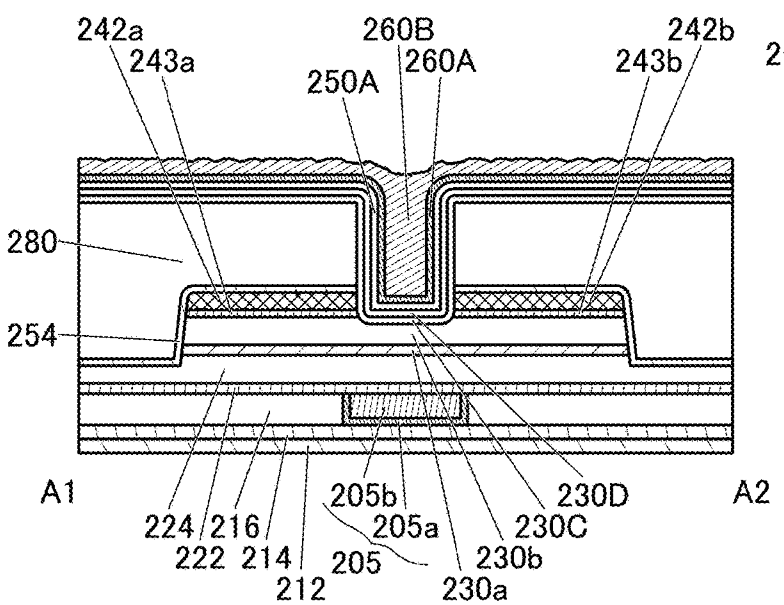
Figure 11D:
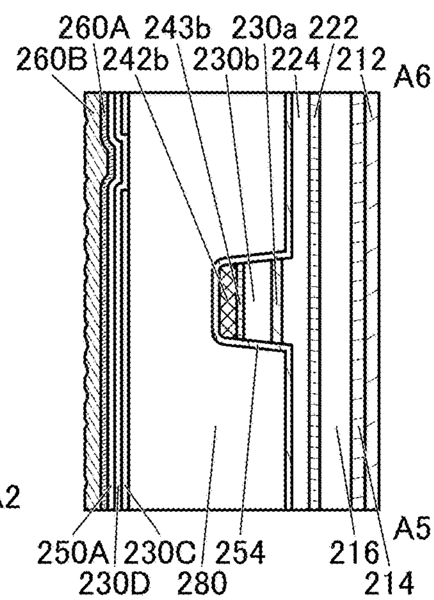
Figure 12A:
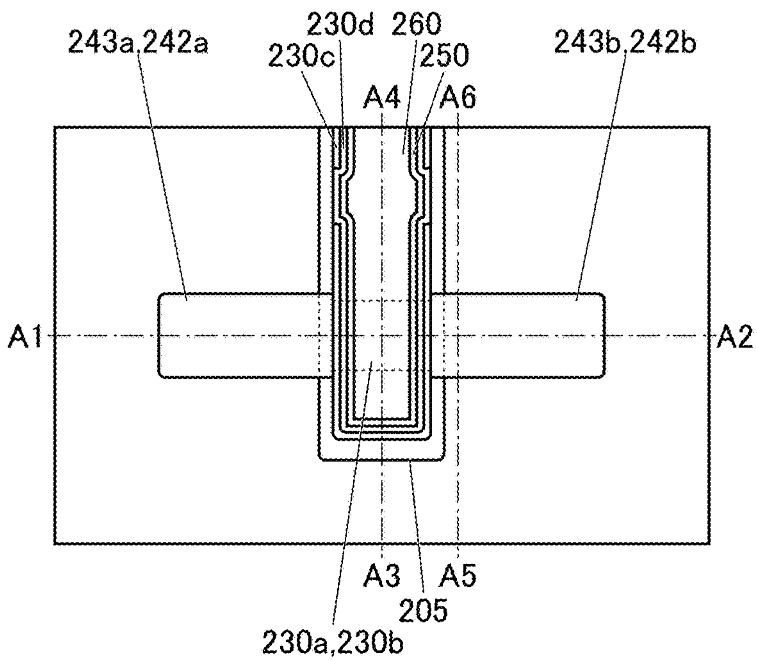
FIG. 12A is a top view showing a method for manufacturing a semiconductor device.
Figure 12C:
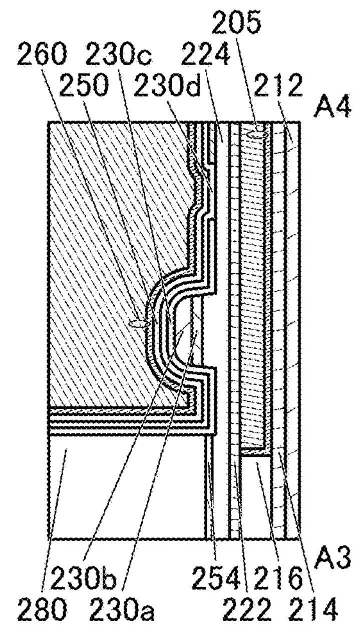
FIG. 12B to FIG. 12D are cross-sectional views showing the method for manufacturing the semiconductor device.
Figure 12B:
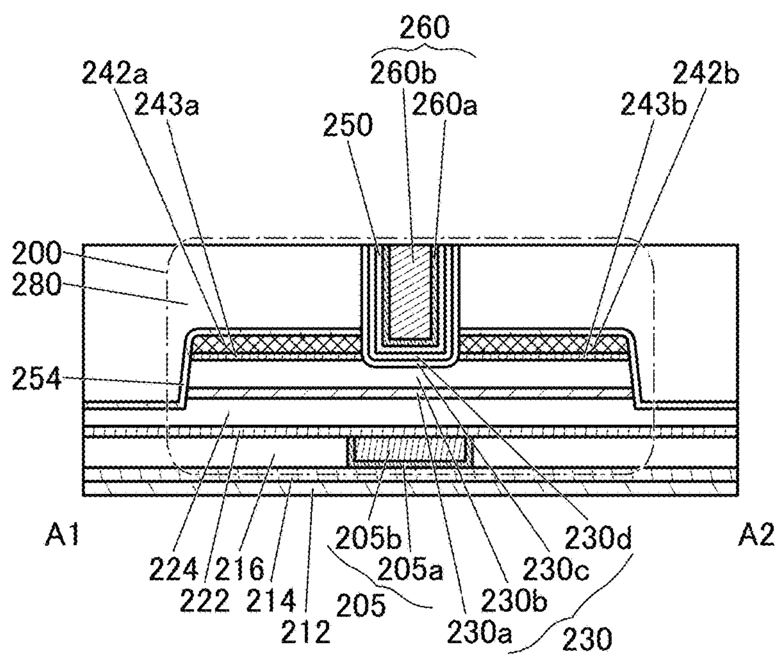
Figure 12D:
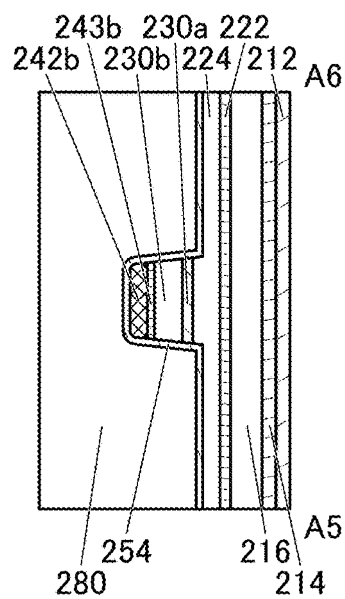

Then, part of the oxide film 230C is selectively removed by a lithography method (see FIG. 9A, FIG. 9C, and FIG. 9D). Note that the part of the oxide film 230C is preferably removed by a wet etching method or the like. In this step, the part of the oxide film 230C located between the adjacent transistors 200 in the channel width direction can be removed.

Note that in the region where the part of the oxide film 230C is removed in the above step, a surface of the insulator 224 and a surface of the insulator 280 are exposed. At this time, the thickness of the insulator 224 and the thickness of the insulator 280 in the region are reduced in some cases. In addition, the insulator 224 in the region is removed and a surface of the insulator 222 is exposed in some cases.

Next, an oxide film 230D is deposited (see FIG. 10A to FIG. 10D). The oxide film 230D can be deposited by a sputtering method, a CVD method, an MBE method, a PLD method, an ALD method, or the like. The oxide film 230D is deposited by a deposition method similar to that for the oxide film 230A or the oxide film 230B in accordance with the characteristics required for the oxide film 230D. In this embodiment, the oxide film 230D is deposited by a sputtering method using an oxide target with In:Ga:Zn=1:3:4 [atomic ratio].

Part of oxygen contained in the sputtering gas is sometimes supplied to the oxide film 230C during the deposition of the oxide film 230D. Alternatively, part of oxygen contained in the sputtering gas is sometimes supplied to the insulator 280 during the deposition of the oxide film 230D. Therefore, the proportion of oxygen contained in the sputtering gas for the oxide film 230D is higher than or equal to 70%, preferably higher than or equal to 80%, further preferably 100%.

Next, an insulating film 250A is deposited (see FIG. 10A to FIG. 10D). Heat treatment may be performed before the deposition of the insulating film 250A; the heat treatment may be performed under reduced pressure, and the insulating film 250A may be successively deposited without exposure to the air. Preferably, the heat treatment is performed in an atmosphere containing oxygen. Such treatment can remove moisture and hydrogen adsorbed onto the surface of the oxide film 230D and the like, and can also reduce the moisture concentration and the hydrogen concentration in the oxide 230*a*, the oxide 230*b*, the oxide film 230C, and the oxide film 230D. The temperature of the heat treatment is preferably higher than or equal to 100° C. and lower than or equal to 400° C.

The insulating film 250A can be deposited with a sputtering method, a CVD method, an MBE method, a PLD method, an ALD method, or the like. The insulating film 250A is preferably deposited by a deposition method using a gas in which hydrogen atoms are reduced or removed. This can reduce the hydrogen concentration of the insulating film 250A. The hydrogen concentration is preferably reduced because the insulating film 250A becomes the insulator 250 that is in contact with the oxide 230*d* in a later step.

Here, after the insulating film 250A is deposited, microwave treatment may be performed under an atmosphere containing oxygen and reduced pressure. Performing the microwave treatment can reduce the hydrogen concentration in the insulating film 250A, the oxide film 230D, the oxide film 230C, the oxide 230*b*, and the oxide 230*a*. Part of hydrogen is sometimes gettered by the conductor 242*a* and the conductor 242*b*. Moreover, $V_O$ in the oxide 230*a*, the oxide 230*b*, the oxide film 230C, and the oxide film 230D can be repaired or filled.

After the microwave treatment, heat treatment may be performed with the reduced pressure being maintained. Such treatment can remove hydrogen in the insulating film 250A, the oxide film 230D, the oxide film 230C, the oxide 230*b*, and the oxide 230*a* efficiently. Part of hydrogen is sometimes gettered by the conductor 242*a* and the conductor 242*b*. Alternatively, it is possible to repeat the step of performing microwave treatment and the step of performing heat treatment with the reduced pressure being maintained after the microwave treatment. Repetitions of the heat treatment can remove hydrogen in the insulating film 250A, the oxide film 230D, the oxide film 230C, the oxide 230*b*, and the oxide 230*a* more efficiently. Note that the temperature of the heat treatment is preferably higher than or equal to 300° C. and lower than or equal to 500° C.

Furthermore, the microwave treatment improves the film quality of the insulating film 250A, thereby inhibiting diffusion of hydrogen, water, impurities, and the like. Accordingly, hydrogen, water, impurities, and the like can be inhibited from diffusing into the oxide 230*b*, the oxide 230*a*, and the like through the insulator 250 by a later step such as deposition of a conductive film to be the conductor 260 or later treatment such as heat treatment.

Next, a conductive film 260A and a conductive film 260B are deposited in this order (see FIG. 11A to FIG. 11D). The conductive film 260A and the conductive film 260B can be deposited by a sputtering method, a CVD method, an MBE method, a PLD method, an ALD method, or the like. In this embodiment, the conductive film 260A is deposited by an ALD method, and the conductive film 260B is deposited by a CVD method.

Then, the oxide film 230C, the oxide film 230D, the insulating film 250A, the conductive film 260A, and the conductive film 260B are polished by CMP treatment until the insulator 280 is exposed, whereby the oxide 230*c*, the oxide 230*d*, the insulator 250, and the conductor 260 (the conductor 260*a* and the conductor 260*b*) are formed (see FIG. 12A to FIG. 12D). Accordingly, the oxide 230*c* is positioned to partly cover the inner walls (the side walls and the bottom surfaces) of the opening reaching the oxide 230*b* and the groove portion of the oxide 230*b*. The oxide 230*d* is positioned to cover the inner walls of the opening and the groove portion with the oxide 230*c* therebetween. The insulator 250 is positioned to cover the inner walls of the opening and the groove portion with the oxide 230c and the oxide 230d therebetween. The conductor 260 is positioned to fill the opening and the groove portion with the oxide 230c, the oxide 230d, and the insulator 250 therebetween.

Subsequently, heat treatment may be performed. In this embodiment, treatment is performed at 400° C. in a nitrogen atmosphere for 1 hour. The heat treatment can reduce the moisture concentration and the hydrogen concentration in the insulator 250 and the insulator 280. After the heat treatment, the insulator 282 may be successively deposited without exposure to the air.

Figure 13A:
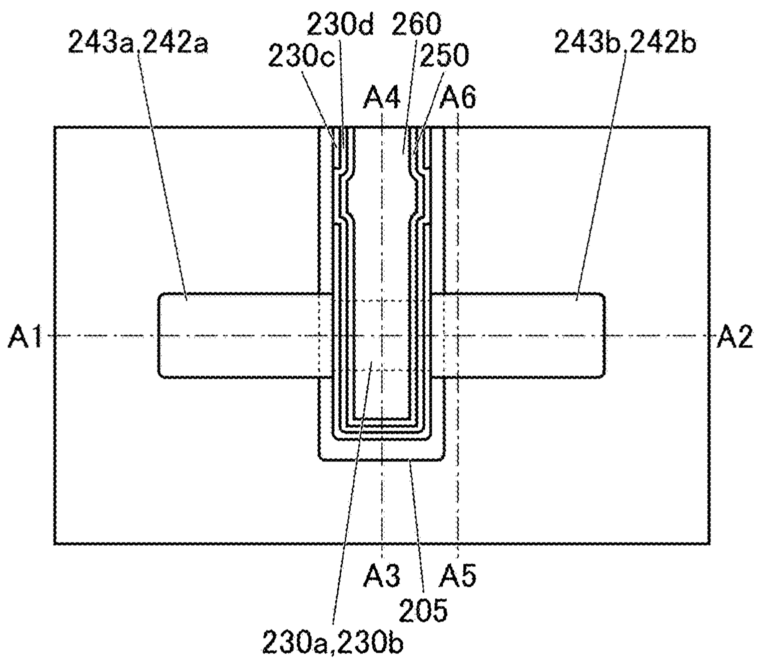
FIG. 13A is a top view showing a method for manufacturing a semiconductor device.
Figure 13C:
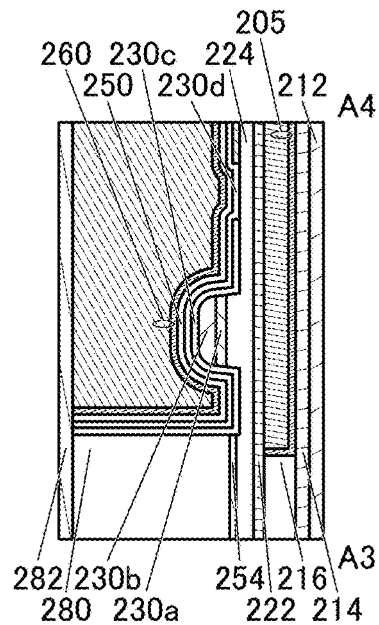
FIG. 13B to FIG. 13D are cross-sectional views showing the method for manufacturing the semiconductor device.
Figure 13B:
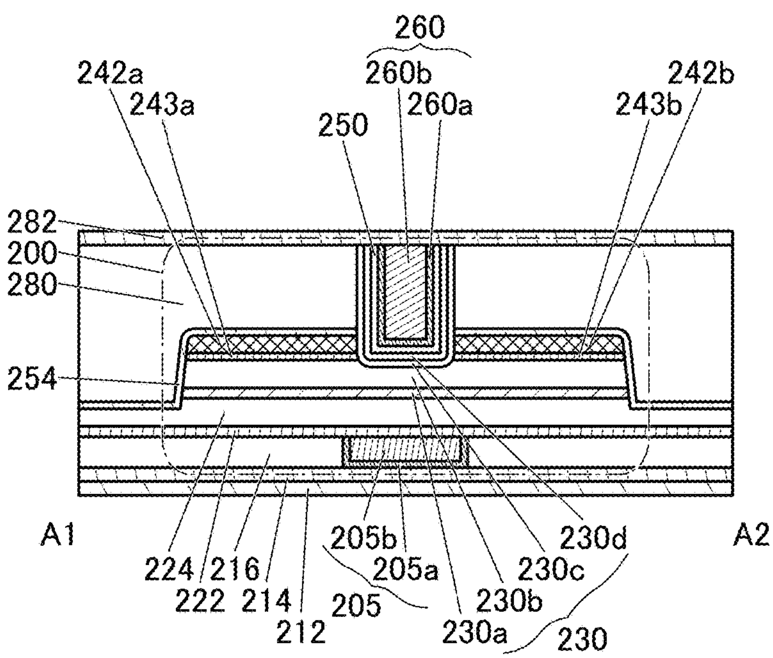
Figure 13D:
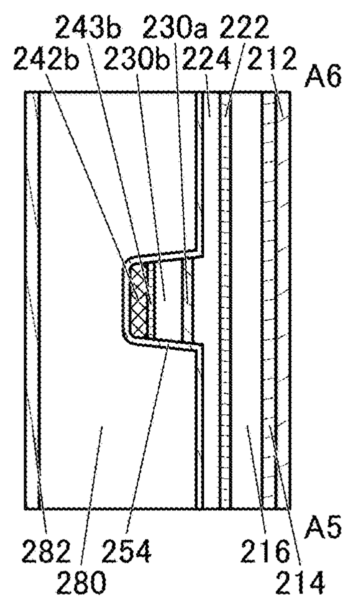
Figure 14A:
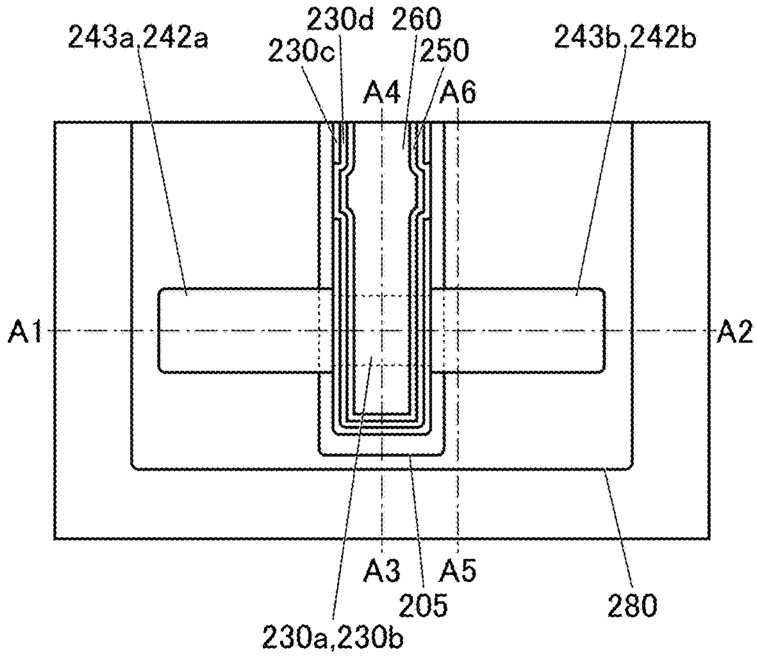
FIG. 14A is a top view showing a method for manufacturing a semiconductor device.
Figure 14C:
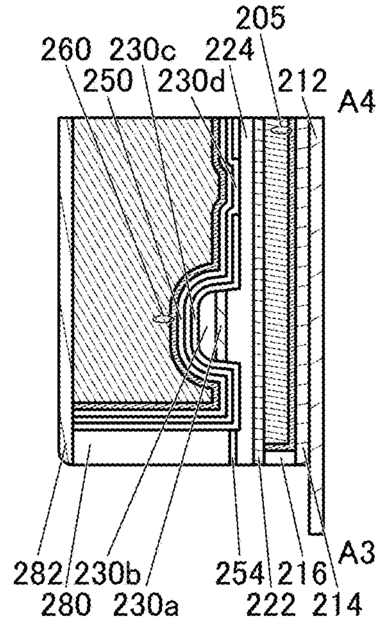
FIG. 14B to FIG. 14D are cross-sectional views showing the method for manufacturing the semiconductor device.
Figure 14B:
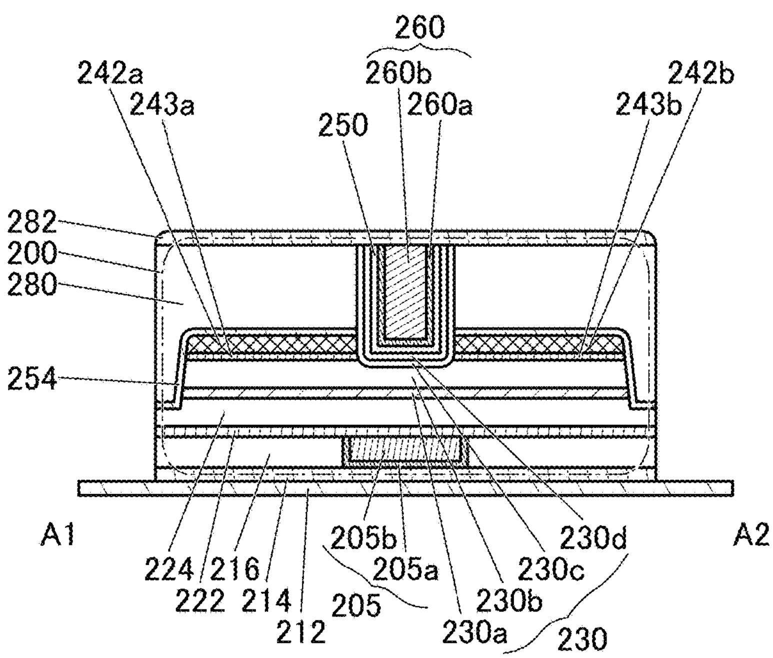
Figure 14D:
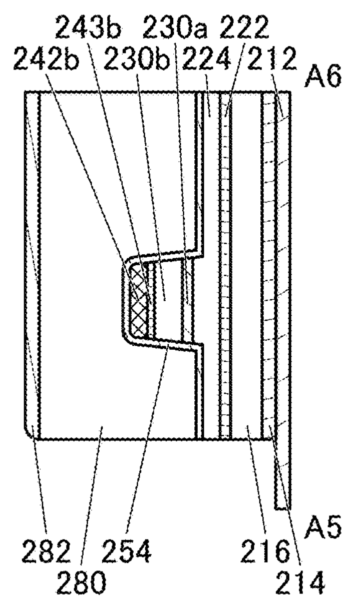

Next, the insulator 282 is formed over the oxide 230c, the oxide 230d, the insulator 250, the conductor 260, and the insulator 280 (see FIG. 13B to FIG. 13D). The insulator 282 can be deposited with a sputtering method, a CVD method, an MBE method, a PLD method, an ALD method, or the like. As the insulator 282, aluminum oxide is preferably deposited by a sputtering method, for example. The insulator 282 is deposited with a sputtering method in an oxygen-containing atmosphere, whereby oxygen can be added to the insulator 280 during the deposition. At this time, the insulator 282 is preferably deposited while the substrate is heated. When the insulator 282 is formed in contact with the top surface of the conductor 260, oxygen contained in the insulator 280 can be inhibited from being absorbed by the conductor 260 in later heat treatment.

Subsequently, part of the insulator 282, part of the insulator 280, part of the insulator 254, part of the insulator 224, part of the insulator 222, part of the insulator 216, and part of the insulator 214 are processed to form an opening reaching the insulator 212 (see FIG. 14A to FIG. 14D). The opening is formed to surround the transistor 200 in some cases. Alternatively, the opening is sometimes formed to surround a plurality of transistors 200. Thus, part of the side surface of the insulator 282, part of the side surface of the insulator 280, part of the side surface of the insulator 254, part of the side surface of the insulator 224, part of the side surface of the insulator 222, part of the side surface of the insulator 216, and part of the side surface of the insulator 214 are exposed in the opening.

The part of the insulator 282, the part of the insulator 280, the part of the insulator 254, the part of the insulator 224, the part of the insulator 222, the part of the insulator 216, and the part of the insulator 214 can be processed using a dry etching method or a wet etching method. Processing using a dry etching method is suitable for microfabrication. The processing may be performed under different conditions. Note that in this step, the thickness of the insulator 212 in a region overlapped by the opening is reduced in some cases.

Figure 15A:
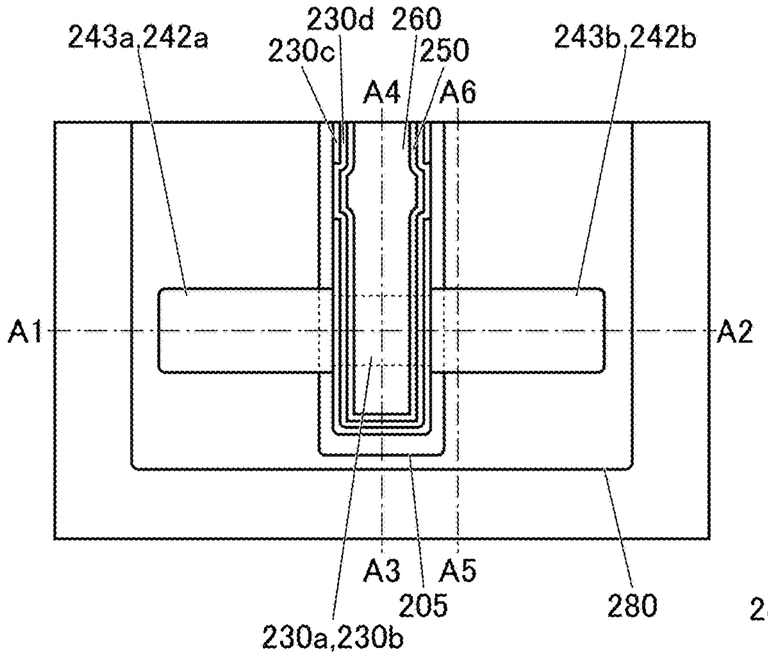
FIG. 15A is a top view showing a method for manufacturing a semiconductor device.
Figure 15C:
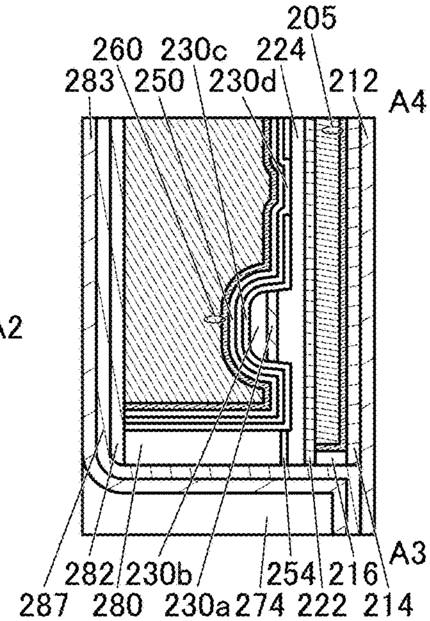
FIG. 15B to FIG. 15D are cross-sectional views showing the method for manufacturing the semiconductor device.
Figure 15B:
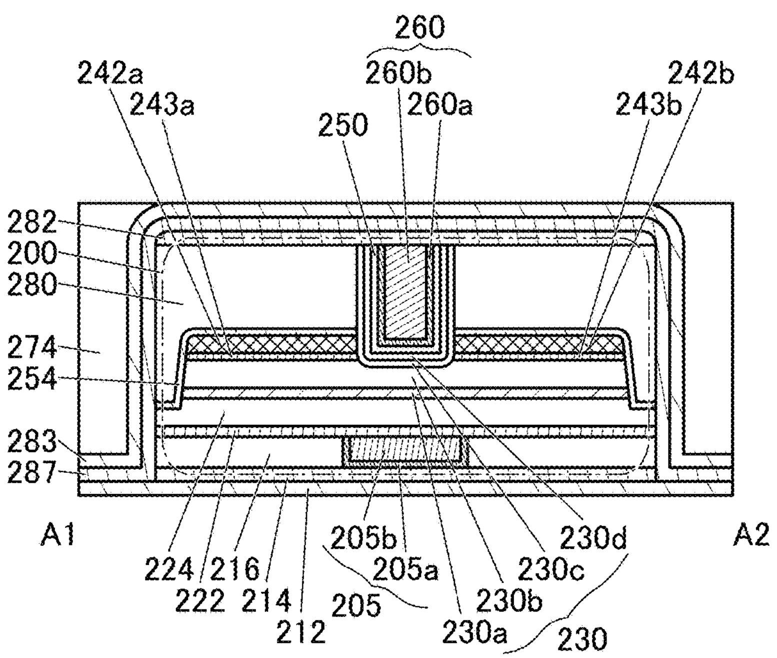
Figure 15D:
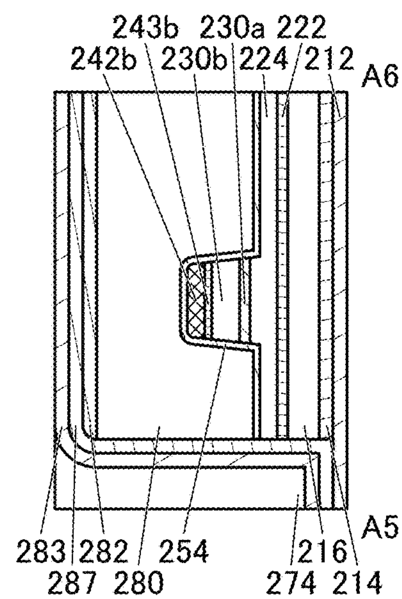

Then, the insulator 287 is formed to cover the insulator 282, the insulator 280, the insulator 254, the insulator 224, the insulator 222, the insulator 216, and the insulator 214 (see FIG. 15B to FIG. 15D). The insulator 287 can be deposited with a sputtering method, a CVD method, an MBE method, a PLD method, an ALD method, or the like. In addition, the insulator 287 may have a multilayer structure. For example, aluminum oxide may be deposited by a sputtering method and silicon nitride may be deposited over the aluminum oxide by a sputtering method. As shown in FIG. 15B to FIG. 15D, the insulator 287 is in contact with the insulator 212 at the bottom surface of the opening. That is, a top surface and a side surface of the transistor 200 are surrounded by the insulator 287 and a bottom surface of the transistor 200 is surrounded by the insulator 212. Surrounding the transistor 200 by the insulator 287 and the insulator 212 having high barrier properties can prevent entry of moisture and hydrogen from the outside.

Next, the insulator 283 may be formed over the insulator 287 (see FIG. 15B to FIG. 15D). Note that the insulator 283 is preferably deposited with a deposition method that enables high coverage. For example, the insulator 283 can be deposited by a sputtering method, a CVD method, an MBE method, a PLD method, an ALD method, or the like. The insulator 283 is preferably formed using the same material as the insulator 212.

Specifically, silicon nitride is preferably deposited by a CVD method. It is particularly preferable that the insulator 283 be deposited by a CVD method using a compound gas containing no hydrogen atom or having a low hydrogen atom content.

Then, an insulating film to be the insulator 274 is deposited over the insulator 283. The insulating film can be deposited by a sputtering method, a CVD method, an MBE method, a PLD method, an ALD method, or the like. For example, silicon oxide is preferably deposited by a CVD method. The insulating film is preferably deposited by a deposition method using a gas in which hydrogen atoms are reduced or removed. Thus, the hydrogen concentration of the insulating film can be reduced.

Next, the insulating film to be the insulator 274 is subjected to CMP treatment, whereby the insulator 274 having a flat top surface is formed (see FIG. 15B to FIG. 15D).

Subsequently, heat treatment may be performed. In this embodiment, treatment is performed at 400° C. in a nitrogen atmosphere for 1 hour. Through the heat treatment, oxygen added by the deposition of the insulator 282 can be diffused into the insulator 280 and then can be supplied to the oxide 230a and the oxide 230b through the oxide 230c. Note that the heat treatment is not necessarily performed after the formation of the insulator 274 and may be performed after the deposition of the insulator 282 or the deposition of the insulator 283, for example.

Figure 16A:
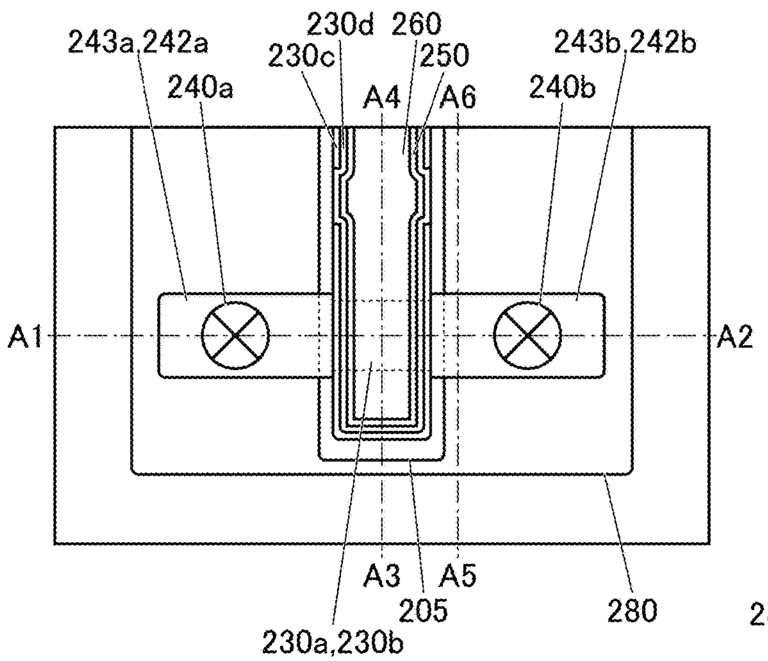
FIG. 16A is a top view showing a method for manufacturing a semiconductor device.
Figure 16C:
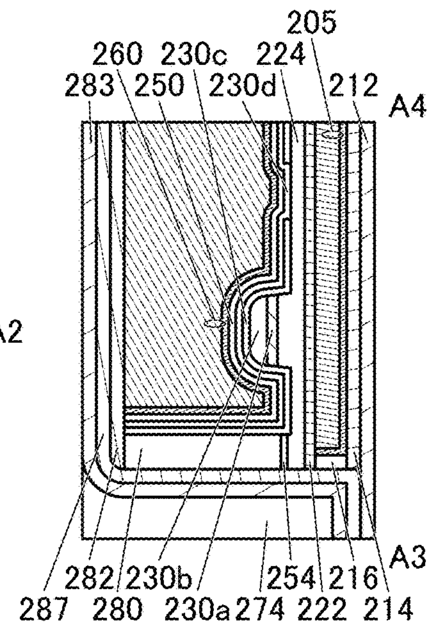
FIG. 16B to FIG. 16D are cross-sectional views showing the method for manufacturing the semiconductor device.
Figure 16B:
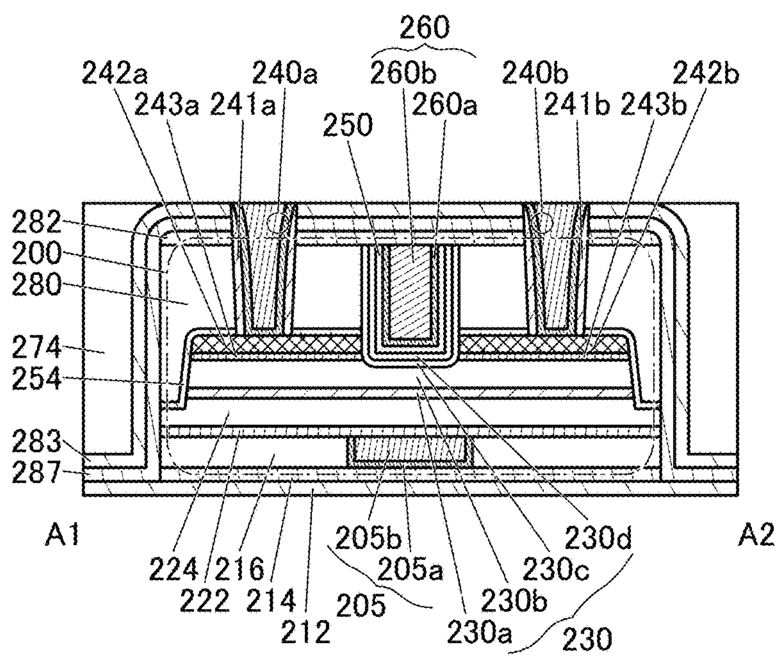
Figure 16D:
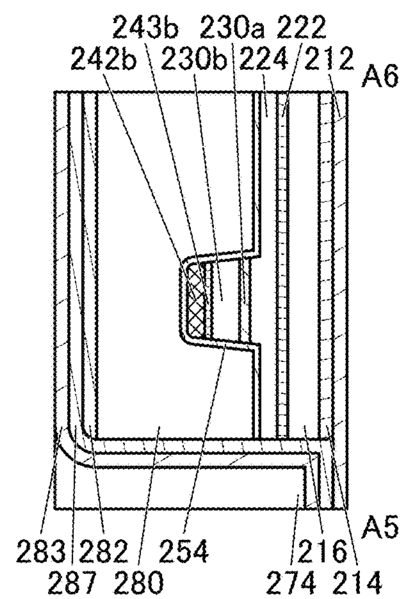
Figure 17A:
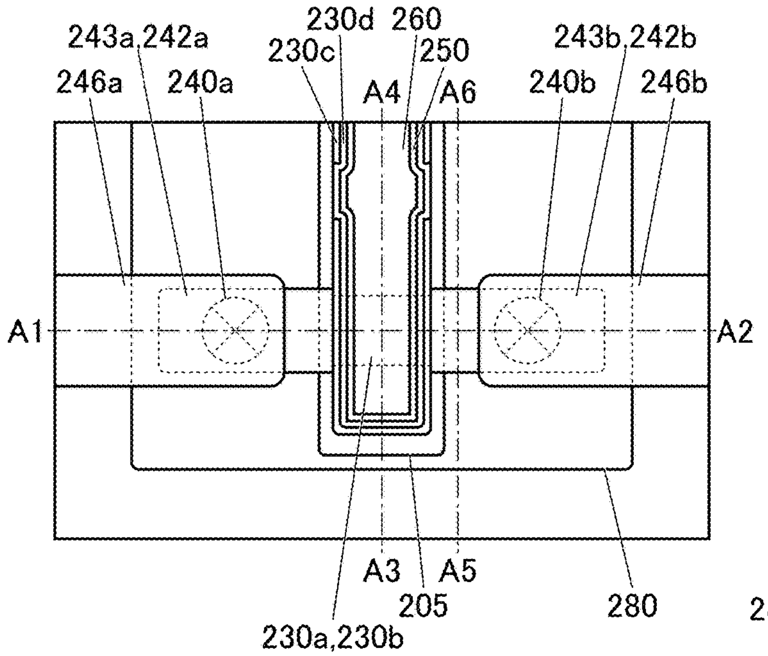
FIG. 17A is a top view showing a method for manufacturing a semiconductor device.
Figure 17C:
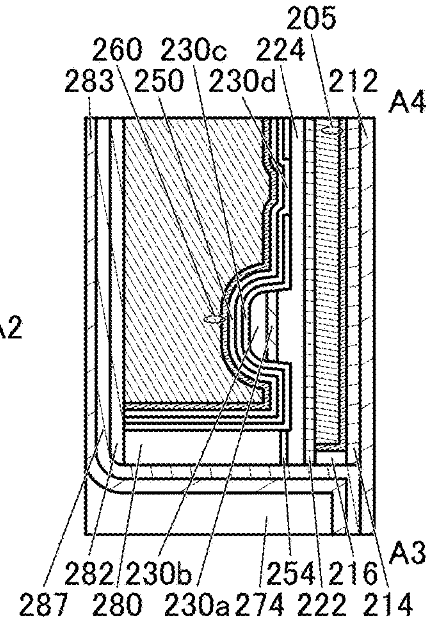
FIG. 17B to FIG. 17D are cross-sectional views showing the method for manufacturing the semiconductor device.
Figure 17B:
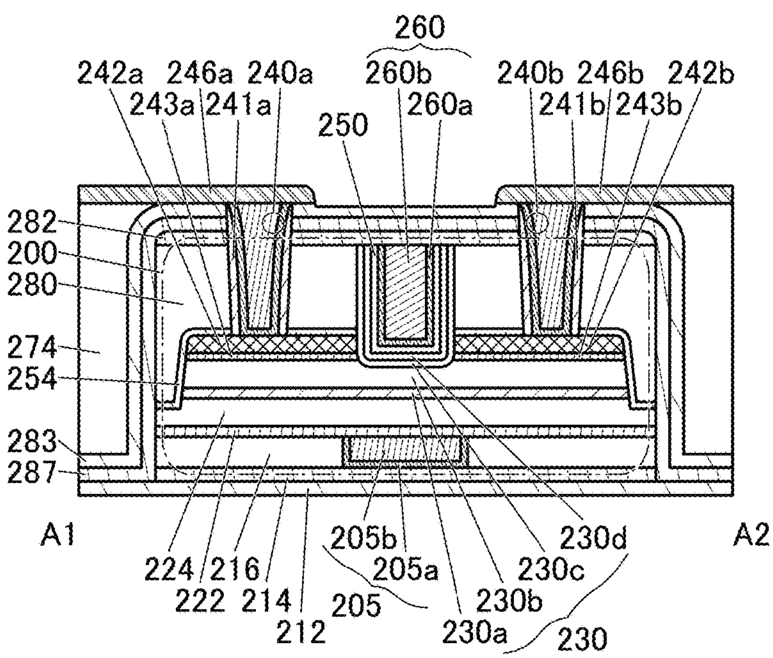
Figure 17D:
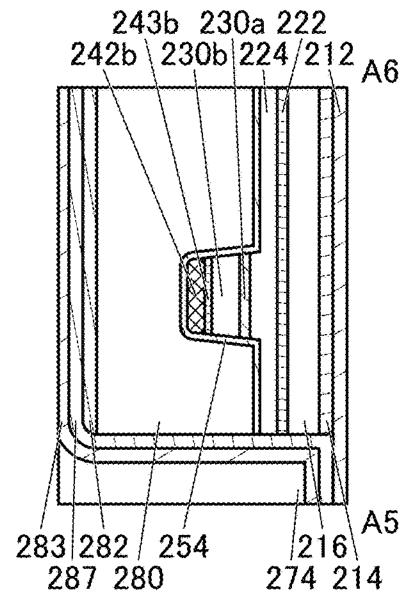

Subsequently, an opening reaching the conductor 242a and an opening reaching the conductor 242b are formed in the insulator 254, the insulator 280, the insulator 282, the insulator 287, and the insulator 283 (see FIG. 16A and FIG. 16B). The openings are formed using a lithography method. Note that the openings in the top view in FIG. 16A have a circular shape; however, the shapes of the openings are not limited thereto. For example, the openings in the top view may have an almost circular shape such as an elliptical shape, a polygonal shape such as a quadrangular shape, or a polygonal shape such as a quadrangular shape with rounded corners.

Subsequently, an insulating film to be the insulator 241a and the insulator 241b is deposited and the insulating film is subjected to anisotropic etching, so that the insulator 241a and the insulator 241b are formed (see FIG. 16A and FIG. 16B). The insulating film can be deposited by a sputtering method, a CVD method, an MBE method, a PLD method, an ALD method, or the like. As the insulating film, an insulating film having a function of inhibiting passage of oxygen is preferably used. For example, an aluminum oxide film is preferably deposited by an ALD method. Alternatively, a silicon nitride film is preferably deposited by a PEALD method. Silicon nitride is preferable because it has a high blocking property against hydrogen.

For the anisotropic etching of the insulating film to be the insulator 241a and the insulator 241b, a dry etching method is employed, for example. Providing the insulator 241a and the insulator 241b on the side wall portions of the openings can inhibit passage of oxygen from the outside and can prevent oxidation of the conductor 240a and the conductor 240b to be formed next. Furthermore, impurities such as water and hydrogen can be prevented from diffusing from the conductor 240*a* and the conductor 240*b* to the outside.

Next, a conductive film to be the conductor 240*a* and the conductor 240*b* is deposited. The conductive film preferably has a stacked-layer structure including a conductor having a function of inhibiting passage of impurities such as water and hydrogen. For example, a stack of tantalum nitride, titanium nitride, or the like and tungsten, molybdenum, copper, or the like can be employed. The conductive film can be deposited by a sputtering method, a CVD method, an MBE method, a PLD method, an ALD method, or the like.

Then, part of the conductive film to be the conductor 240*a* and the conductor 240*b* is removed by CMP treatment to expose top surfaces of the insulator 283 and the insulator 274. As a result, the conductive film remains only in the openings, so that the conductor 240*a* and the conductor 240*b* having flat top surfaces can be formed (see FIG. 16A and FIG. 16B). Note that part of the top surface of the insulator 283 and part of the top surface of the insulator 274 are sometimes removed by the CMP treatment.

Next, a conductive film to be the conductor 246*a* and the conductor 246*b* is deposited. The conductive film can be deposited by a sputtering method, a CVD method, an MBE method, a PLD method, an ALD method, or the like.

Subsequently, the conductive film to be the conductor 246*a* and the conductor 246*b* is processed by a lithography method to form the conductor 246*a* in contact with the top surface of the conductor 240*a* and the conductor 246*b* in contact with the top surface of the conductor 240*b*. At this time, part of the insulator 283 in a region where the conductor 246*a* and the conductor 246*b* do not overlap the insulator 283 is removed in some cases (see FIG. 17A and FIG. 17B).

Next, the insulator 286 is deposited over the conductor 246*a*, the conductor 246*b*, and the insulator 283 (see FIG. 4A to FIG. 4D). The insulator 286 can be deposited by a sputtering method, a CVD method, an MBE method, a PLD method, an ALD method, or the like. In addition, the insulator 286 may have a multilayer structure. For example, silicon nitride may be deposited with a sputtering method and silicon nitride may be deposited with a CVD method over the silicon nitride.

Through the above process, the semiconductor device including the transistor 200 shown in FIG. 4A to FIG. 4D can be manufactured. As shown in FIG. 5A to FIG. 17D, with the use of the method for manufacturing the semiconductor device described in this embodiment, the transistor 200 can be manufactured.

<Variation Example 2 of Semiconductor Device>

An example of the semiconductor device in this embodiment is described below with reference to FIG. 18A to FIG. 18D.

Figure 18A:
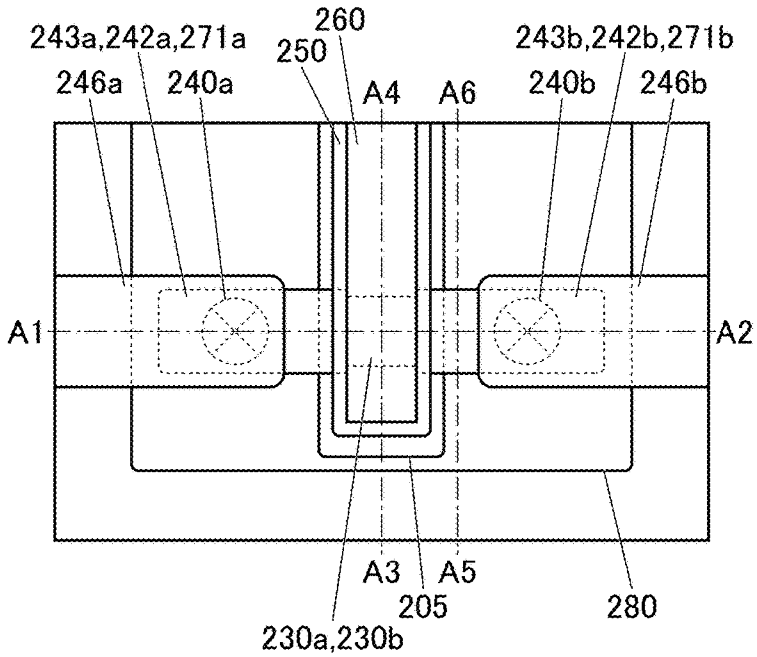
FIG. 18A is a top view of a semiconductor device.
Figure 18C:
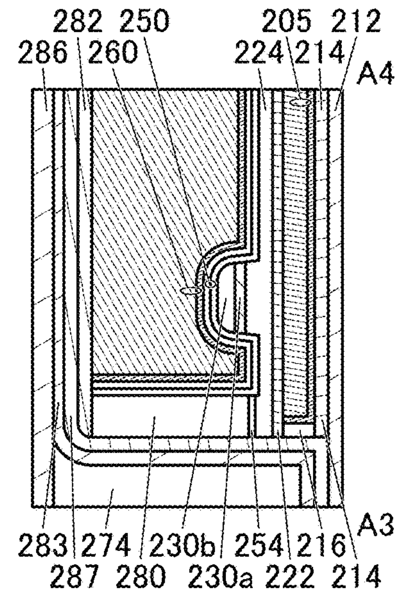
FIG. 18B to FIG. 18D are cross-sectional views of the semiconductor device.
Figure 18B:
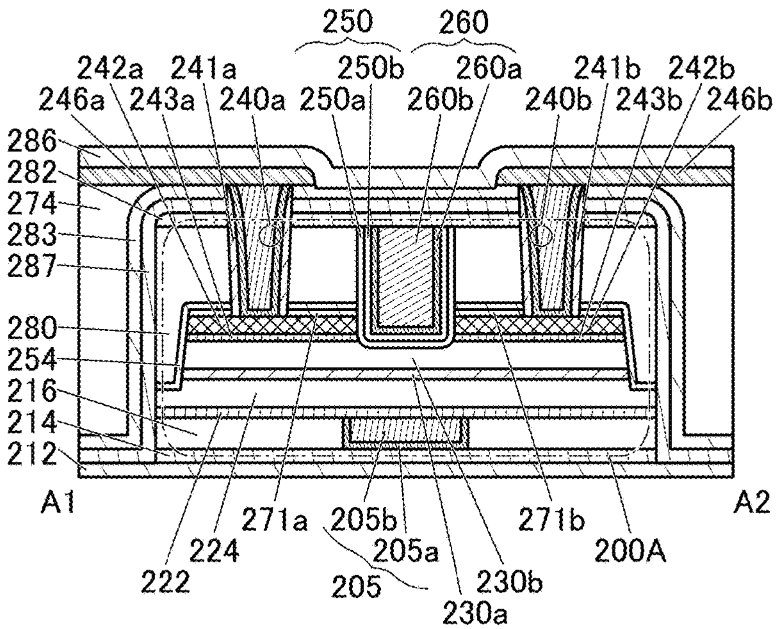
Figure 18D:
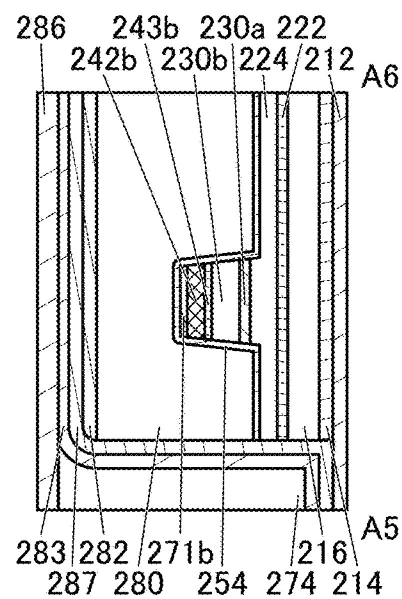

FIG. 18A is a top view of a semiconductor device including a transistor 200A. FIG. 18B is a cross-sectional view corresponding to a portion indicated by the dashed-dotted line A1-A2 in FIG. 18A. FIG. 18C is a cross-sectional view corresponding to a portion indicated by the dashed-dotted line A3-A4 in FIG. 18A. FIG. 18D is a cross-sectional view corresponding to a portion indicated by the dashed-dotted line A5-A6 in FIG. 18A. Note that for clarity of the drawing, some components are not shown in the top view of FIG. 18A.

Note that in the semiconductor device shown in FIG. 18A to FIG. 18D, components having the same functions as the components included in the semiconductor devices described in <Structure example of semiconductor device> and <Variation example 1 of semiconductor device> are denoted by the same reference numerals. The materials described in detail in <Structure example of semiconductor device> and <Variation example 1 of semiconductor device> can be used as constituent materials for the semiconductor device in this section.

The semiconductor device shown in FIG. 18A to FIG. 18D is a variation example of the semiconductor device shown in FIG. 4A to FIG. 4D. The semiconductor device shown in FIG. 18A to FIG. 18D is different from the semiconductor device shown in FIG. 4A to FIG. 4D in that an insulator 271*a* and an insulator 271*b* are included, and that the oxide 230*c* and the oxide 230*d* are not included. It is also different in that the insulator 250 has a two-layer structure of an insulator 250*a* and an insulator 250*b*.

In the semiconductor device shown in FIG. 18A to FIG. 18D, the insulator 271*a* is provided between the conductor 242*a* and the insulator 254, and the insulator 271*b* is provided between the conductor 242*b* and the insulator 254.

Here, the insulator 271*a* and the insulator 271*b* preferably have a function of inhibiting diffusion of oxygen. In that case, absorption of excess oxygen contained in the insulator 280 by the conductor 242*a* and the conductor 242*b* functioning as the source electrode and the drain electrode can be inhibited. Furthermore, inhibiting oxidation of the conductor 242*a* and the conductor 242*b* can inhibit an increase in the contact resistance between the transistor and a wiring. Consequently, the transistor 200A can have favorable electrical characteristics and reliability. The insulator 271*a* and the insulator 271*b* can be provided using a material similar to that for the insulator 254, for example.

In a method for manufacturing the semiconductor device shown in FIG. 18A to FIG. 18D, an insulating layer to be the insulator 271*a* and the insulator 271*b* and a conductive layer provided over the insulating film function as a mask for the conductive film 242A; hence, an end portion at the intersection of the side surface and the top surface of each of the conductor 242*a* and the conductor 242*b* is angular. The cross-sectional area of the conductor 242*a* and the conductor 242*b* is larger in the case where the end portion at the intersection of the side surface and the top surface of each of the conductor 242*a* and the conductor 242*b* is angular than in the case where the end portion has a curved surface. Thus, the resistance of the conductor 242*a* and the conductor 242*b* is reduced, so that the on-state current of the transistor 200A can be increased.

When the oxide 230*c* and the oxide 230*d* are not provided, generation of a parasitic transistor between the transistor 200A and the adjacent transistor 200A can be inhibited, which inhibits generation of a leakage path along the conductor 260. Thus, a semiconductor device that has favorable electrical characteristics and can be miniaturized or highly integrated can be provided.

As shown in FIG. 18B, the insulator 250 may have a stacked-layer structure of the insulator 250*a* and the insulator 250*b*.

In the case where the insulator 250 has a stacked-layer structure of the insulator 250*a* and the insulator 250*b*, it is preferable that the insulator 250*a* be formed using an insulator that releases oxygen by heating and the insulator 250*b* be formed using an insulator having a function of inhibiting diffusion of oxygen. With such a structure, oxygen contained in the insulator 250*a* can be inhibited from diffusing into the conductor 260. That is, the reduction in the amount of oxygen supplied to the oxide 230 can be inhibited. In addition, oxidation of the conductor 260 due to oxygen included in the insulator 250*a* can be inhibited. For example, the insulator 250*a* can be provided using the above-described material that can be used for the insulator 250, and the insulator 250*b* can be provided using a material similar to that for the insulator 222.

In the case where silicon oxide, silicon oxynitride, or the like is used for the insulator 250*a*, the insulator 250*b* may be formed using an insulating material that is a high-k material having a high relative permittivity. The gate insulator having a stacked-layer structure of the insulator 250*a* and the insulator 250*b* can be thermally stable and can have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, for the insulator 250*b*, a metal oxide containing one kind or two or more kinds selected from hafnium, aluminum, gallium, yttrium, zirconium, tungsten, titanium, tantalum, nickel, germanium, magnesium, and the like or a metal oxide that can be used as the oxide 230 can be used. In particular, an insulator containing an oxide of one or both of aluminum and hafnium is preferably used.

When the insulator 250 has a stacked-layer structure of the insulator 250*a* and the insulator 250*b*, the distance between the conductor 260 and the oxide 230 is kept by the physical thickness of the insulator 250; hence, a leakage current between the conductor 260 and the oxide 230 can be reduced. Moreover, the physical distance between the conductor 260 and the oxide 230 and the intensity of the electric field applied to the oxide 230 from the conductor 260 can be easily adjusted as appropriate.

<Application Examples of Semiconductor Device>

Examples of a semiconductor device including the transistor 200 of one embodiment of the present invention that is different from the semiconductor devices described previously in <Structure example of semiconductor device> and <Variation example 1 of semiconductor device> are described below with reference to FIG. 19A and FIG. 19B. Note that in the semiconductor devices shown in FIG. 19A and FIG. 19B, components having the same functions as the components in the semiconductor device described in <Variation example 1 of semiconductor device> (see FIG. 4A to FIG. 4D) are denoted by the same reference numerals. Note that also in this section, the materials described in detail in <Structure example of semiconductor device> and <Variation example 1 of semiconductor device> can be used as the constituent materials for the transistor 200.

Figure 19A:
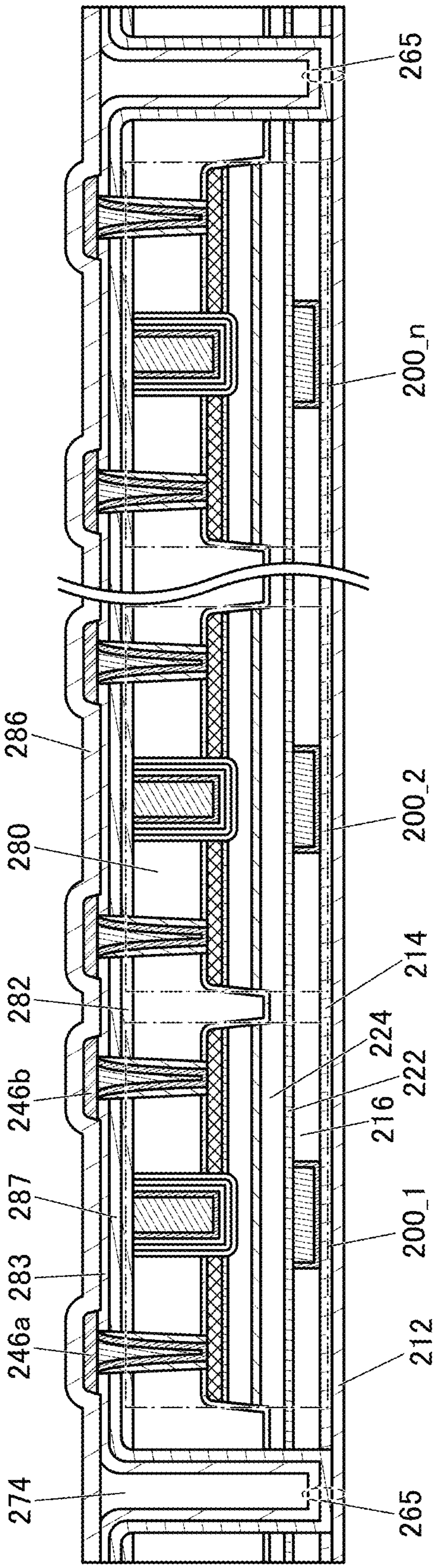
FIG. 19A and FIG. 19B are cross-sectional views of semiconductor devices.
Figure 19B:
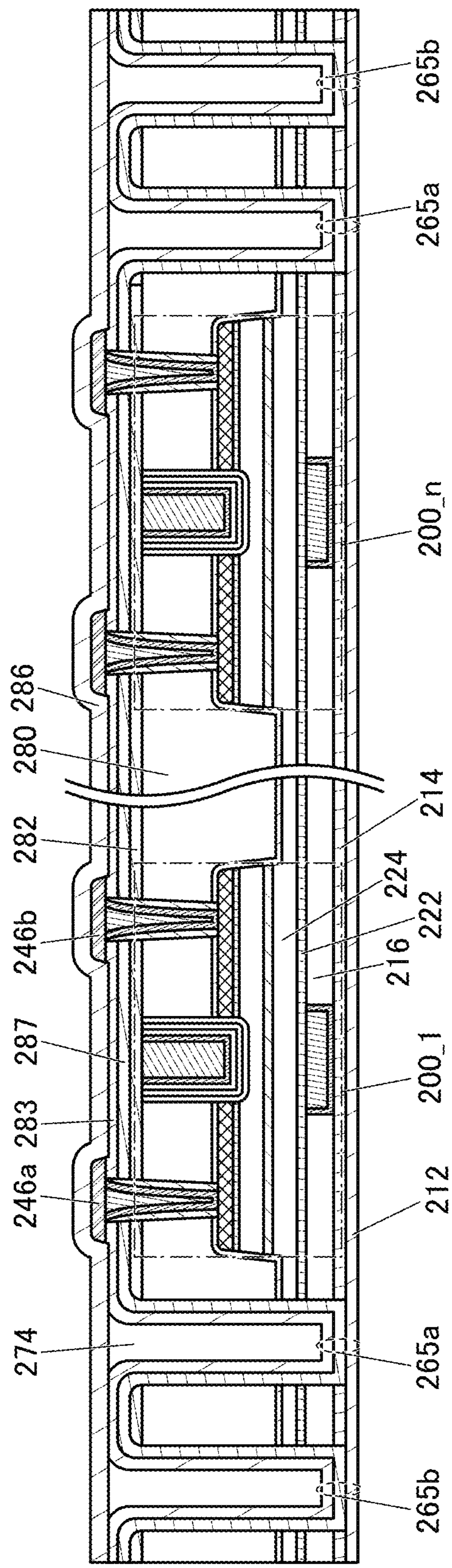

FIG. 19A and FIG. 19B each show a structure in which a plurality of transistors (a transistor 200_1 to a transistor 200_*n*) are collectively sealed with the insulator 287, the insulator 283, and the insulator 212. Note that although the plurality of transistors appear to be arranged in the channel length direction in FIG. 19A and FIG. 19B, the present invention is not limited thereto. The plurality of transistors may be arranged in the channel width direction or in a matrix. Depending on the design, the transistors may be arranged without regularity.

As shown in FIG. 19A, a portion where the insulator 287 and the insulator 283 are in contact with the insulator 212 (hereinafter, sometimes referred to as a sealing portion 265) is formed outside the plurality of transistors (the transistor 200_1 to the transistor 200_*n*). The sealing portion 265 is formed to surround the plurality of transistors (also referred to as a transistor group). With such a structure, the plurality of transistors can be surrounded by the insulator 287, the insulator 283, and the insulator 212. Thus, a plurality of transistor groups surrounded by the sealing portions 265 are provided over a substrate.

A dicing line (sometimes referred to as a scribe line, a dividing line, or a cutting line) may be provided to overlap the sealing portion 265. The above substrate is divided at the dicing line, so that the transistor group surrounded by the sealing portion 265 is taken out as one chip.

Although FIG. 19A shows an example in which the plurality of transistors (the transistor 200_1 to the transistor 200_*n*) are surrounded by one sealing portion 265, the present invention is not limited thereto. As shown in FIG. 19B, the plurality of transistors may be surrounded by a plurality of sealing portions. In FIG. 19B, the plurality of transistors are surrounded by a sealing portion 265*a* and are further surrounded by an outer sealing portion 265*b*.

When the plurality of transistors (the transistor 200_1 to the transistor 200_*n*) are surrounded by the plurality of sealing portions in this manner, a portion where the insulator 287 is in contact with the insulator 212 increases, which can further improve adhesion between the insulator 287 and the insulator 212. Accordingly, the plurality of transistors can be more reliably sealed.

In that case, a dicing line may be provided to overlap the sealing portion 265*a* or the sealing portion 265*b*, or may be provided between the sealing portion 265*a* and the sealing portion 265*b*.

According to one embodiment of the present invention, a semiconductor device with a small variation in transistor characteristics can be provided. According to one embodiment of the present invention, a highly reliable semiconductor device can be provided. According to one embodiment of the present invention, a semiconductor device with favorable electrical characteristics can be provided. According to one embodiment of the present invention, a semiconductor device with a high on-state current can be provided. According to one embodiment of the present invention, a semiconductor device that can be miniaturized or highly integrated can be provided.

The structure, method, and the like described above in this embodiment can be used in appropriate combination with the structures, methods, and the like described in the other embodiments, the examples, and the like.

Embodiment 2

In this embodiment, one embodiment of a semiconductor device is described with reference to FIG. 20 and FIG. 21.

[Storage Device 1]

Figure 20:
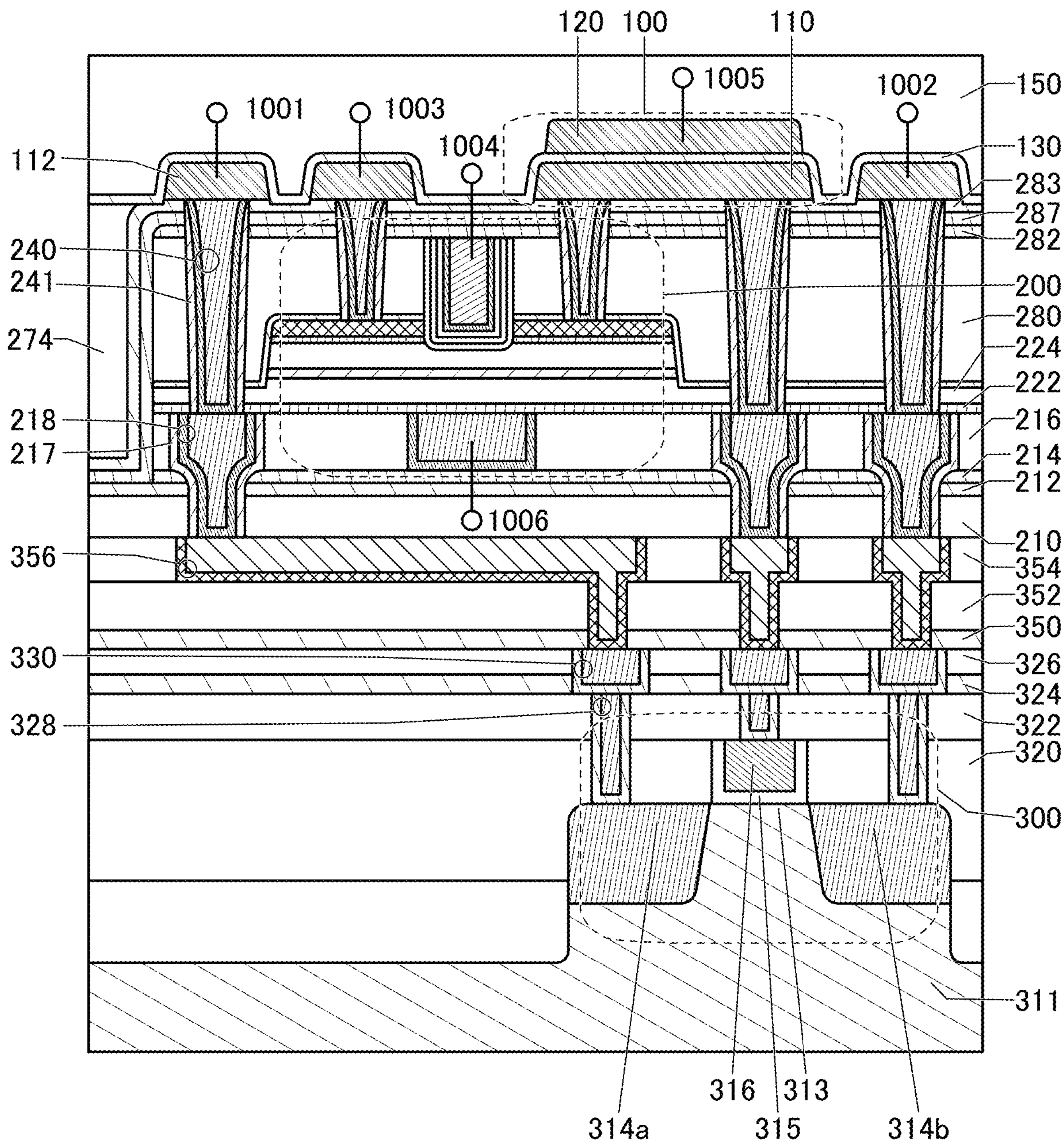
FIG. 20 is a cross-sectional view showing a structure of a storage device.

FIG. 20 shows an example of a semiconductor device (a storage device) of one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor in which a channel is formed in a semiconductor layer including an oxide semiconductor. The off-state current of the transistor 200 is low; thus, by using the transistor 200 in a storage device, stored data can be retained for a long time. In other words, such a storage device does not require refresh operation or has extremely low frequency of the refresh operation, which leads to a sufficient reduction in power consumption of the storage device.

In the semiconductor device shown in FIG. 20, a wiring 1001 is electrically connected to a source of the transistor 300, and a wiring 1002 is electrically connected to a drain of the transistor 300. A wiring 1003 is electrically connected to one of the source and the drain of the transistor 200, a wiring 1004 is electrically connected to the first gate of the transistor 200, and a wiring 1006 is electrically connected to the second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

By arranging the storage devices shown in FIG. 20 in a matrix, a memory cell array can be formed.

<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314*a* and a low-resistance region 314*b* functioning as a source region and a drain region. The transistor 300 can be a p-channel transistor or an n-channel transistor.

Here, in the transistor 300 shown in FIG. 20, the semiconductor region 313 (part of the substrate 311) in which the channel is formed has a protruding shape. The conductor 316 is provided to cover a side surface and a top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion. Although the case where the protruding portion is formed by processing part of the semiconductor substrate is described here, a semiconductor film having a protruding shape may be formed by processing an SOI substrate.

Note that the transistor 300 shown in FIG. 20 is an example and the structure is not limited thereto; an appropriate transistor is used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric. Here, as the insulator 130, the insulator that can be used as the insulator 286 described in the above embodiment is preferably used.

For example, a conductor 112 and the conductor 110 over a conductor 240 can be formed at the same time. Note that the conductor 112 has a function of a plug or a wiring that is electrically connected to the capacitor 100, the transistor 200, or the transistor 300.

The conductor 112 and the conductor 110 each have a single-layer structure in FIG. 20; however, the structure is not limited thereto, and a stacked-layer structure of two or more layers may be used. For example, between a conductor having a barrier property and a conductor having high conductivity, a conductor that is highly adhesive to the conductor having a barrier property and the conductor having high conductivity may be formed.

For the insulator 130, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like is used, and stacked layers or a single layer can be provided.

For example, for the insulator 130, a stacked-layer structure using a material with high dielectric strength, such as silicon oxynitride, and a high permittivity (high-k) material is preferably used. In the capacitor 100 having such a structure, sufficient capacitance can be ensured owing to the high permittivity (high-k) insulator, and the dielectric strength can be increased owing to the insulator with high dielectric strength; thus, the electrostatic breakdown of the capacitor 100 can be inhibited.

Examples of a high permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Meanwhile, examples of a material with high dielectric strength (a material having a low relative permittivity) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between the components. In addition, a plurality of wiring layers can be provided in accordance with design. Here, a plurality of conductors functioning as plugs or wirings are collectively denoted by the same reference numeral in some cases. In this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are stacked in this order as interlayer films over the transistor 300. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, the top surface of the insulator 322 may be planarized by planarization treatment using a chemical mechanical polishing (CMP) method or the like to increase planarity.

A wiring layer may be provided over the insulator 326 and the conductor 330. For example, in FIG. 20, an insulator 350, an insulator 352, and an insulator 354 are stacked in this order. A conductor 356 is formed in the insulator 350, the insulator 352, and the insulator 354. The conductor 356 functions as a plug or a wiring.

Similarly, a conductor 218, a conductor included in the transistor 200 (the conductor 205), and the like are embedded in an insulator 210, the insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Here, like an insulator 241 described in the above embodiment, an insulator 217 is provided in contact with a side surface of the conductor 218 functioning as a plug. The insulator 217 is provided in contact with a side wall of an opening formed in the insulator 210, the insulator 212, the insulator 214, and the insulator 216. That is, the insulator 217 is provided between the conductor 218 and the insulator 210, the insulator 212, the insulator 214, and the insulator 216. Note that the conductor 205 and the conductor 218 can be formed in parallel; thus, the insulator 217 is sometimes formed in contact with a side surface of the conductor 205.

As the insulator 217, for example, an insulator such as silicon nitride, aluminum oxide, or silicon nitride oxide is used. Since the insulator 217 is provided in contact with the insulator 212, the insulator 214, and the insulator 222, entry of impurities such as water or hydrogen into the oxide 230 through the conductor 218 from the insulator 210, the insulator 216, or the like can be inhibited. In particular, silicon nitride is suitable because of having a high blocking property against hydrogen. Moreover, oxygen contained in the insulator 210 or the insulator 216 can be prevented from being absorbed by the conductor 218.

The insulator 217 can be formed in a manner similar to that of the insulator 241. For example, silicon nitride is deposited using a PEALD method and an opening reaching the conductor 356 is formed using anisotropic etching.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material with a low relative permittivity is used for the insulator functioning as an interlayer film, the parasitic capacitance generated between wirings can be reduced. Thus, a material is preferably selected depending on the function of the insulator.

For example, for the insulator 150, the insulator 210, the insulator 352, the insulator 354, and the like, an insulator having a low relative permittivity is preferably used. For example, the insulators preferably contain silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used for the insulator 214, the insulator 212, the insulator 350, and the like.

As the insulator having a function of inhibiting passage of oxygen and impurities such as hydrogen, a single layer or stacked layers of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum, for example, are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductor that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single layer or stacked layers of a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is particularly preferable to use tungsten. Alternatively, it is preferable to use a low-resistance conductive material such as aluminum or copper. The use of a low-resistance conductive material can reduce wiring resistance.

<Wiring or Plug in Layer where Oxide Semiconductor is Provided>

In the case where an oxide semiconductor is used in the transistor 200, an insulator including an excess-oxygen region is sometimes provided in the vicinity of the oxide semiconductor. In that case, an insulator having a barrier property is preferably provided between the insulator including the excess-oxygen region and a conductor provided in the insulator including the excess-oxygen region.

For example, in FIG. 20, the insulator 241 is preferably provided between the conductor 240 and the insulator 224 and the insulator 280 that include excess oxygen. Since the insulator 241 is provided in contact with the insulator 222, the insulator 282, the insulator 287, and the insulator 283, the insulator 224 and the transistor 200 can be sealed by the insulators having a barrier property.

That is, providing the insulator 241 can inhibit excess oxygen contained in the insulator 224 and the insulator 280 from being absorbed by the conductor 240. In addition, providing the insulator 241 can inhibit diffusion of hydrogen, which is an impurity, into the transistor 200 through the conductor 240.

The insulator 241 is preferably formed using an insulating material having a function of inhibiting diffusion of oxygen and impurities such as water or hydrogen. For example, silicon nitride, silicon nitride oxide, aluminum oxide, hafnium oxide, or the like is preferably used. In particular, silicon nitride is preferable because of its high blocking property against hydrogen. Alternatively, for example, a metal oxide such as magnesium oxide, gallium oxide, germanium oxide, yttrium oxide, zirconium oxide, lanthanum oxide, neodymium oxide, or tantalum oxide can be used.

As in the above embodiment, the transistor 200 is preferably sealed with the insulator 212, the insulator 214, the insulator 282, the insulator 287, and the insulator 283. Such a structure can inhibit entry of impurities (particularly hydrogen and water) contained in the insulator 274, the insulator 150, or the like into the insulator 280 or the like.

Here, the conductor 240 penetrates the insulator 283, the insulator 287, and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, the insulator 287, and the insulator 283 through the conductor 240 and the conductor 218. In this manner, the transistor 200 is sealed more surely with the insulator 212, the insulator 214, the insulator 282, the insulator 287, the insulator 283, the insulator 241, and the insulator 217, so that impurities such as hydrogen contained in the insulator 274 or the like can be inhibited from entering the transistor 200.

As described in the above embodiment, the insulator 216, the insulator 224, the insulator 280, the insulator 250, and the insulator 274 are preferably formed with a deposition method using a gas in which hydrogen atoms are reduced or removed. Thus, the hydrogen concentrations of the insulator 216, the insulator 224, the insulator 280, the insulator 250, and the insulator 274 can be lowered.

In this manner, the hydrogen concentration of silicon-based insulating films in the vicinity of the transistor 200 can be reduced; hence, the hydrogen concentration of the oxide 230 can be reduced.

<Dicing Line>

A dicing line (referred to as a scribe line, a dividing line, or a cutting line in some cases) which is provided when a large-sized substrate is divided into semiconductor elements so that a plurality of semiconductor devices are each formed in a chip form is described below. Examples of a dividing method include the case where a groove (a dicing line) for dividing semiconductor elements is formed on a substrate, and then the substrate is cut along the dicing line to divide (split) it into a plurality of semiconductor devices.

Here, for example, as shown in FIG. 20, it is preferable that a region in which the insulator 287 and the insulator 283 are in contact with the insulator 212 be designed to be overlapped by the dicing line. That is, an opening is provided in the insulator 282, the insulator 280, the insulator 254, the insulator 224, the insulator 222, the insulator 216, and the insulator 214 in the vicinity of a region to be the dicing line that is provided on an outer edge of a memory cell including a plurality of transistors 200.

In other words, in the opening provided in the insulator 282, the insulator 280, the insulator 254, the insulator 224, the insulator 222, the insulator 216, and the insulator 214, the insulator 212 is in contact with the insulator 287 and the insulator 283. Here, the insulator 212 and the insulator 287 or the insulator 283 may be formed using the same material and the same method, for example. When the insulator 212 and the insulator 287 or the insulator 283 are formed using the same material and the same method, the adhesion therebetween can be increased. For example, silicon nitride is preferably used.

With such a structure, the transistor 200 can be surrounded by the insulator 212, the insulator 214, the insulator 282, the insulator 287, and the insulator 283. At least one of the insulator 212, the insulator 214, the insulator 282, the insulator 287, and the insulator 283 has a function of inhibiting diffusion of oxygen, hydrogen, and water; hence, even when the substrate is divided into circuit regions each of which is provided with the semiconductor elements described in this embodiment to be processed into a plurality of chips, the entry and diffusion of impurities such as hydrogen or water from the direction of the side surface of the divided substrate into the transistor 200 can be inhibited.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and improved reliability.

Although the capacitor 100 of the storage device shown in FIG. 20 has a planar shape, the storage device described in this embodiment is not limited thereto. For example, the capacitor 100 may have a cylindrical shape as shown in FIG. 21. Note that the structure below and including the insulator 150 of a storage device shown in FIG. 21 is similar to that of the semiconductor device shown in FIG. 20.

The insulator 150 is provided over the insulator 130, and an insulator 142 is provided over the insulator 150. An opening is formed in the insulator 150 and the insulator 142.

Figure 21:
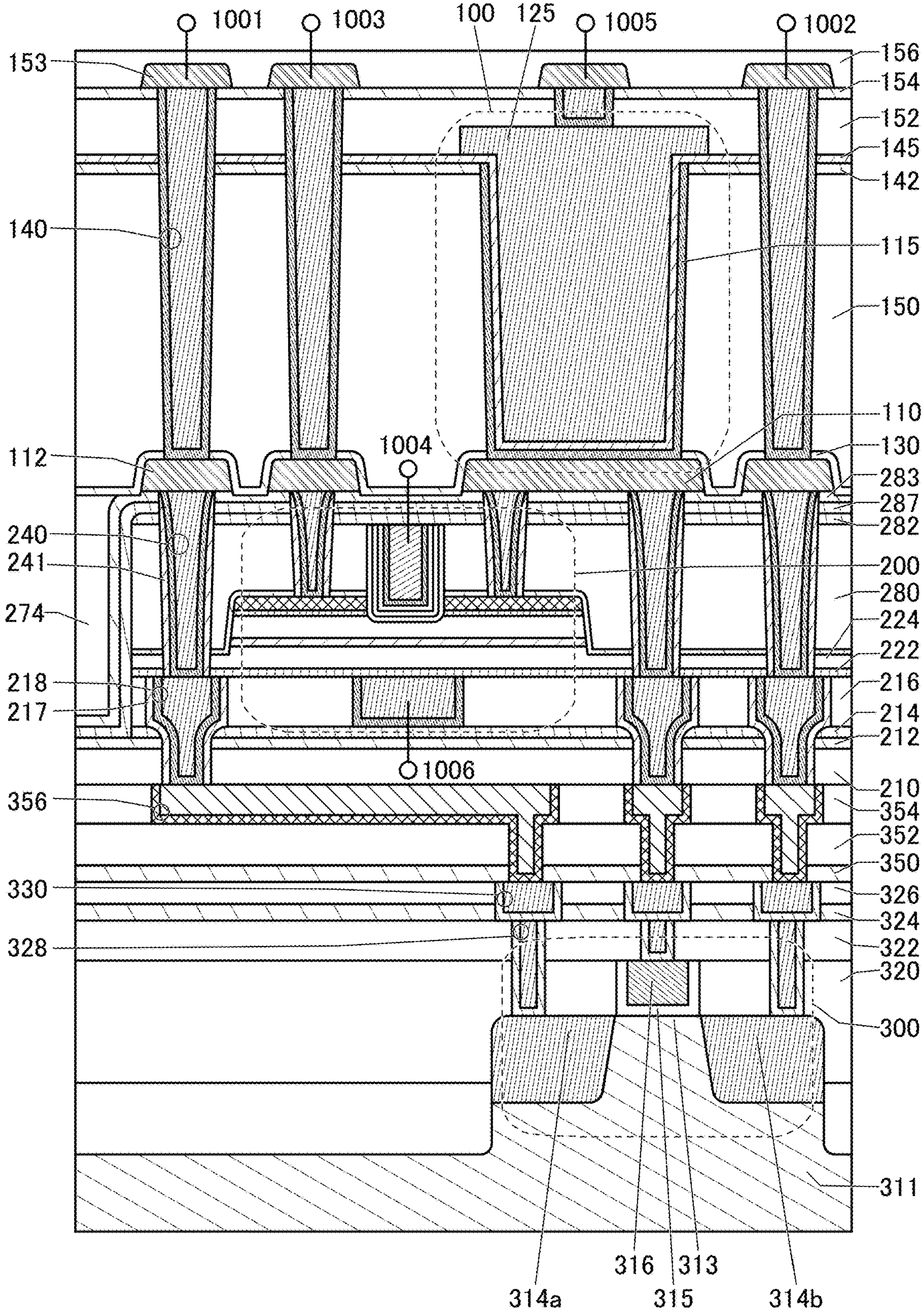
FIG. 21 is a cross-sectional view showing a structure of a storage device.

The capacitor 100 shown in FIG. 21 includes a conductor 115, an insulator 145 over the conductor 115 and the insulator 142, and a conductor 125 over the insulator 145. Here, at least parts of the conductor 115, the insulator 145, and the conductor 125 are positioned in the opening.

The conductor 115 functions as a lower electrode of the capacitor 100, the conductor 125 functions as an upper electrode of the capacitor 100, and the insulator 145 functions as a dielectric of the capacitor 100. The capacitor 100 has a structure in which the upper electrode and the lower electrode face each other with the dielectric positioned therebetween on a side surface as well as a bottom surface of the opening in the insulator 150 and the insulator 142; thus, the capacitance per unit area can be increased. Hence, the deeper the opening is, the larger the capacitance of the capacitor 100 can be. Increasing the capacitance per unit area of the capacitor 100 in this manner can promote miniaturization or higher integration of the semiconductor device.

An insulator 152 is provided over the conductor 125 and the insulator 145.

An insulator that can be used as the insulator 280 can be used as the insulator 152. The insulator 142 preferably functions as an etching stopper at the time of forming the opening in the insulator 150 and is formed using an insulator that can be used as the insulator 214.

The shape of the opening formed in the insulator 150 and the insulator 142 when seen from above may be a quadrangular shape, a polygonal shape other than a quadrangular shape, a polygonal shape with rounded corners, or a circular shape including an elliptical shape. Here, the area where the opening and the transistor 200 overlap each other is preferably large in the top view. Such a structure can reduce the area occupied by the semiconductor device including the capacitor 100 and the transistor 200.

The conductor 115 is positioned in contact with the opening formed in the insulator 142 and the insulator 150. A top surface of the conductor 115 is preferably substantially level with a top surface of the insulator 142. A bottom surface of the conductor 115 is in contact with the conductor 110 through an opening in the insulator 130. The conductor 115 is preferably deposited using an ALD method, a CVD method, or the like; for example, a conductor that can be used as the conductor 205 is used.

The insulator 145 is positioned to cover the conductor 115 and the insulator 142. The insulator 145 is preferably deposited using an ALD method or a CVD method, for example. The insulator 145 can be provided as stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 145, an insulating film in which zirconium oxide, aluminum oxide, and zirconium oxide are stacked in this order can be used, for example.

For the insulator 145, a material with high dielectric strength, such as silicon oxynitride, or a high permittivity (high-k) material is preferably used. Alternatively, a stacked-layer structure using a material with high dielectric strength and a high permittivity (high-k) material may be employed.

Examples of a high permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material can ensure sufficient capacitance of the capacitor 100 even when the insulator 145 has a large thickness. When the insulator 145 has a large thickness, leakage current generated between the conductor 115 and the conductor 125 can be suppressed.

Examples of a material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride deposited by an ALD method, silicon oxide deposited by a PEALD method, and silicon nitride deposited by an ALD method are stacked in this order. The use of such an insulator with high dielectric strength can increase the dielectric strength and inhibit electrostatic breakdown of the capacitor 100.

The conductor 125 is positioned to fill the opening formed in the insulator 142 and the insulator 150. The conductor 125 is electrically connected to the wiring 1005 through a conductor 140 and a conductor 153. The conductor 125 is preferably deposited using an ALD method, a CVD method, or the like and is formed using a conductor that can be used as the conductor 205, for example.

The conductor 153 is provided over an insulator 154 and is covered with an insulator 156. The conductor 153 is formed using a conductor that can be used as the conductor 112, and the insulator 156 is formed using an insulator that can be used as the insulator 152. Here, the conductor 153 is in contact with a top surface of the conductor 140 and functions as a terminal of the capacitor 100, the transistor 200, or the transistor 300.

The structure, method, and the like described above in this embodiment can be used in appropriate combination with the structures, the methods, and the like described in the other embodiments, the examples, and the like.

Embodiment 3

In this embodiment, one embodiment of a semiconductor device is described with reference to FIG. 22 to FIG. 25.

[Storage Device 2]

Figure 22:
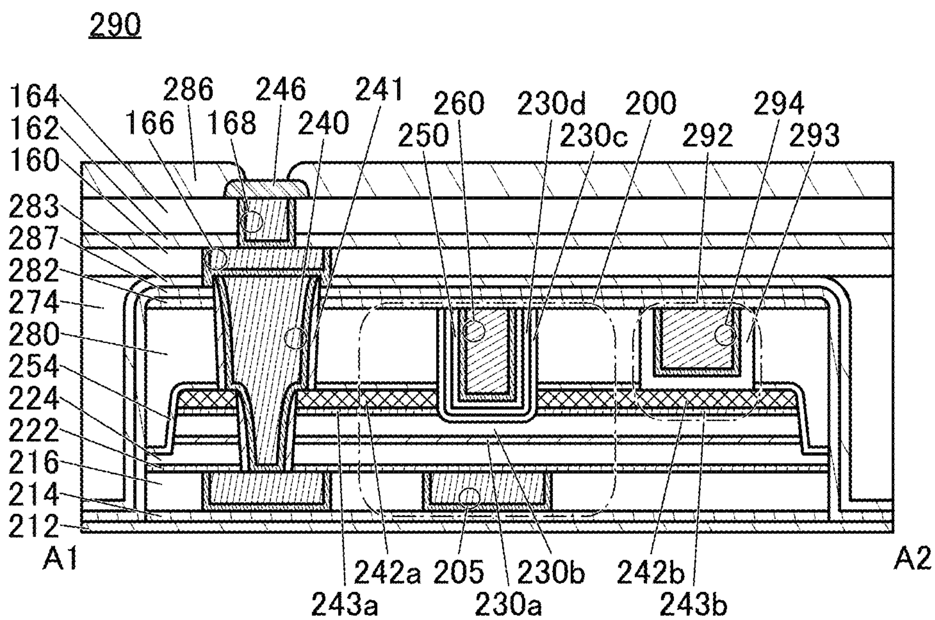
FIG. 22 is a cross-sectional view of a semiconductor device.

FIG. 22 shows an example of a semiconductor device (a storage device) in this embodiment.

<Structure Example of Memory Device>

FIG. 22 is a cross-sectional view of a semiconductor device including a memory device 290. The memory device 290 shown in FIG. 22 includes a capacitor device 292 in addition to the transistor 200 shown in FIG. 4A to FIG. 4D. FIG. 22 corresponds to a cross-sectional view of the transistor 200 in the channel length direction.

Note that in the semiconductor device shown in FIG. 22, components having the same functions as the components included in the semiconductor device described in the above embodiment are denoted by the same reference numerals. Note that also in this section, the materials described in detail in the above embodiment can be used as constituent materials for the components of the semiconductor device.

As shown in FIG. 22, the memory device 290 is preferably sealed with the insulator 283 and the insulator 212. Such a structure can inhibit entry of impurities (particularly hydrogen and water) into the memory device 290. As described in the above embodiment, the insulator 287 may be provided between the memory device 290 and the insulator 283.

The capacitor device 292 includes the conductor 242*b*, an insulator 293 provided over the conductor 242*b*, and a conductor 294 provided over the insulator 293. In other words, the capacitor device 292 forms a MIM (Metal-Insulator-Metal) capacitor. Note that one of a pair of electrodes of the capacitor device 292, i.e., the conductor 242*b*, can double as the source electrode or the drain electrode of the transistor. Thus, the manufacturing process of the capacitor device 292 can also serve as part of the manufacturing process of the transistor; therefore, the productivity of the semiconductor device can be improved. Furthermore, the area where the transistor and the capacitor device are positioned can be reduced.

The conductor 294 can be formed using, for example, a material that can be used for the conductor 240.

The insulator 293 preferably has a stacked-layer structure of zirconium oxide, aluminum oxide, and zirconium oxide, for example. As another example, the insulator 293 is formed using a material usable for the insulator 130 and is preferably provided as stacked layers or a single layer.

A wiring layer may be provided over the memory device 290. For example, as shown in FIG. 22, an insulator 160 functioning as an interlayer film is provided over the transistor 200 and the capacitor device 292. A conductor 166 that is electrically connected to the transistor 200 is embedded in the insulator 283 and the insulator 160. The conductor 166 functions as a plug or a wiring.

A wiring layer may be provided over the insulator 160 and the conductor 166. For example, as shown in FIG. 22, an insulator 162 and an insulator 164 are stacked in this order. A conductor 168 is embedded in the insulator 162 and the insulator 164. The conductor 168 functions as a plug or a wiring.

The insulator 160 and the insulator 164 preferably include an insulator with a low relative permittivity. For example, as the insulator 160 and the insulator 164, an insulator that can be used as the insulator 352 and the like can be used.

As the insulator 162, the insulator having a function of inhibiting the passage of oxygen and impurities such as hydrogen is used. For example, as the insulator 162, an insulator that can be used as the insulator 350 and the like is used.

Figure 23:
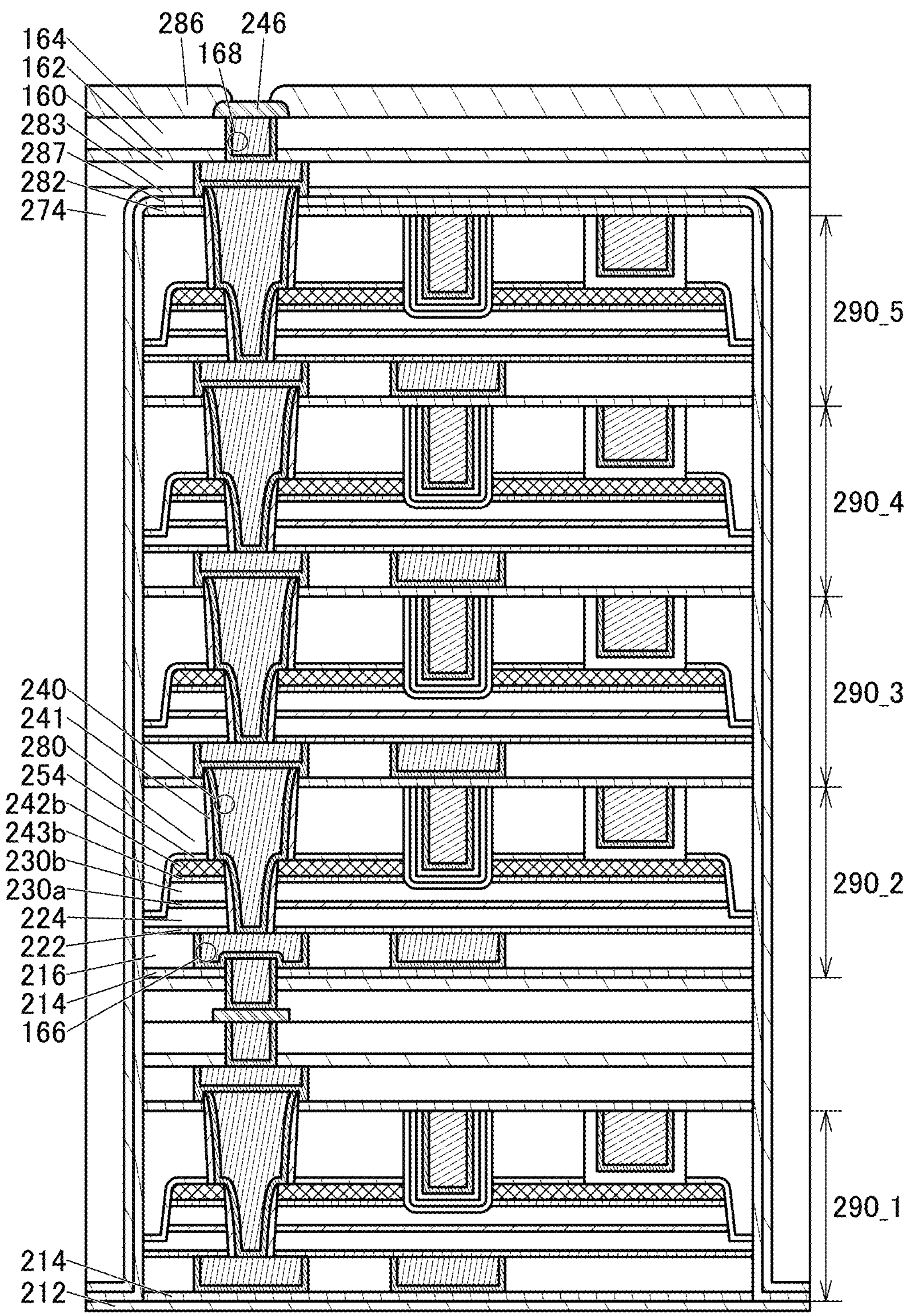
FIG. 23 is a cross-sectional view of a semiconductor device.

Note that the memory devices 290 may be stacked. FIG. 23 is a cross-sectional view of a storage device in which five layers each including the memory device 290 are stacked. As shown in FIG. 23, the memory device 290 is electrically connected to another memory device 290 through the conductor 240 and the conductor 166.

As shown in FIG. 23, a plurality of memory devices (a memory device 290_1 to a memory device 290_5) may be collectively sealed with the insulator 283 and the insulator 212. By collectively sealing the plurality of memory devices, the manufacturing process of the storage device can be simplified. Note that when some of the components of the transistor 200 and some of the components provided around the transistor 200 are deposited by a sputtering method, the hydrogen concentration in the transistor 200 can be reduced. Thus, even when the transistor 200 is formed above another transistor 200, the hydrogen concentration in the transistor 200 at the lower position can be kept low. Consequently, in the case where the memory devices 290 are stacked, the hydrogen concentration in the transistors 200 can be reduced by collectively sealing a plurality of memory devices, instead of by individually sealing the memory devices 290.

Note that the insulator 283 and the insulator 212 may seal all the plurality of memory devices collectively or may seal groups of the memory devices independently.

In the case where the insulator 214 and the insulator 282 are formed using the same material, one of the insulator 214 and the insulator 282 is not necessarily provided. This can reduce the number of steps of manufacturing the storage device.

By stacking the plurality of memory devices (the memory device 290_1 to the memory device 290_5) as shown in FIG. 23, the memory devices can be arranged at a high density without an increase in the area occupied by the memory devices. That is, a 3D memory device can be formed.

Although FIG. 23 shows the structure where each layer includes one memory device, one embodiment of the present invention is not limited thereto. Each layer may include a plurality of memory devices as described previously in <Application examples of semiconductor device>; the plurality of memory devices may be arranged in the channel length direction, in the channel width direction, or in a matrix. Depending on the design, the memory devices may be arranged without regularity.

<Variation Examples of Memory Device>

Examples of semiconductor devices including the transistor 200 and the capacitor device 292 in this embodiment, which are different from the semiconductor device described previously in <Structure example of memory device>, are described below with reference to FIG. 24A, FIG. 24B, and FIG. 25. Note that in the semiconductor devices shown in FIG. 24A, FIG. 24B, and FIG. 25, components having the same functions as the components in the semiconductor devices shown in the above embodiment and FIG. 22 are denoted by the same reference numerals. Note that the materials described in detail in the above embodiment and <Structure example of memory device> can be used as constituent materials for the transistor 200 and the capacitor device 292 in this section.

«Variation Example 1 of Memory Device»

An example of a semiconductor device including a memory device 600 is described below with reference to FIG. 24A and FIG. 24B. The memory device 600 includes a transistor 200*a*, a transistor 200*b*, a capacitor device 292*a*, and a capacitor device 292*b*.

Figure 24A:
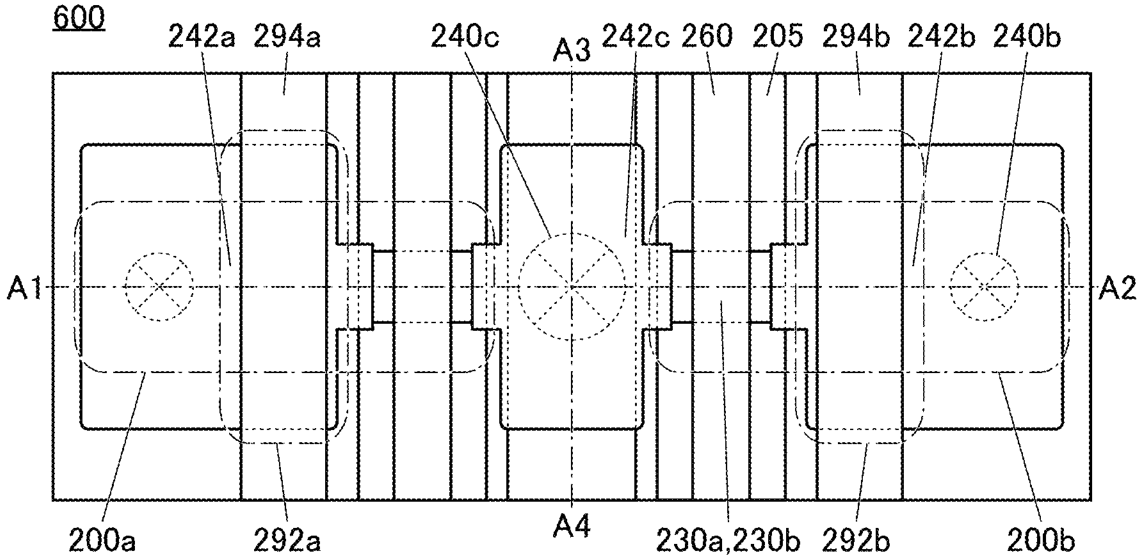
FIG. 24A is a top view of a semiconductor device.

FIG. 24A is a top view of the semiconductor device including the memory device 600. FIG. 24B is a cross-sectional view of a portion indicated by the dashed-dotted line A1-A2 in FIG. 24A and is also a cross-sectional view of the transistor 200*a* and the transistor 200*b* in the channel length direction. Note that for clarity of the drawing, some components are not shown in the top view of FIG. 24A.

Figure 24B:
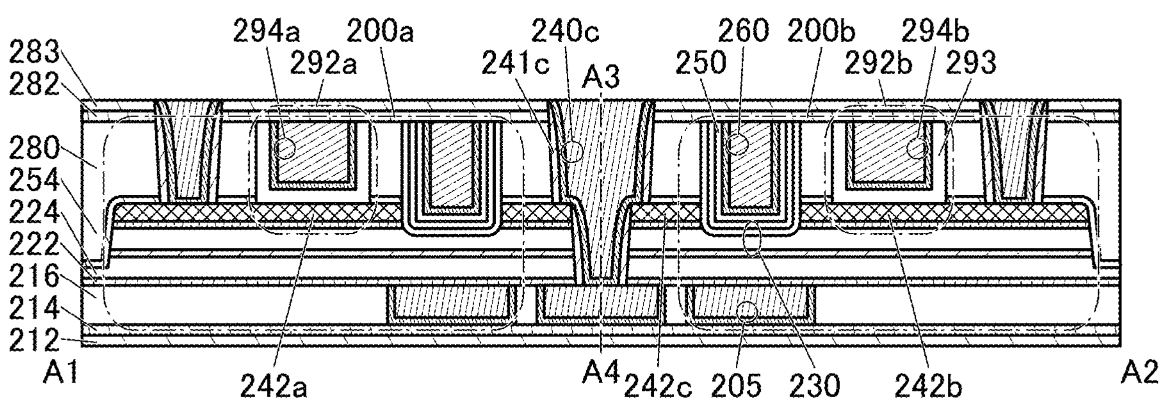
FIG. 24B is a cross-sectional view of the semiconductor device.

The memory device 600 has a line-symmetric structure with respect to the dashed-dotted line A3-A4 as shown in FIG. 24B. A conductor 242*c* serves as one of a source electrode and a drain electrode of the transistor 200*a* and one of a source electrode and a drain electrode of the transistor 200*b*. A conductor 240*c* serves as a conductor that is electrically connected to the transistor 200*a* and functions as a plug, and a conductor that is electrically connected to the transistor 200*b* and functions as a plug. An insulator 241*c* is provided in contact with a side surface of the conductor 240*c*.

When the connection of the two transistors, the two capacitor devices, the wirings, and the plugs has the above-described structure, a semiconductor device that can be miniaturized or highly integrated can be provided.

The structure examples of the semiconductor devices shown in FIG. 4A to FIG. 4D and FIG. 22 can be referred to for the structures and the effects of the transistor 200*a*, the transistor 200*b*, the capacitor device 292*a*, and the capacitor device 292*b*.

«Variation Example 2 of Memory Device»

Figure 25:
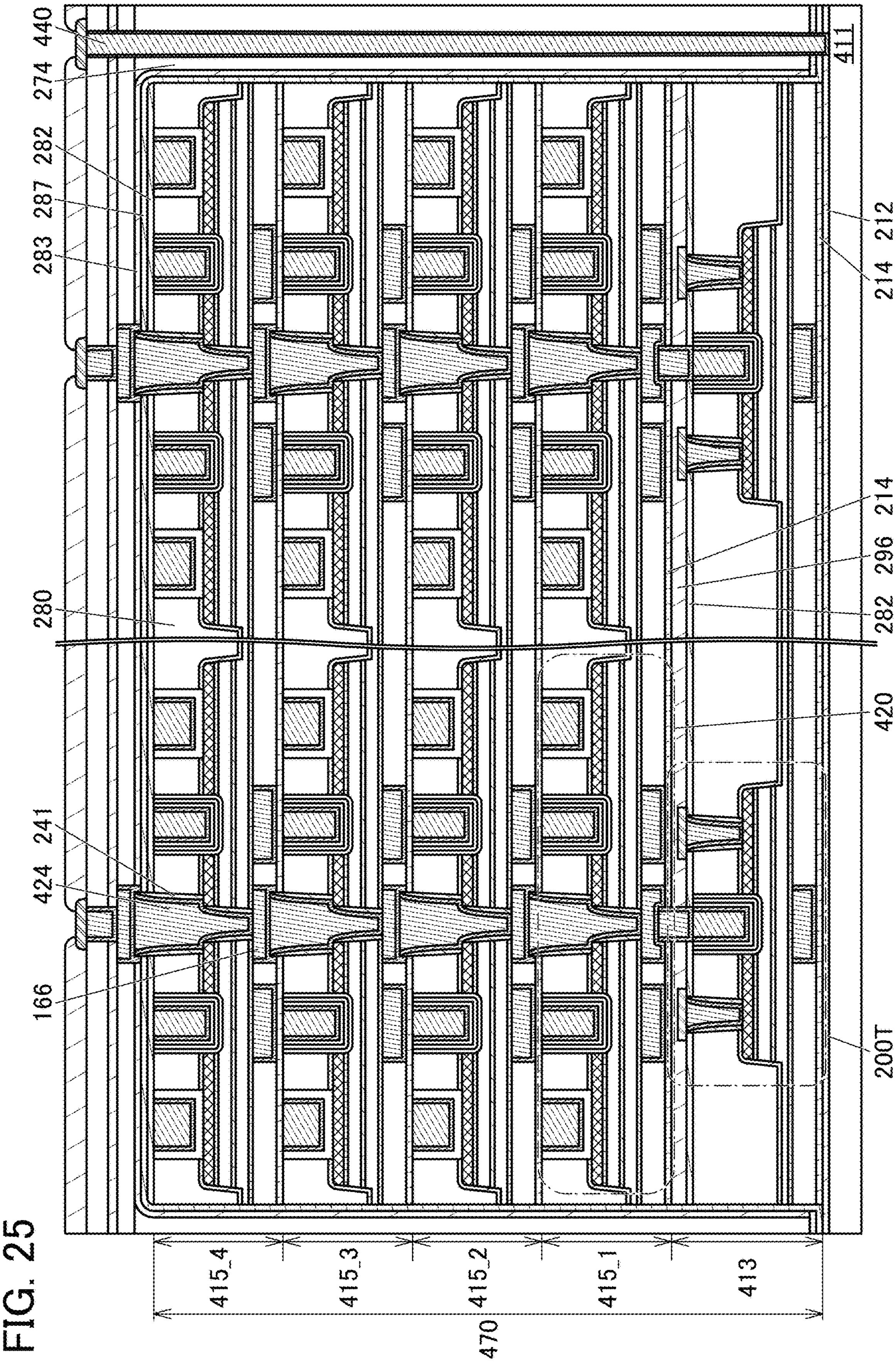
FIG. 25 is a cross-sectional view of a semiconductor device.

FIG. 25 shows an example in which a memory unit 470 includes a transistor layer 413 including a transistor 200T and four memory device layers 415 (a memory device layer 415_1 to a memory device layer 415_4).

The memory device layer 415_1 to the memory device layer 415_4 each include a plurality of memory devices 420. As the memory device 420, the memory device 290 shown in FIG. 22 or the memory device 600 shown in FIG. 24A and FIG. 24B can be used, for example.

The memory device 420 is electrically connected to the memory device 420 included in another memory device layer 415 and to the transistor 200T included in the transistor layer 413 through a conductor 424 and the conductor 166.

The memory unit 470 is sealed with the insulator 212, the insulator 214, the insulator 282, and the insulator 283 (such a structure is hereinafter referred to as a sealing structure for convenience). The insulator 274 is provided in the periphery of the insulator 283. A conductor 440 is provided in the insulator 274, the insulator 283, and the insulator 212, and is electrically connected to an element layer 411. Note that the insulator 287 may be provided between the memory unit 470 and the insulator 283.

The insulator 212 and the insulator 283 are preferably a material having a function of a high blocking property against hydrogen. The insulator 214 and the insulator 282 are preferably a material having a function of trapping or fixing hydrogen.

Examples of the material having a function of a high blocking property against hydrogen include silicon nitride and silicon nitride oxide. Examples of the material having a function of trapping or fixing hydrogen include aluminum oxide, hafnium oxide, and an oxide containing aluminum and hafnium (hafnium aluminate).

There is no particular limitation on the crystal structure of materials used for the insulator 212, the insulator 214, the insulator 282, and the insulator 283; the materials can have an amorphous or crystalline structure. For example, it is preferable to use an amorphous aluminum oxide film for the material having a function of trapping or fixing hydrogen. Amorphous aluminum oxide may trap and fix hydrogen more than aluminum oxide with high crystallinity.

The insulator 282 and the insulator 214 are preferably provided between the transistor layer 413 and the memory device layer 415_1 or between the memory device layers 415. An insulator 296 is preferably provided between the insulator 282 and the insulator 214. A material similar to that for the insulator 283 can be used for the insulator 296. Alternatively, silicon oxide or silicon oxynitride can be used. Alternatively, a known insulating material may be used.

The insulator 280 is provided inside the sealing structure. The insulator 280 has a function of releasing oxygen by heating. Alternatively, the insulator 280 includes an excess-oxygen region.

Here, as the model of excess oxygen in the insulator 280 with respect to diffusion of hydrogen from an oxide semiconductor in contact with the insulator 280, the following model can be given.

Hydrogen in the oxide semiconductor diffuses into other components through the insulator 280 in contact with the oxide semiconductor. The hydrogen forms an OH bond with excess oxygen in the insulator 280 and diffuses in the insulator 280 as OH. When reaching a material having a function of trapping or fixing hydrogen (typically, the insulator 282), the hydrogen atom having the OH bond reacts with an oxygen atom bonded to an atom (e.g., a metal atom) in the insulator 282 and is trapped or fixed in the insulator 282. Meanwhile, the excess oxygen having the OH bond probably remains as excess oxygen in the insulator 280. That is, it is highly probable that the excess oxygen in the insulator 280 serves as a bridge in the diffusion of the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed. Specifically, the heat treatment is performed at 350° C. or higher, preferably 400° C. or higher in an atmosphere containing oxygen, an atmosphere containing nitrogen, or a mixed atmosphere of oxygen and nitrogen. The heat treatment is performed for 1 hour or longer, preferably 4 hours or longer, further preferably 8 hours or longer.

The heat treatment enables diffusion of hydrogen from the oxide semiconductor to the outside through the insulator 280 and the insulator 282. That is, the absolute amount of hydrogen in and near the oxide semiconductor can be reduced.

The insulator 283 is formed after the heat treatment. The insulator 283 is a material having a function of a high blocking property against hydrogen, and thus can inhibit entry of hydrogen that has been diffused outward or external hydrogen into the inside, specifically, to the oxide semiconductor side or the insulator 280 side.

An example of a process in which the heat treatment is performed after the insulator 282 is formed is shown; however, one embodiment of the present invention is not limited thereto. For example, the heat treatment may be performed after the formation of the transistor layer 413 or after the formation of the memory device layer 415_1 to the memory device layer 415_3. When hydrogen is diffused outward by the heat treatment, hydrogen is diffused in the upward direction or the lateral direction of the transistor layer 413. Similarly, in the case where heat treatment is performed after the formation of the memory device layer 415_1 to the memory device layer 415_3, hydrogen is diffused in the upward direction or the lateral direction.

With the above manufacturing process, the sealing structure mentioned above can be formed by bonding the insulator 212 and the insulator 283.

According to the above, a highly reliable semiconductor device and a manufacturing method thereof can be provided. Moreover, according to one embodiment of the present invention, a semiconductor device with favorable electrical characteristics and a manufacturing method thereof can be provided.

The composition, structure, method, and the like described in this embodiment can be used in combination as appropriate with the compositions, structures, methods, and the like described in the other embodiments, the examples, and the like.

Embodiment 4

In this embodiment, a storage device of one embodiment of the present invention including a transistor in which an oxide is used for a semiconductor (hereinafter sometimes referred to as an OS transistor) and a capacitor (hereinafter sometimes referred to as an OS memory device) is described with reference to FIG. 26A, FIG. 26B, and FIG. 27A to FIG. 27H. The OS memory device is a storage device including at least a capacitor and an OS transistor that controls the charging and discharging of the capacitor. Since the OS transistor has an extremely low off-state current, the OS memory device has excellent retention characteristics and can function as a nonvolatile memory.

<Configuration Example of Storage Device>

Figure 26A:
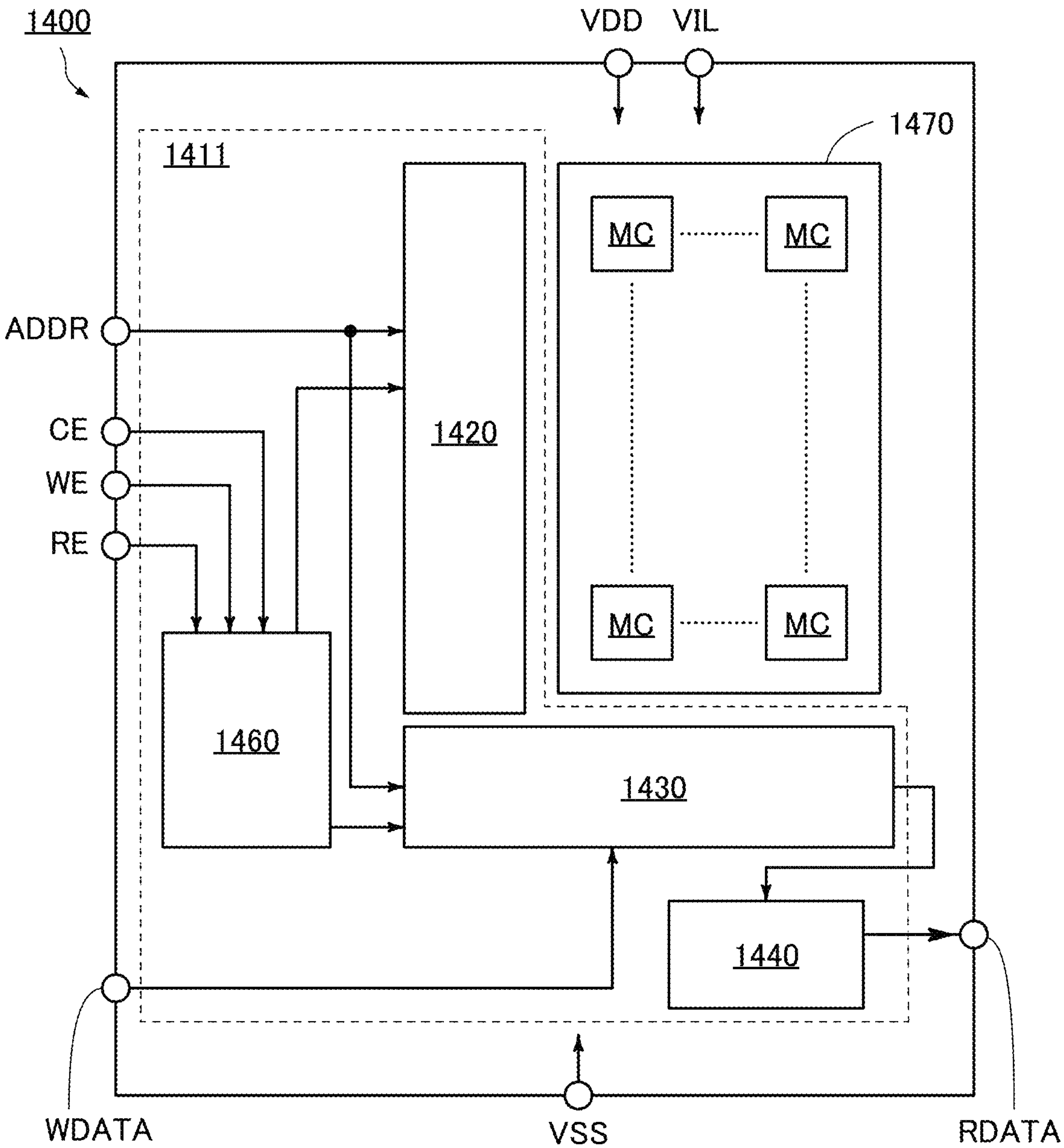
FIG. 26A is a block diagram showing a configuration example of a storage device.

FIG. 26A shows an example of the configuration of an OS memory device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes a column decoder, a precharge circuit, a sense amplifier, and a write circuit, for example. The precharge circuit has a function of precharging wirings. The sense amplifier has a function of amplifying a data signal read from a memory cell. Note that the wirings are connected to memory cells included in the memory cell array 1470 and will be described later in detail. The amplified data signal is output as a data signal RDATA to the outside of the storage device 1400 through the output circuit 1440. The row circuit 1420 includes a row decoder and a word line driver circuit, for example, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 to the row circuit 1420 depends on the configuration of the memory cell MC, the number of memory cells MC in one column, and the like. The number of wirings that connect the memory cell array 1470 to the column circuit 1430 depends on the configuration of the memory cell MC, the number of memory cells MC in one row, and the like.

Figure 26B:
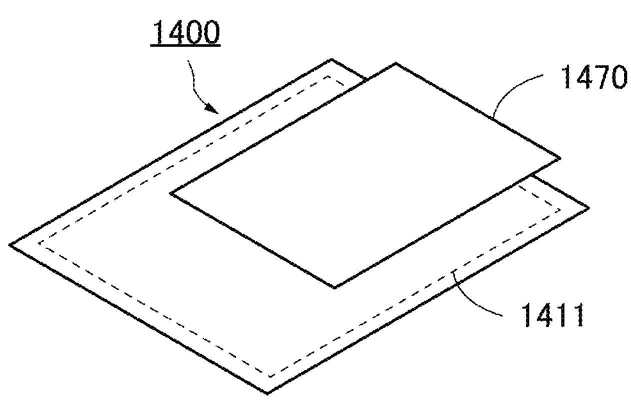
FIG. 26B is a schematic view showing a configuration example of a storage device.

Note that FIG. 26A shows an example in which the peripheral circuit 1411 and the memory cell array 1470 are formed on the same plane; however, this embodiment is not limited thereto. For example, as shown in FIG. 26B, the memory cell array 1470 may be provided to overlap part of the peripheral circuit 1411. For example, the sense amplifier may be provided below the memory cell array 1470 so that they overlap each other.

FIG. 27A to FIG. 27H illustrate configuration examples of a memory cell that can be applied to the memory cell MC.

[DOSRAM]

Figure 27A:
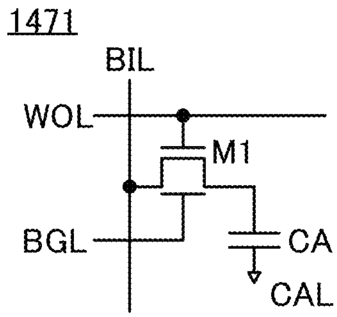
FIG. 27A to FIG. 27H are circuit diagrams each showing a configuration example of a storage device.
Figure 27B:
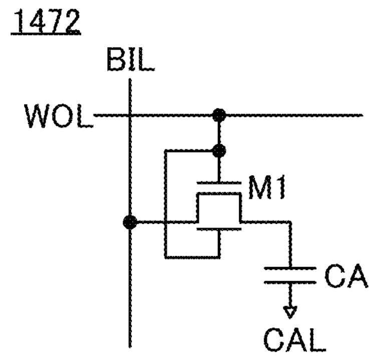
Figure 27C:
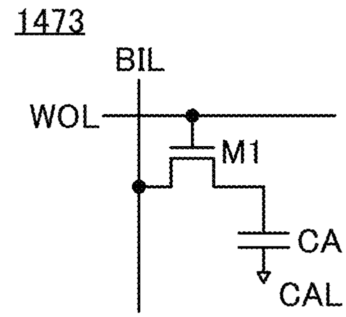

FIG. 27A to FIG. 27C show circuit configuration examples of DRAM memory cells. In this specification and the like, a DRAM using a memory cell including one OS transistor and one capacitor is referred to as a DOSRAM (Dynamic Oxide Semiconductor Random Access Memory) in some cases. A memory cell 1471 shown in FIG. 27A includes a transistor M1 and a capacitor CA. Note that the transistor M1 includes a gate (sometimes referred to as a top gate) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. At the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 shown in FIG. 27A corresponds to the storage device shown in FIG. 22. That is, the transistor M1 and the capacitor CA correspond to the transistor 200 and the capacitor device 292, respectively.

The memory cell MC is not limited to the memory cell 1471, and the circuit configuration can be changed. For example, as in a memory cell 1472 shown in FIG. 27B, the back gate of the transistor M1 may be connected not to the wiring BGL but to the wiring WOL in the memory cell MC. As another example of the memory cell MC, the transistor M1 may be a single-gate transistor, that is, a transistor without a back gate, as in a memory cell 1473 shown in FIG. 27C.

In the case where the semiconductor device described in the above embodiment is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be reduced. Alternatively, refresh operation for the memory cell can be omitted. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap each other as described above, the bit line can be shortened. This reduces bit line capacitance, which can reduce the storage capacitance of the memory cell.

[NOSRAM]

FIG. 27D to FIG. 27G show circuit configuration examples of gain-cell memory cells each including two transistors and one capacitor. A memory cell 1474 shown in FIG. 27D includes a transistor M2, a transistor M3, and a capacitor CB. Note that the transistor M2 includes a top gate (simply referred to as a gate in some cases) and a back gate. In this specification and the like, a storage device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB, a second terminal of the transistor M2 is connected to a wiring WBL, the gate of the transistor M2 is connected to the wiring WOL, and the back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 27D:
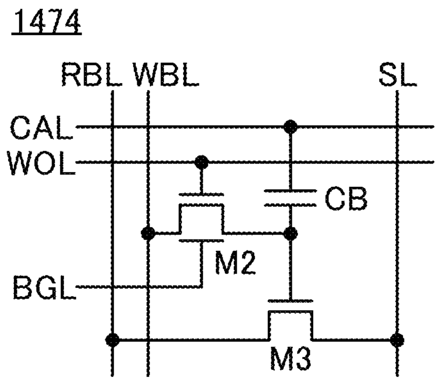
Figure 27E:
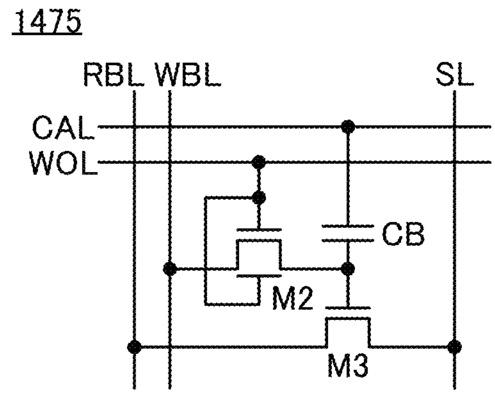
Figure 27F:
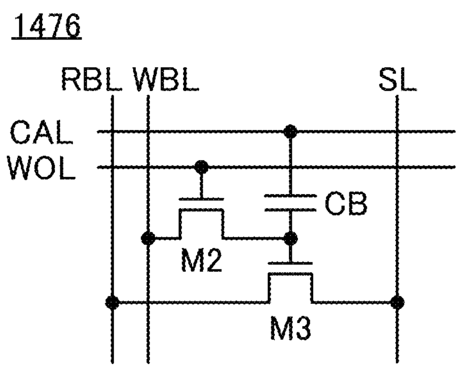
Figure 27G:
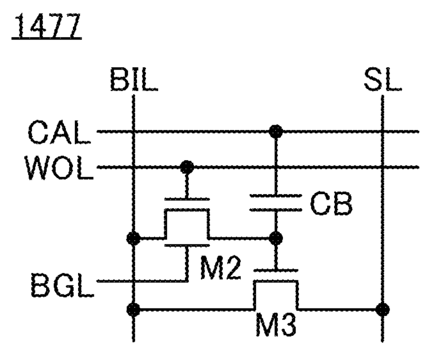

Here, the memory cell 1474 shown in FIG. 27D corresponds to the storage device shown in FIG. 20. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

The memory cell MC is not limited to the memory cell 1474, and the circuit configuration can be changed as appropriate. For example, as in a memory cell 1475 shown in FIG. 27E, the back gate of the transistor M2 may be connected not to the wiring BGL but to the wiring WOL in the memory cell MC. As another example of the memory cell MC, the transistor M2 may be a single-gate transistor, that is, a transistor without a back gate, as in a memory cell 1476 shown in FIG. 27F. As another example, the memory cell MC may have a configuration in which the wiring WBL and the wiring RBL are combined into one wiring BIL as in a memory cell 1477 shown in FIG. 27G.

In the case where the semiconductor device described in the above embodiment is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the transistor M2; thus, the frequency of the refresh operation for the memory cell can be reduced. Alternatively, refresh operation for the memory cell can be omitted. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the storage device can be achieved.

Alternatively, the transistor M3 may be an OS transistor. When OS transistors are used as the transistor M2 and the transistor M3, the circuit of the memory cell array 1470 can be formed using only n-channel transistors.

Figure 27H:
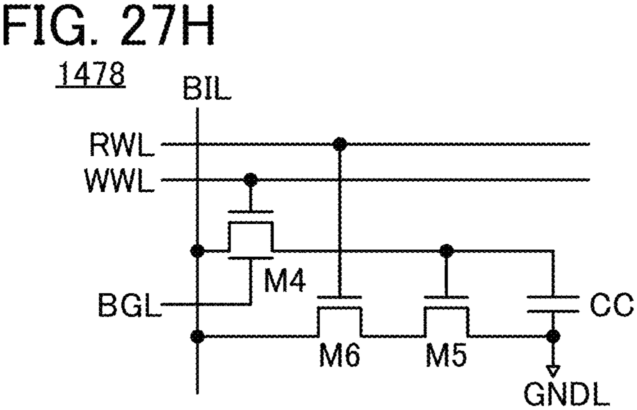

FIG. 27H shows an example of a gain-cell memory cell including three transistors and one capacitor. A memory cell 1478 shown in FIG. 27H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors. In that case, the circuit of the memory cell array 1470 can be formed using only n-channel transistors.

In the case where the semiconductor device described in the above embodiment is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the configurations of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

Figure 28:
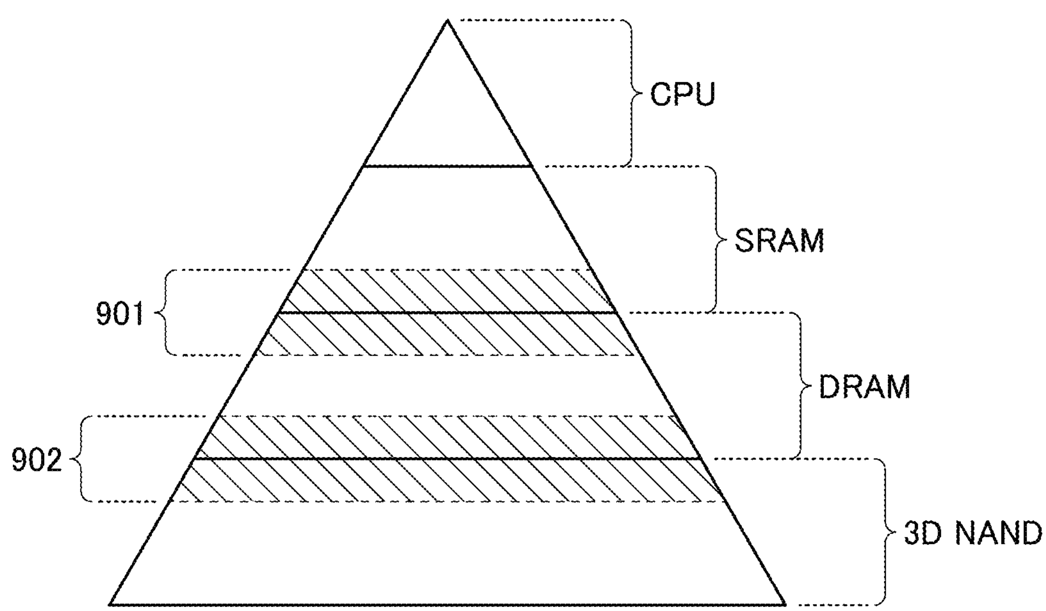
FIG. 28 is a diagram showing a hierarchy of a variety of storage devices.

In general, a variety of storage devices (memories) are used in semiconductor devices such as computers in accordance with the intended use. FIG. 28 shows a hierarchy of various storage devices. The storage devices at the upper levels require a higher access speed, and the storage devices at the lower levels require a larger memory capacity and a higher memory density. In FIG. 28, sequentially from the top level, a memory included as a register in an arithmetic processing device such as a CPU, an SRAM (Static Random Access Memory), a DRAM (Dynamic Random Access Memory), and a 3D NAND memory are shown.

A memory included as a register in an arithmetic processing device such as a CPU is used for temporary storage of arithmetic operation results, for example, and thus is very frequently accessed by the arithmetic processing device. Accordingly, a high operating speed is required rather than memory capacity. The register also has a function of retaining setting information of the arithmetic processing device, for example.

An SRAM is used for a cache, for example. The cache has a function of retaining a copy of part of data retained in a main memory. By copying data that is frequently used and holding the copy of the data in the cache, the access speed to the data can be increased.

A DRAM is used for the main memory, for example. The main memory has a function of retaining a program or data that is read from a storage. The memory density of a DRAM is approximately 0.1 to 0.3 Gbit/$mm^2$.

A 3D NAND memory is used for a storage, for example. The storage has a function of retaining data that needs to be retained for a long time and various programs used in an arithmetic processing device, for example. Therefore, the storage needs to have a large memory capacity and a high memory density rather than operating speed. The memory density of a storage device used for a storage is approximately 0.6 to 6.0 Gbit/$mm^2$.

The storage device of one embodiment of the present invention operates fast and can retain data for a long time. The storage device of one embodiment of the present invention can be favorably used as a storage device in a boundary region 901 including both the level in which the cache is placed and the level in which the main memory is placed. Moreover, the storage device of one embodiment of the present invention can be favorably used as a storage device in a boundary region 902 including both the level in which the main memory is placed and the level in which the storage is placed.

The structure described in this embodiment can be used in appropriate combination with the structures described in the other embodiments, the examples, and the like.

Embodiment 5

In this embodiment, an example of a chip 1200 on which the semiconductor device of the present invention is mounted is described with reference to FIG. 29A and FIG. 29B. A plurality of circuits (systems) are mounted on the chip 1200. A technique for integrating a plurality of circuits (systems) into one chip is referred to as system on chip (SoC) in some cases.

Figure 29A:
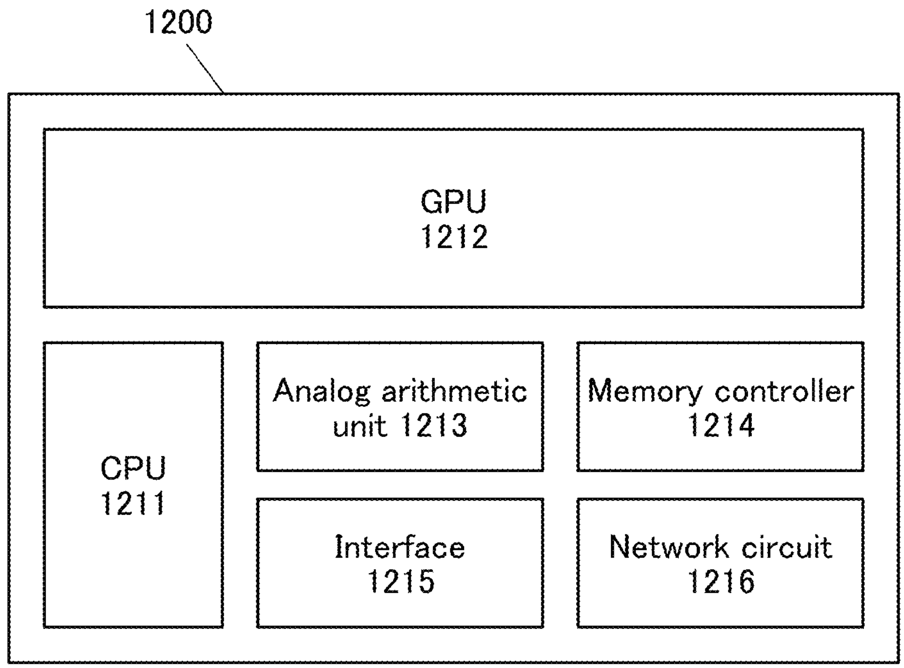
FIG. 29A is a block diagram of a semiconductor device.

As shown in FIG. 29A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 29B:
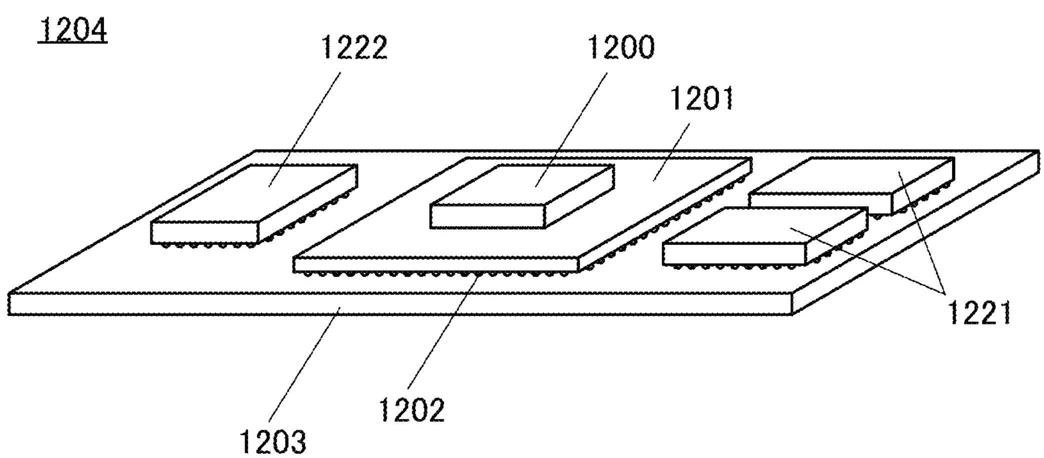
FIG. 29B is a schematic view of a semiconductor device.

A bump (not shown) is provided on the chip 1200 and is connected to a first surface of a printed circuit board (PCB) 1201 as shown in FIG. 29B. A plurality of bumps 1202 are provided on the rear side of the first surface of the PCB 1201, and the PCB 1201 is connected to a motherboard 1203.

Storage devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. The GPU 1212 preferably includes a plurality of GPU cores. The CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing and product-sum operation. When an image processing circuit and a product-sum operation circuit that use an oxide semiconductor of the present invention are provided in the GPU 1212, image processing and product-sum operation can be performed with low power consumption.

Since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at a high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a gaming controller. As such an interface, a USB (Universal Serial Bus), an HDMI (registered trademark) (High-Definition Multimedia Interface), or the like can be used.

The network circuit 1216 includes a circuit for a network such as a LAN (Local Area Network). The network circuit 1216 may also include a circuit for network security.

The circuits (systems) can be formed in the chip 1200 through the same manufacturing process. Therefore, even when the number of circuits needed for the chip 1200 increases, there is no need to increase the number of manufacturing processes; thus, the chip 1200 can be fabricated at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in appropriate combination with the structures described in the other embodiments, examples, and the like.

Embodiment 6

This embodiment will show examples of electronic components and an electronic device that include the storage device of the above embodiment and the like.

<Electronic Components>

First, examples of electronic components in which a storage device 720 is incorporated are described with reference to FIG. 30A and FIG. 30B.

Figure 30A:
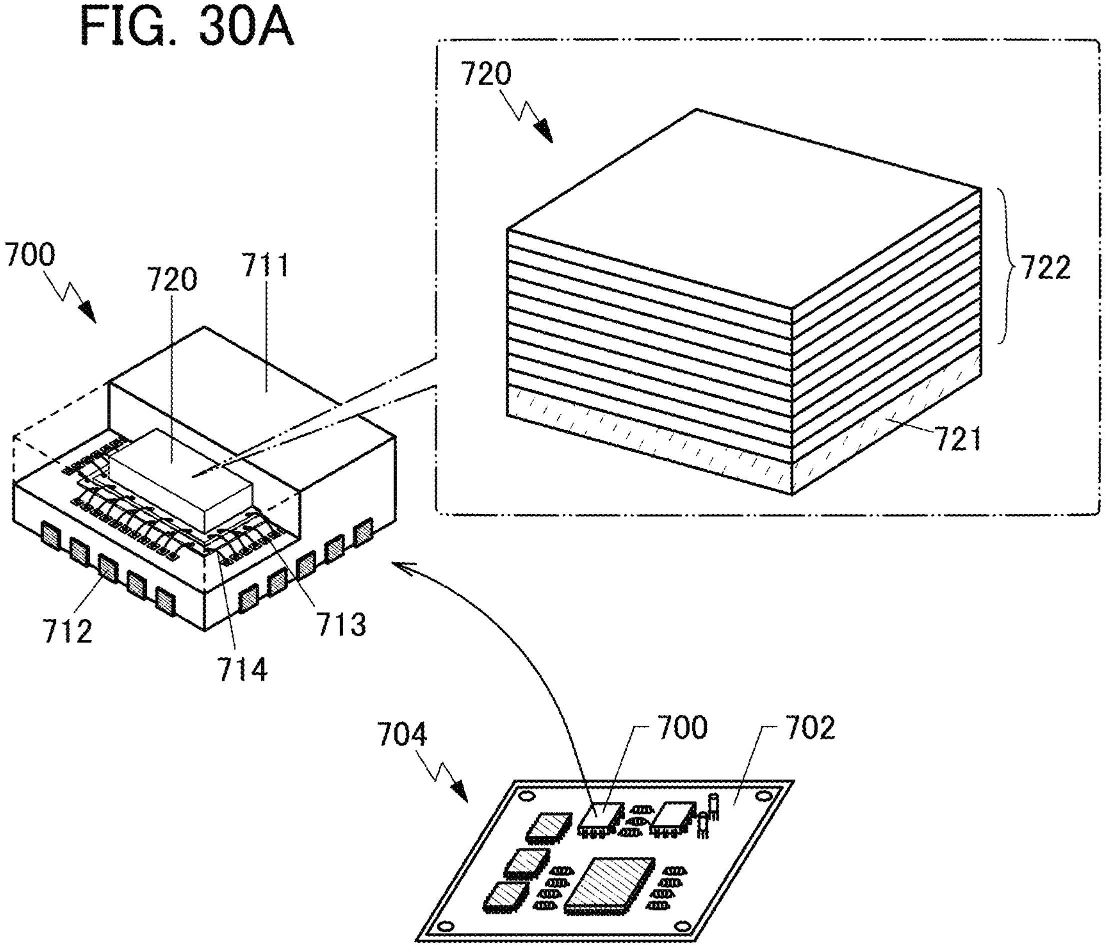
FIG. 30A and FIG. 30B are diagrams illustrating examples of electronic components.

FIG. 30A is a perspective view of an electronic component 700 and a substrate (a circuit board 704) on which the electronic component 700 is mounted. The electronic component 700 shown in FIG. 30A includes the storage device 720 in a mold 711. FIG. 30A omits part of the electronic component to show the inside of the electronic component 700. The electronic component 700 includes a land 712 outside the mold 711. The land 712 is electrically connected to an electrode pad 713, and the electrode pad 713 is electrically connected to the storage device 720 with a wire 714. The electronic component 700 is mounted on a printed circuit board 702, for example. A plurality of such electronic components are combined and electrically connected to each other on the printed circuit board 702, which forms the circuit substrate 704.

The storage device 720 includes a driver circuit layer 721 and a storage circuit layer 722.

Figure 30B:
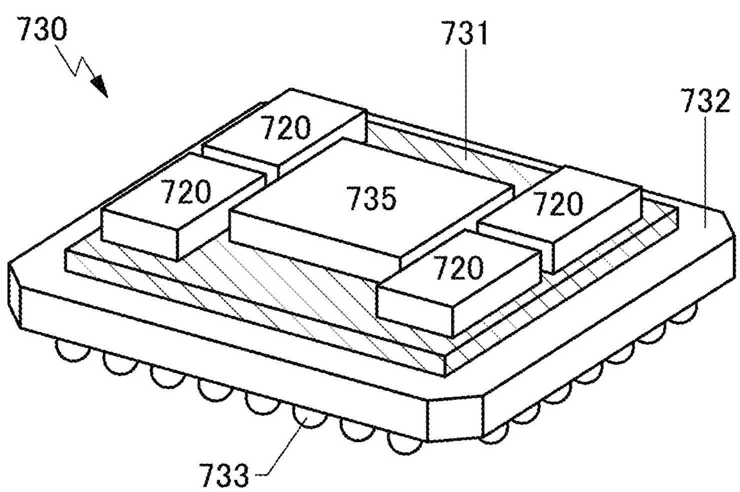

FIG. 30B is a perspective view of an electronic component 730. The electronic component 730 is an example of a SiP (System in package) or an MCM (Multi Chip Module). In the electronic component 730, an interposer 731 is provided over a package substrate 732 (a printed circuit board), and a semiconductor device 735 and a plurality of storage devices 720 are provided over the interposer 731.

The electronic component 730 using the storage device 720 as a high bandwidth memory (HBM) is shown as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. The interposer 731 has a function of electrically connecting an integrated circuit provided over the interposer 731 to an electrode provided over the package substrate 732. Accordingly, the interposer is sometimes referred to as a redistribution substrate or an intermediate substrate. A through electrode may be provided in the interposer 731 to be used for electrically connecting the integrated circuit and the package substrate 732. In the case of using a silicon interposer, a TSV (Through Silicon Via) can also be used as the through electrode.

A silicon interposer is preferably used as the interposer 731. The silicon interposer can be manufactured at lower cost than an integrated circuit because the silicon interposer is not necessarily provided with an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In an SiP, an MCM, or the like using a silicon interposer, a decrease in reliability due to a difference in the coefficient of expansion between an integrated circuit and the interposer is unlikely to occur. Furthermore, a surface of a silicon interposer has high planarity; hence, a poor connection between the silicon interposer and an integrated circuit provided on the silicon interposer is unlikely to occur. It is particularly preferable to use a silicon interposer for a 2.5D package (2.5-dimensional mounting) in which a plurality of integrated circuits are arranged side by side on the interposer.

A heat sink (a radiator plate) may be provided to overlap the electronic component 730. In the case of providing a heat sink, the heights of integrated circuits provided on the interposer 731 are preferably equal to each other. In the electronic component 730 of this embodiment, the heights of the storage device 720 and the semiconductor device 735 are preferably equal to each other, for example.

An electrode 733 may be provided on the bottom portion of the package substrate 732 to mount the electronic component 730 on another substrate. FIG. 30B shows an example in which the electrode 733 is formed of a solder ball. Solder balls are provided in a matrix on the bottom portion of the package substrate 732, whereby BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods, not limited to the BGA and the PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be implemented in appropriate combination with the structures described in the other embodiments, examples, and the like.

Embodiment 7

In this embodiment, application examples of storage devices using the semiconductor device described in the above embodiment are described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives). FIG. 31A to FIG. 31E schematically show some structure examples of removable storage devices. The semiconductor device described in the above embodiment is processed into a packaged memory chip and used in a variety of storage units and removable memories, for example.

Figure 31A:
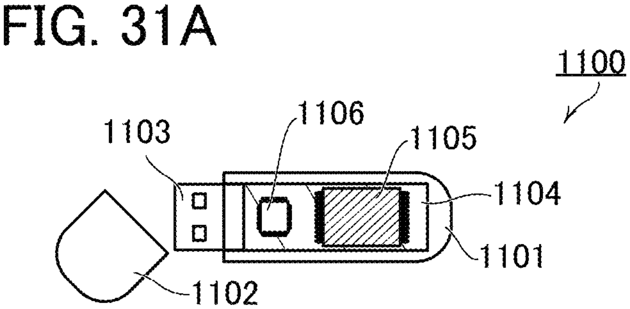
FIG. 31A to FIG. 31E are schematic views of storage devices.

FIG. 31A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

Figure 31B:
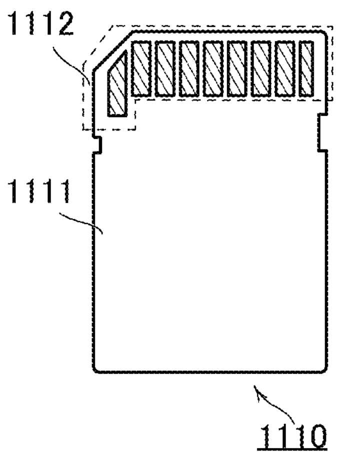
Figure 31C:
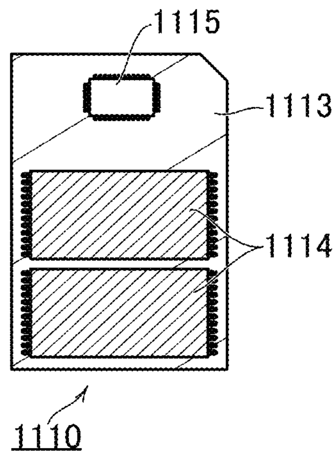

FIG. 31B is a schematic external view of an SD card, and FIG. 31C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. In that case, data can be read from and written to the memory chip 1114 through radio communication between a host device and the SD card 1110. The semiconductor device described in the above embodiment can be incorporated in the memory chip 1114 or the like.

Figure 31D:
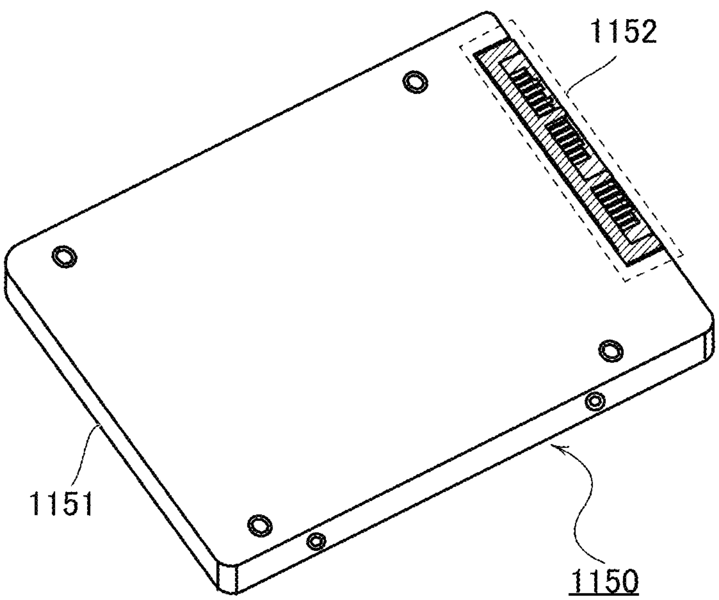
Figure 31E:
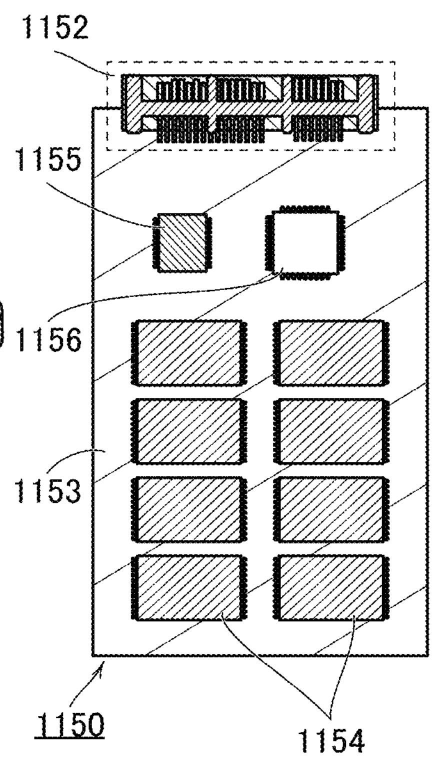

FIG. 31D is a schematic external view of an SSD, and FIG. 31E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

This embodiment can be implemented in appropriate combination with the structures described in the other embodiments, examples, and the like.

Embodiment 8

The semiconductor device of one embodiment of the present invention can be used in a processor such as a CPU and a GPU or a chip. FIG. 32A to FIG. 32H show specific examples of electronic devices including a chip or a processor such as a CPU or a GPU of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, when the GPU or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium. FIG. 32A to FIG. 32H show examples of electronic devices.

[Information Terminal]

Figure 32A:
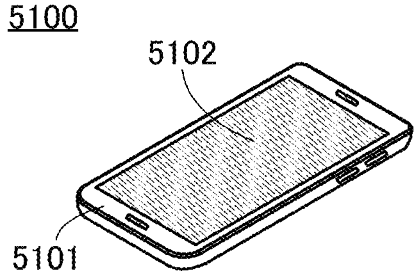
FIG. 32A to FIG. 32H are diagrams showing electronic devices.

FIG. 32A illustrates a mobile phone (a smartphone), which is a type of information terminal. An information terminal 5100 includes a housing 5101 and a display portion 5102. As input interfaces, a touch panel is provided in the display portion 5102, and a button is provided in the housing 5101.

When the chip of one embodiment of the present invention is used in the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 32B:
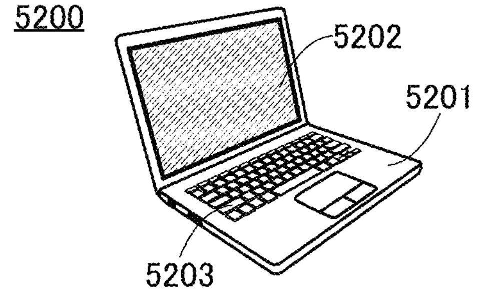

FIG. 32B illustrates a notebook information terminal 5200. The notebook information terminal 5200 includes a main body 5201 of the information terminal, a display portion 5202, and a keyboard 5203.

Like the information terminal 5100 described above, when the chip of one embodiment of the present invention is used in the notebook information terminal 5200, the notebook information terminal 5200 can execute an application utilizing artificial intelligence. Examples of the application utilizing artificial intelligence include design-support software, text correction software, and software for automatic menu generation. Furthermore, with the use of the notebook information terminal 5200, novel artificial intelligence can be developed.

Note that although FIG. 32A and FIG. 32B show a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 32C:
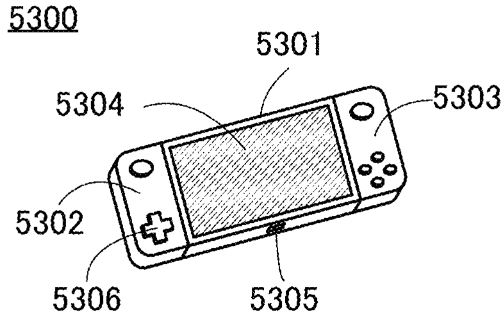

FIG. 32C shows a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into a chip provided on a substrate in the housing 5301, the housing 5302 and the housing 5303, for example.

Figure 32D:
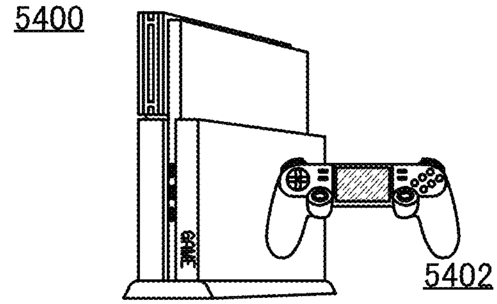

FIG. 32D shows a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is used in the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, questions posed by the player, the progress of the game, timing when an event occurs in the game, the actions and words of the game characters, and the like can be changed for various expressions without being limited by the game program.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 32C and FIG. 32D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 32E:
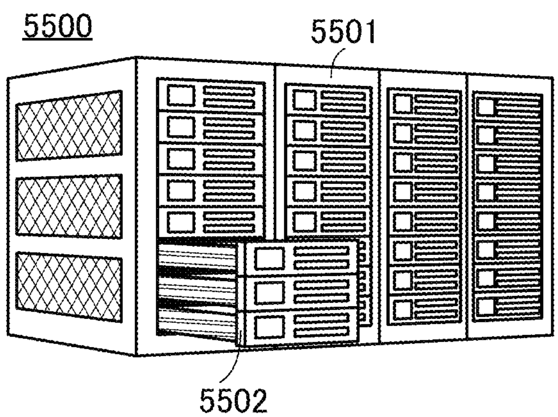
Figure 32F:
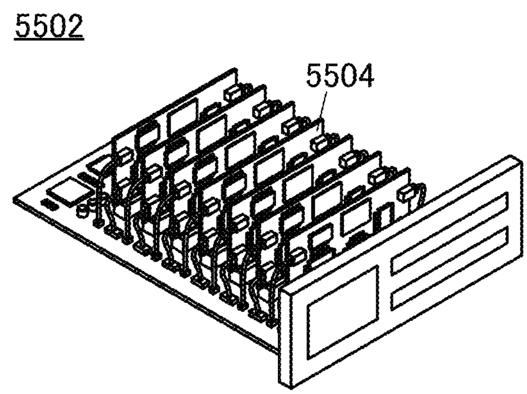

FIG. 32E shows a supercomputer 5500 as an example of a large computer. FIG. 32F shows a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip described in the above embodiment can be mounted.

The supercomputer 5500 is a large computer mainly used for scientific computation. In scientific computation, an enormous amount of arithmetic operation needs to be processed at a high speed; hence, power consumption is high and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is shown as an example of a large computer in FIG. 32E and FIG. 32F, a large computer using the GPU or the chip of one embodiment of the present invention is not limited thereto. Examples of a large computer using the GPU or the chip of one embodiment of the present invention include a computer that provides service (a server) and a large general-purpose computer (a mainframe).

[Moving Vehicle]

The GPU or the chip of one embodiment of the present invention can be used in an automobile, which is a moving vehicle, and around a driver's seat in the automobile.

Figure 32G:
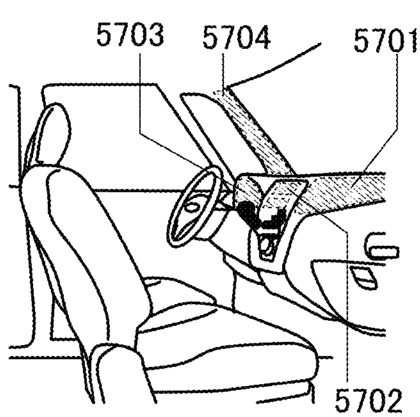

FIG. 32G shows an area around a windshield inside an automobile, which is an example of a moving vehicle. FIG. 32G illustrates a display panel 5701, a display panel 5702, and a display panel 5703 that are attached to a dashboard and a display panel 5704 that is attached to a pillar.

The display panel 5701 to the display panel 5703 can provide a variety of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for the view obstructed by the pillar (a blind spot) by showing a video taken by an imaging device (not illustrated) provided on the outside of the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be used as a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is used in these moving vehicles.

[Household Appliance]

Figure 32H:
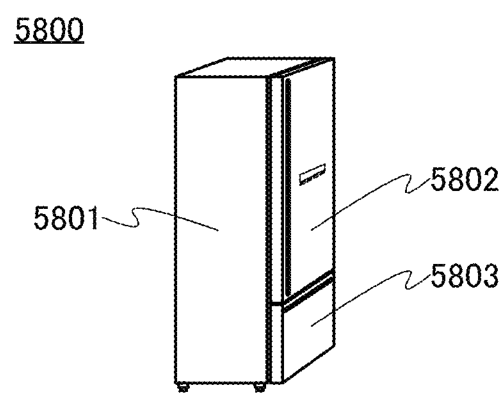

FIG. 32H shows an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as an example of a household appliance, examples of other household appliances include a vacuum cleaner, a microwave oven, an electronic oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in appropriate combination with the structures described in the other embodiments, examples, and the like.

Example 1

In this example, a stacked-layer structure including the oxide of one embodiment of the present invention was fabricated and analyzed through measurement by a constant photocurrent method (CPM). Note that Sample 1A to Sample 1E were fabricated in this example.

<1. Structure and Fabricating Method of Samples>

Sample 1A, Sample 1B, Sample 1C, Sample 1D, and Sample 1E in this example are described below.

Figure 33:
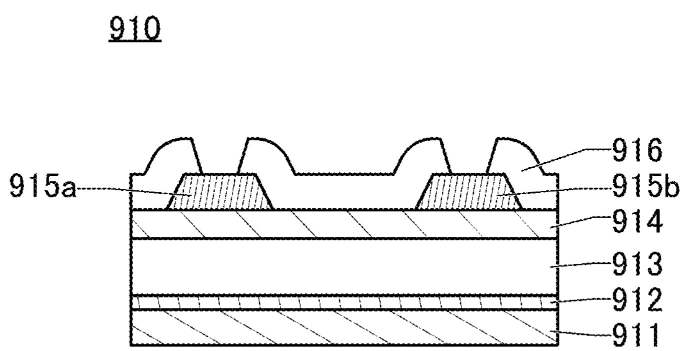
FIG. 33 is a schematic view showing a structure of samples.

FIG. 33 shows a structure 910 of Sample 1A to Sample 1E. Sample 1A to Sample 1E each include a substrate 911, an insulator 912 over the substrate 911, an insulator 913 over the insulator 912, an oxide 914 over the insulator 913, a conductor **915*a* and a conductor 915*b* over the oxide 914, and an insulator 916 over the oxide 914, the conductor 915*a*, and the conductor 915*b***.

Next, the method for fabricating the samples is described.

First, a quartz substrate was prepared as the substrate 911. Next, aluminum oxide was deposited to a thickness of 10 nm as the insulator 912 over the substrate 911 by an ALD method.

Then, silicon oxide was deposited to a thickness of 100 nm as the insulator 913 over the insulator 912 by a CVD method.

Subsequently, an oxide containing In, Ga, and Zn was deposited to a thickness of 40 nm as the oxide 914 over the insulator 913 by a sputtering method. The oxide 914 was deposited under the conditions where an oxide target containing In, Ga, and Zn (In:Ga:Zn=4:2:4.1 [atomic ratio]) was used, oxygen ($O_2$) at a flow rate of 45 sccm was used as a deposition gas, the deposition pressure was 0.7 Pa, the deposition power was 500 W, the substrate temperature was 130° C., and the target-substrate distance was 60 mm.

Then, after heat treatment was performed under a nitrogen atmosphere for 1 hour, the atmosphere was replaced by an oxygen atmosphere and heat treatment was performed under the oxygen atmosphere for 1 hour.

Here, the heat treatment temperature was different between Sample 1A to Sample 1E. Table 1 lists the heat treatment temperatures for Sample 1A to Sample 1E.

TABLE 1

| | Heat treatment temperature [° C.] |
|---|---|
| Sample 1A | 400 |
| Sample 1B | 450 |
| Sample 1C | 500 |
| Sample 1D | 550 |
| Sample 1E | 600 |

Then, over the oxide 914, a 30-nm-thick tungsten film was deposited as a conductive film to be the conductor 915*a* and the conductor 915*b* by a sputtering method. Subsequently, the conductive film was processed to form the conductor 915*a* and the conductor 915*b* functioning as electrodes.

Then, the insulator 916 functioning as a protective film was formed over the conductor 915*a*, the conductor 915*b*, and the oxide 914. As an insulating film to be the insulator 916, a 100-nm-thick silicon oxide film was deposited by a CVD method. Subsequently, openings were formed in part of the insulating film to expose part of the conductor 915*a* and part of the conductor 915*b*, whereby the insulator 916 was formed.

Through the above steps, Sample 1A to Sample 1E in this example were fabricated.

<2. Measurement Results of CPM Measurement of Samples>

Sample 1A to Sample 1E were subjected to CPM measurement to evaluate localized states in the oxide 914 of each sample. As an analysis apparatus for the CPM measurement, a subgap light absorption spectrum measurement system (SGA-5) manufactured by Bunkoukeiki Co., Ltd. was used.

Note that CPM measurement makes it possible to measure the amount of light absorption in localized states with high sensitivity and to relatively compare the density of localized states or the absorption due to localized states between samples. Specifically, the amount of monochromatic light for irradiation of the sample surface between terminals was adjusted such that the photocurrent value was kept constant in a state where voltage was applied between the conductor 915*a* and the conductor 915*b* provided in contact with the oxide 914 and functioning as a pair of electrodes, and an absorption coefficient was derived from the irradiation amount of the monochromatic light. Note that during the irradiation, the wavelength of the monochromatic light was swept in a range of 350 nm to 750 nm in steps of 10 nm from longer wavelengths toward shorter wavelengths. Note that a change in the absorption coefficient with respect to the wavelength which was revealed by the CPM measurement is sometimes referred to as a CPM spectrum.

In this example, the absorption coefficient was derived at each wavelength of the monochromatic light. In CPM measurement, the absorption coefficient at energy (converted from a wavelength) increases in accordance with the density of localized states. The absorption due to localized states in a sample can be derived by integrating a region in a CPM spectrum curve where the absorption coefficient is larger than that of light absorption due to the band tail on the valence band side (also referred to as Urbach tail).

Specifically, absorption α due to localized states in a sample can be calculated from the following formula.

$$\alpha = \int \frac{\alpha_{CPM} - \alpha_U}{E} dE \quad \text{[Formula 1]}$$

Here, E represents energy, $\alpha_{CPM}$ represents an absorption coefficient obtained through CPM measurement, and $\alpha_U$ represents an absorption coefficient in the Urbach tail.

Figure 34:
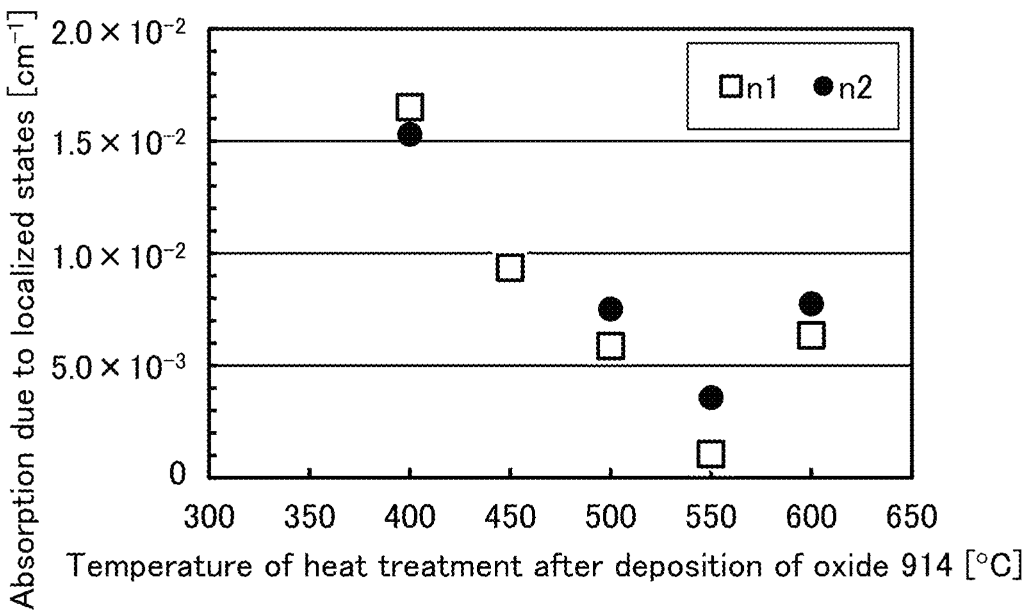
FIG. 34 is a diagram showing measurement results of CPM measurement of samples.

FIG. 34 shows measurement results of the CPM measurement of Sample 1A to Sample 1E. The vertical axis represents absorption [$cm^{-1}$] due to localized states, whereas the horizontal axis represents the temperature [° C.] of the heat treatment which was performed after the deposition of the oxide 914 in each sample. Note that two pieces of each of Sample 1A, Sample 1C, Sample 1D, and Sample 1E were subjected to the measurement. One piece of Sample 1B was subjected to the measurement.

The results shown in FIG. 34 revealed that the density of localized states depends on the conditions of the heat treatment after the deposition of the oxide 914. It was found that especially in the heat treatment temperature range of 400° C. to 550° C., the density of localized states tends to decrease as the temperature increases. On the other hand, the density of localized states in the case where the heat treatment temperature is 600° C. was found to be higher than at least that in the case where the heat treatment temperature is 550° C.

It was thus shown that performing heat treatment under appropriate conditions after deposition of an oxide semiconductor film can reduce the density of localized states in the oxide semiconductor.

Specifically, it is preferable to perform heat treatment at higher than or equal to 450° C. and lower than or equal to 600° C. after deposition of the oxide semiconductor film. By this treatment, absorption due to localized states in the oxide semiconductor film can be $1.0\times10^{-2}$ $cm^{-1}$ or less. When this oxide semiconductor is used for a channel formation region of a transistor, the channel formation region has a reduced carrier concentration and can be i-type (intrinsic) or substantially i-type. Thus, a semiconductor device including a transistor with favorable electrical characteristics can be manufactured.

The structures described above in this example can be used in appropriate combination with any of the other examples, embodiments, and the like.

Example 2

In this example, a stacked-layer structure of the oxide of one embodiment of the present invention and an insulator was fabricated and analyzed by secondary ion mass spectrometry (SIMS). Note that in this example, a Sample 2A group (Sample 2A-1, Sample 2A-2, Sample 2A-3, and Sample 2A-4), a Sample 2B group (Sample 2B-1, Sample 2B-2, Sample 2B-3, and Sample 2B-4), a Sample 2C group (Sample 2C-1, Sample 2C-2, Sample 2C-3, and Sample 2C-4), a Sample 2D group (Sample 2D-1, Sample 2D-2, Sample 2D-3, and Sample 2D-4), and a Sample 2E group (Sample 2E-1, Sample 2E-2, Sample 2E-3, and Sample 2E-4) were fabricated.

In this example, Sample 2A-1, Sample 2B-1, Sample 2C-1, Sample 2D-1, and Sample 2E-1 are sometimes referred to as a Sample 2-1 group. In a similar manner, there are a Sample 2-2 group (Sample 2A-2, Sample 2B-2, Sample 2C-2, Sample 2D-2, and Sample 2E-2), a Sample 2-3 group (Sample 2A-3, Sample 2B-3, Sample 2C-3, Sample 2D-3, and Sample 2E-3), and a Sample 2-4 group (Sample 2A-4, Sample 2B-4, Sample 2C-4, Sample 2D-4, and Sample 2E-4).

<1. Structure and Fabricating Method of Samples>

Figure 35:
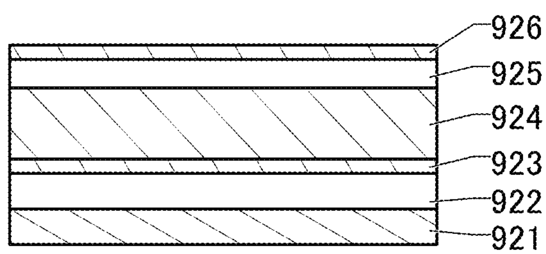
FIG. 35 is a schematic view showing a structure of samples.

The Sample 2A group, Sample 2B group, Sample 2C group, Sample 2D group, and Sample 2E group in this example are described below. FIG. 35 shows the structure of the Sample 2A group to Sample 2E group. The Sample 2A group to Sample 2E group each include a substrate 921, an insulator 922 over the substrate 921, an insulator 923 over the insulator 922, an oxide 924 over the insulator 923, an insulator 925 over the oxide 924, and an insulator 926 over the insulator 925.

Here, the samples were subjected to first heat treatment and second heat treatment under different conditions. Note that in this example, the first heat treatment is heat treatment performed after deposition of the oxide 924. The second heat treatment is heat treatment performed after deposition of the insulator 926.

Specifically, Table 2 lists the temperatures of the first heat treatment and the second heat treatment performed on the samples. Note that "-" in Table 2 means that the corresponding heat treatment was not performed.

TABLE 2

| | Temperature of first heat treatment [° C.] | Temperature of second heat treatment [° C.] |
|---|---|---|
| Sample 2A-1 | — | — |
| Sample 2A-2 | — | 300 |
| Sample 2A-3 | — | 350 |
| Sample 2A-4 | — | 400 |
| Sample 2B-1 | 400 | — |
| Sample 2B-2 | 400 | 300 |
| Sample 2B-3 | 400 | 350 |
| Sample 2B-4 | 400 | 400 |
| Sample 2C-1 | 450 | — |
| Sample 2C-2 | 450 | 300 |
| Sample 2C-3 | 450 | 350 |
| Sample 2C-4 | 450 | 400 |
| Sample 2D-1 | 500 | — |
| Sample 2D-2 | 500 | 300 |
| Sample 2D-3 | 500 | 350 |
| Sample 2D-4 | 500 | 400 |
| Sample 2E-1 | 550 | — |
| Sample 2E-2 | 550 | 300 |
| Sample 2E-3 | 550 | 350 |
| Sample 2E-4 | 550 | 400 |

Next, the methods for fabricating the samples are described.

First, a silicon substrate was prepared as the substrate 921. Then, a 100-nm-thick thermal oxide film was formed as the insulator 922 over the substrate 921.

Then, silicon nitride was deposited to a thickness of 20 nm as the insulator 923 over the insulator 922 by a sputtering method. Note that the silicon nitride has a function of inhibiting diffusion of hydrogen. Thus, entry of hydrogen from the substrate 921 side is negligible.

Subsequently, a 300-nm oxide containing In, Ga, and Zn was deposited as the oxide 924 over the insulator 923 by a sputtering method. The oxide 924 was deposited under the conditions where an oxide target containing In, Ga, and Zn (In:Ga:Zn=4:2:4.1 [atomic ratio]) was used, oxygen ($O_2$) at a flow rate of 45 sccm was used as a deposition gas, the deposition pressure was 0.7 Pa, the deposition power was 500 W, the substrate temperature was 200° C., and the target-substrate distance was 60 mm.

Then, the first heat treatment was performed on the Sample 2B group to Sample 2E group. The first heat treatment was performed in the following manner: heat treatment was performed at the predetermined temperature shown in Table 2 under a nitrogen atmosphere for 1 hour; then, the atmosphere was replaced by an oxygen atmosphere and heat treatment was performed at the predetermined temperature shown in Table 2 under the oxygen atmosphere for 1 hour.

Then, silicon oxide containing deuterium (D) was deposited to a thickness of 50 nm as the insulator 925 over the oxide 924 by a CVD method. The insulator 925 was deposited under the conditions where silane ($SiH_4$) at a flow rate of 2 sccm, dinitrogen monoxide ($N_2O$) at a flow rate of 800 sccm, and deuterium ($D_2$) at a flow rate of 200 sccm were used as deposition gases, the substrate temperature was 160° C., the deposition pressure was 200 Pa, and the deposition power was 150 W.

Next, the insulator 926 was deposited over the insulator 925. Silicon nitride was deposited to a thickness of 20 nm as the insulator 926 by a sputtering method. Note that the silicon nitride has a function of inhibiting diffusion of hydrogen. Thus, entry of hydrogen from above the insulator 926 is negligible.

Then, the second heat treatment was performed on the Sample 2-2 group to Sample 2-4 group. As the second heat treatment, heat treatment was performed at the predetermined temperature shown in Table 2 under a nitrogen atmosphere for 1 hour.

Through the above steps, the Sample 2A group to Sample 2E group in this example were fabricated.

<2. Measurement Results of SIMS of Samples>

Next, SIMS analysis was conducted from the substrate 921 side to detect the deuterium (D) concentration in the oxide 924. The deuterium concentration was evaluated using, as an analysis instrument, a PHI ADEPT-1010 quadrupole SIMS instrument manufactured by ULVAC-PHI, Inc.

FIG. 36A, FIG. 36B, FIG. 37A, FIG. 37B, and FIG. 38 show deuterium concentration profiles in the depth direction in the films of the samples. Note that all the results of the SIMS analysis in this example were quantified using a standard sample formed of an oxide containing In, Ga, and Zn, which was the same as the oxide 924. In FIG. 36A, FIG. 36B, FIG. 37A, FIG. 37B, and FIG. 38, the horizontal axis represents the depth [nm] in the vertical direction from a sample surface, whereas the vertical axis represents the deuterium (D) concentration [atoms/$cm^3$] in the oxide 924.

Figure 36A:
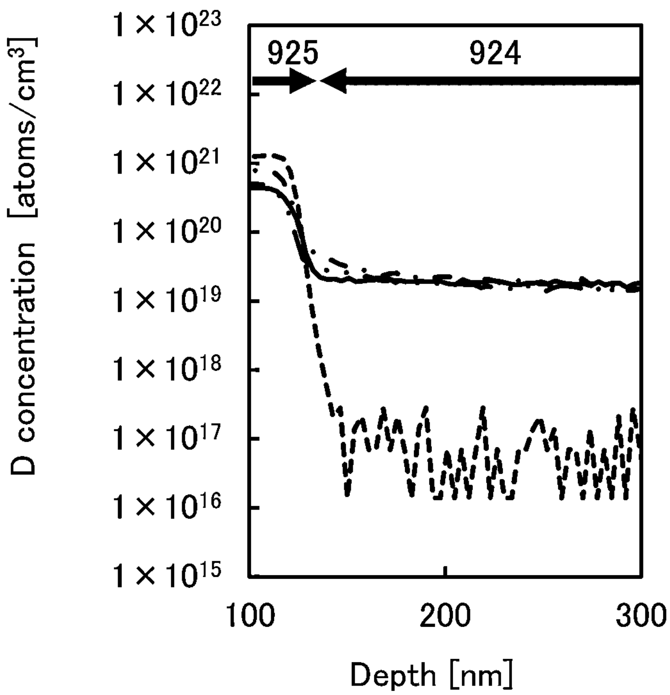
FIG. 36A and FIG. 36B are diagrams showing measurement results of SIMS measurement of samples.
Figure 36B:
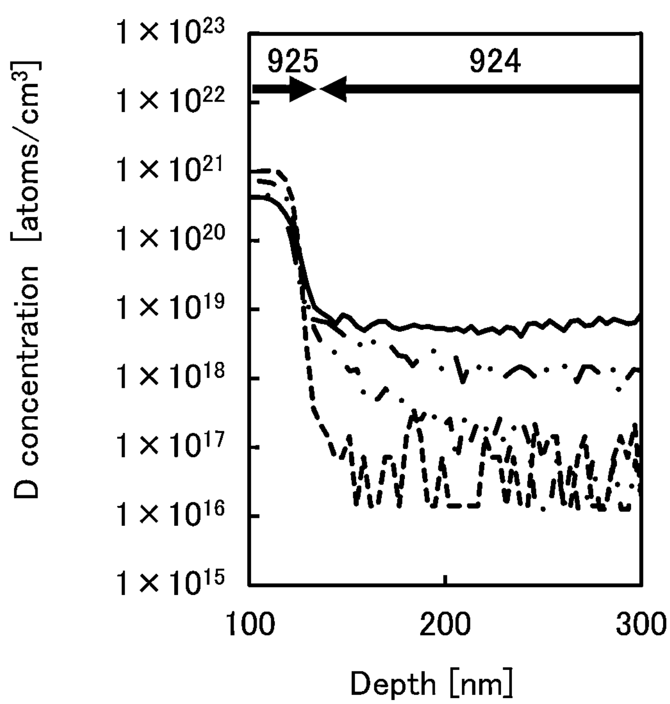
Figure 37A:
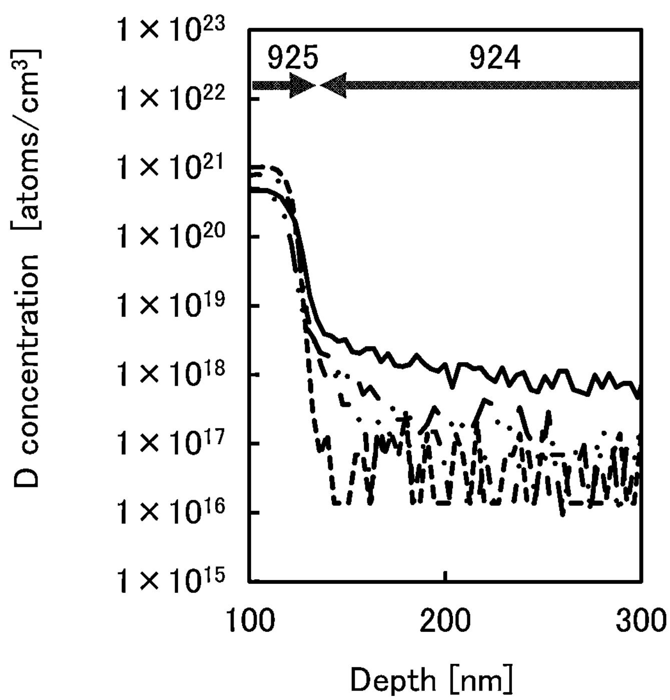
FIG. 37A and FIG. 37B are diagrams showing measurement results of SIMS measurement of samples.
Figure 37B:
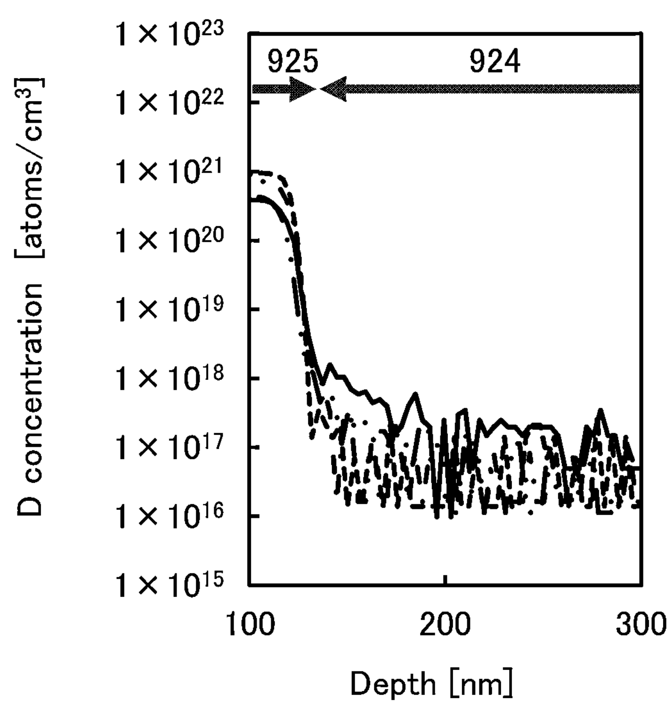
Figure 38:
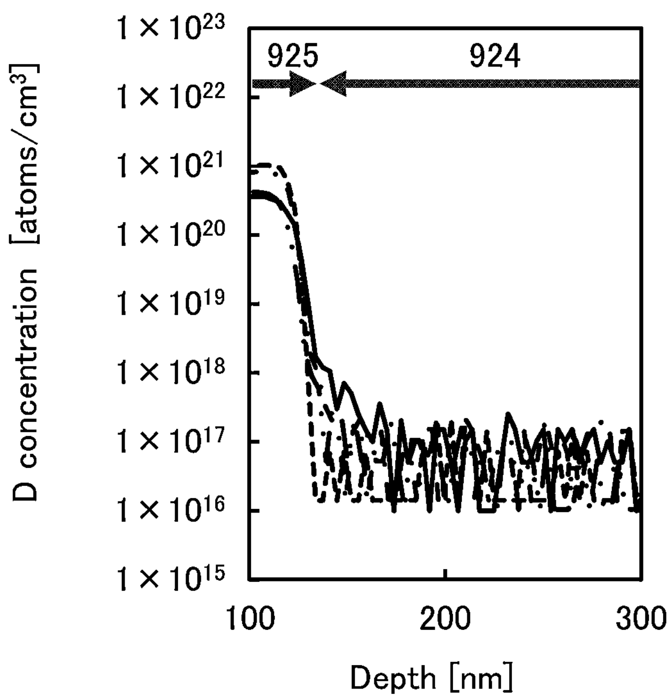
FIG. 38 is a diagram showing measurement results of SIMS measurement of samples.

FIG. 36A shows the analysis results of the Sample 2A group (the first heat treatment: not performed) and FIG. 36B shows the analysis results of the Sample 2B group (the first heat treatment temperature: 400° C.). FIG. 37A shows the analysis results of the Sample 2C group (the first heat treatment temperature: 450° C.) and FIG. 37B shows the analysis results of the Sample 2D group (the first heat treatment temperature: 500° C.). FIG. 38 shows the analysis results of the Sample 2E group (the first heat treatment temperature: 550° C.).

In FIG. 36A, FIG. 36B, FIG. 37A, FIG. 37B, and FIG. 38, the dotted lines denote the deuterium (D) concentration profiles in the depth direction in the films of the Sample 2-1 group (the second heat treatment: not performed). The dashed-dotted lines denote the deuterium (D) concentration profiles in the depth direction in the films of the Sample 2-2 group (the second heat treatment temperature: 300° C.). The dashed-two dotted lines denote the deuterium (D) concentration profiles in the depth direction in the films of the Sample 2-3 group (the second heat treatment temperature: 350° C.). The solid lines denote the deuterium (D) concentration profiles in the depth direction in the films of the Sample 2-4 group (the second heat treatment temperature: 400° C.).

From FIG. 36A, FIG. 36B, FIG. 37A, FIG. 37B, and FIG. 38, it was found that performing the first heat treatment inhibits diffusion of deuterium from the insulator 925 into the oxide 924 which would occur at the time of the second heat treatment.

Here, to confirm the tendency of the measurement results, the diffusion length of deuterium in each of the Sample 2A group, Sample 2B group, Sample 2C group, Sample 2D group, and Sample 2E group was calculated with the use of the measurement results of the SIMS analysis.

Here, a method for calculating the diffusion length of deuterium is described.

A deuterium concentration C(x, T, t) at a distance x [nm] from a surface of the oxide 924, a temperature T, and time t can be expressed by a complementary error function erfc(y) (y is a variable) as shown by the following formula.

$$C(x, T, t) = C_s \operatorname{erfc}\frac{x}{2\sqrt{D(T)t}} + c \qquad \text{[Formula 2]}$$

In the above formula, $C_s$ is the deuterium concentration at the surface, D(T) is the diffusion coefficient at the temperature T, and c is a constant.

The profile of the deuterium concentration C(x, T, t) for the distance x which was obtained through the SIMS measurement is fitted by a least-squares method using the above formula. At this time, the fitting parameters are $C_s$ and D(T).

Then, the diffusion coefficient D(T) for the inverse of the temperature T is plotted on a semi-log graph (an Arrhenius plot is created). From the Arrhenius plot, a frequency factor and activation energy are calculated.

Next, the diffusion length of deuterium was calculated using the calculated frequency factor and activation energy, with the temperature T set to 400° C. and the time t set to 1 hour.

Figure 39:
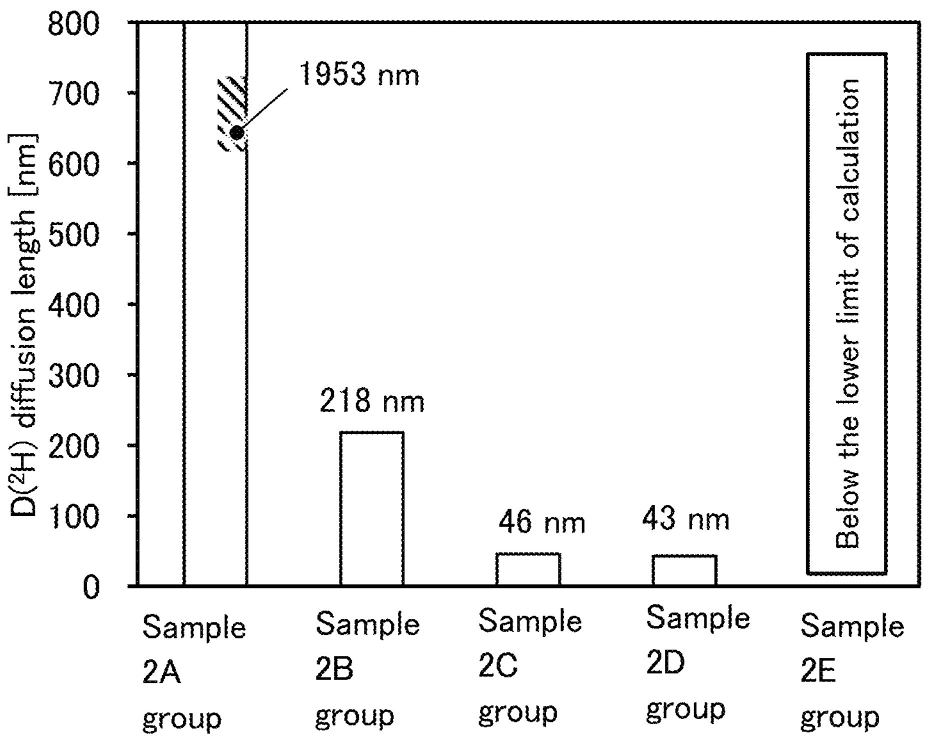
FIG. 39 is a diagram illustrating diffusion lengths of deuterium in samples.

FIG. 39 shows calculation results of the diffusion length of deuterium in the Sample 2A group, Sample 2B group, Sample 2C group, Sample 2D group, and Sample 2E group.

The diffusion length of deuterium calculated by the above-described method was 1953 nm in the Sample 2A group, 218 nm in the Sample 2B group, 46 nm in the Sample 2C group, 43 nm in the Sample 2D group, and 23 nm in the Sample 2E group. Note that calculation of the diffusion length of deuterium in the Sample 2E group was attempted but the diffusion length of deuterium was small; thus, the diffusion length of deuterium in the Sample 2E group is expressed as “Below the lower limit of calculation” in FIG. 39.

When a change in the profile of the deuterium (D) concentration in the depth direction in the films of each of the Sample 2B group to Sample 2D group is taken into account, the diffusion length of deuterium in the Sample 2C group is estimated to exceed 46 nm. Specifically, the diffusion length of deuterium in the Sample 2C group is estimated to be in the range of 46 nm to 128 nm.

The above results showed that the higher the temperature of the first heat treatment is, the smaller the diffusion length of hydrogen is. Accordingly, it was confirmed that performing heat treatment after deposition of an oxide semiconductor film inhibits diffusion of hydrogen into the oxide semiconductor which would be caused by the heat generated in the treatment in a later step.

The structures described above in this example can be used in appropriate combination with any of the other examples, embodiments, and the like.

Example 3

In this example, a stacked-layer structure of the oxide of one embodiment of the present invention and an insulator was fabricated and analyzed by secondary ion mass spectrometry (SIMS). Note that in this example, a Sample 3A group (Sample 3A-1, Sample 3A-2, and Sample 3A-3), a Sample 3B group (Sample 3B-1, Sample 3B-2, and Sample 3B-3), a Sample 3C group (Sample 3C-1, Sample 3C-2, and Sample 3C-3), a Sample 3D group (Sample 3D-1, Sample 3D-2, and Sample 3D-3), and a Sample 3E group (Sample 3E-1, Sample 3E-2, and Sample 3E-3) were fabricated.

In this example, Sample 3A-1, Sample 3B-1, Sample 3C-1, Sample 3D-1, and Sample 3E-1 are sometimes referred to as a Sample 3-1 group. In a similar manner, there are a Sample 3-2 group (Sample 3A-2, Sample 3B-2, Sample 3C-2, Sample 3D-2, and Sample 3E-2) and a Sample 3-3 group (Sample 3A-3, Sample 3B-3, Sample 3C-3, Sample 3D-3, and Sample 3E-3).

<1. Structure and Fabricating Method of Samples>

Figure 40:
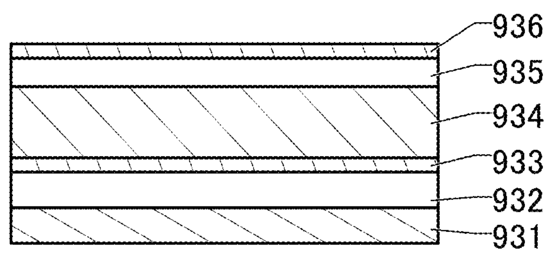
FIG. 40 is a schematic view showing a structure of samples.

The Sample 3A group, Sample 3B group, Sample 3C group, Sample 3D group, and Sample 3E group in this example are described below. FIG. 40 shows the structure of the Sample 3A group to Sample 3E group. The Sample 3A group to Sample 3E group each include a substrate 931, an insulator 932 over the substrate 931, an insulator 933 over the insulator 932, an oxide 934 over the insulator 933, an insulator 935 over the oxide 934, and an insulator 936 over the insulator 935.

Here, the samples were subjected to first heat treatment and second heat treatment under different conditions. Note that in this example, the first heat treatment is heat treatment performed after deposition of the oxide 934. The second heat treatment is heat treatment performed after deposition of the insulator 936.

Specifically, Table 3 lists the temperatures of the first heat treatment and the second heat treatment performed on the samples. Note that “-” in Table 3 means that the corresponding heat treatment was not performed.

TABLE 3

| | Temperature of first heat treatment [° C.] | Temperature of second heat treatment [° C.] |
|---|---|---|
| Sample 3A-1 | — | — |
| Sample 3A-2 | — | 400 |
| Sample 3A-3 | — | 500 |
| Sample 3B-1 | 400 | — |
| Sample 3B-2 | 400 | 400 |
| Sample 3B-3 | 400 | 500 |
| Sample 3C-1 | 450 | — |
| Sample 3C-2 | 450 | 400 |
| Sample 3C-3 | 450 | 500 |
| Sample 3D-1 | 500 | — |
| Sample 3D-2 | 500 | 400 |
| Sample 3D-3 | 500 | 500 |
| Sample 3E-1 | 550 | — |
| Sample 3E-2 | 550 | 400 |
| Sample 3E-3 | 550 | 500 |

Next, the methods for fabricating the samples are described.

First, a silicon substrate was prepared as the substrate 931. Then, a 100-nm-thick thermal oxide film was formed as the insulator 932 over the substrate 931.

Next, aluminum oxide was deposited to a thickness of 20 nm as the insulator 933 over the insulator 932 by a sputtering method. Note that the aluminum oxide has a function of inhibiting diffusion of oxygen. Thus, entry of oxygen from the substrate 931 side is negligible.

Subsequently, a 300-nm oxide containing In, Ga, and Zn was deposited as the oxide 934 over the insulator 933 by a sputtering method. The oxide 934 was deposited under the conditions where an oxide target containing In, Ga, and Zn (In:Ga:Zn=4:2:4.1 [atomic ratio]) was used, oxygen ($O_2$) at a flow rate of 45 sccm was used as a deposition gas, the deposition pressure was 0.7 Pa, the deposition power was 500 W, the substrate temperature was 200° C., and the target-substrate distance was 60 mm.

Then, the first heat treatment was performed on the Sample 3B group to Sample 3E group. The first heat treatment was performed in the following manner: heat treatment was performed at the predetermined temperature shown in Table 3 under a nitrogen atmosphere for 1 hour; then, the atmosphere was replaced by an oxygen atmosphere and heat treatment was performed at the predetermined temperature shown in Table 3 under the oxygen atmosphere for 1 hour.

Next, silicon oxide containing a stable oxygen isotope whose mass number is 18 (expressed as $^{18}O$) was deposited to a thickness of 50 nm as the insulator 935 over the oxide 934 by a sputtering method. The insulator 935 was deposited under the conditions where a silicon oxide ($SiO_2$) target was used, $^{18}O$-containing oxygen ($O_2$) at a flow rate of 25 sccm was used as a deposition gas, the deposition pressure was 0.7 Pa, the deposition power was 2.5 kW (RF), the substrate temperature was 100° C., and the target-substrate distance was 60 mm.

Next, the insulator 936 was deposited over the insulator 935. Aluminum oxide was deposited to a thickness of 20 nm as the insulator 936 by a sputtering method. Note that the aluminum oxide has a function of inhibiting diffusion of oxygen. Thus, entry of oxygen from above the insulator 936 is negligible.

Then, the second heat treatment was performed on the Sample 3-2 group and Sample 3-3 group. As the second heat treatment, heat treatment was performed at the predetermined temperature shown in Table 3 under a nitrogen atmosphere for 1 hour.

Through the above steps, the Sample 3A group to Sample 3E group in this example were fabricated.

<2. Measurement Results of SIMS of Samples>

Next, SIMS analysis was conducted from the substrate 931 side with the oxide 934 of each of the Sample 3A group to Sample 3E group used as a layer on which quantitation was performed, to detect the $^{18}O$ concentration in the oxide 934. The $^{18}O$ concentration was evaluated using, as an analysis instrument, a PHI ADEPT-1010 quadrupole SIMS instrument manufactured by ULVAC-PHI, Inc.

FIG. 41A, FIG. 41B, FIG. 42A, FIG. 42B, and FIG. 43 show $^{18}O$ concentration profiles in the depth direction in the films of the samples. Note that all the results of the SIMS analysis in this example were quantified using a standard sample formed of an oxide containing In, Ga, and Zn, which was the same as the oxide 934. In FIG. 41A, FIG. 41B, FIG. 42A, FIG. 42B, and FIG. 43, the horizontal axis represents the depth [nm] in the vertical direction from a sample surface, whereas the vertical axis represents the $^{18}O$ concentration [atoms/$cm^3$] in the oxide 934.

Figure 41A:
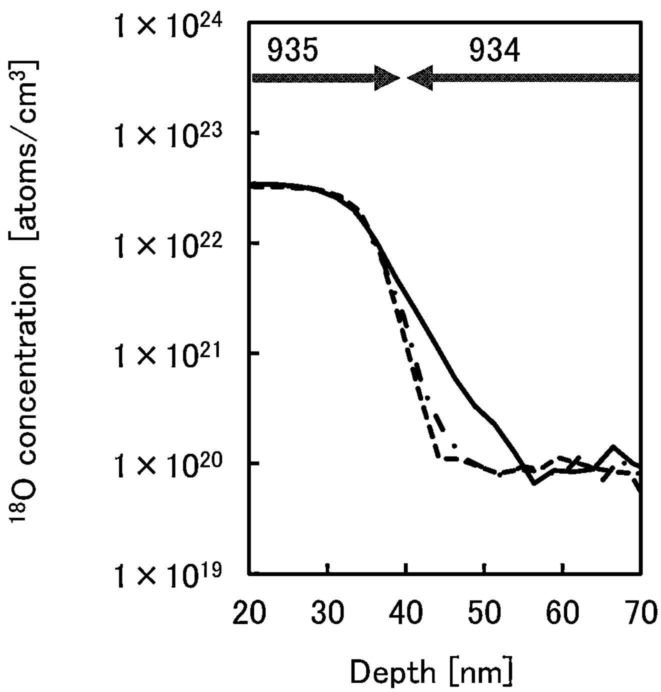
FIG. 41A and FIG. 41B are diagrams showing measurement results of SIMS measurement of samples.
Figure 41B:
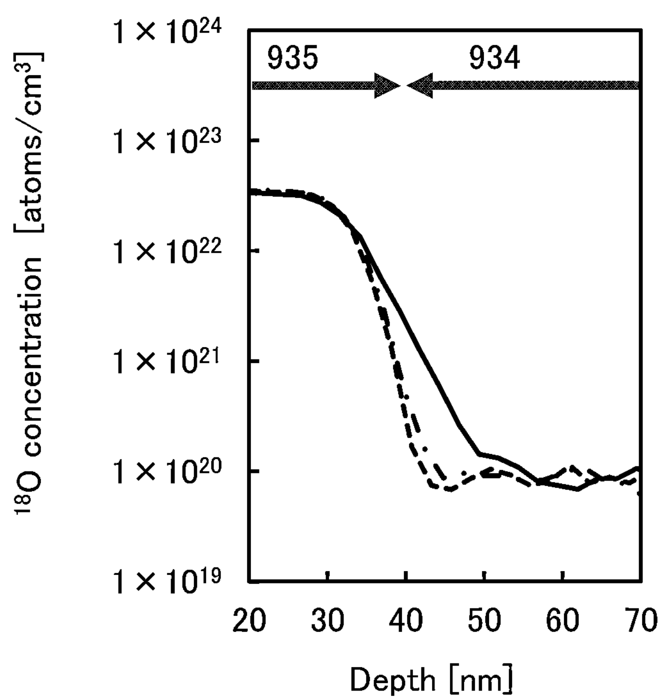
Figure 42A:
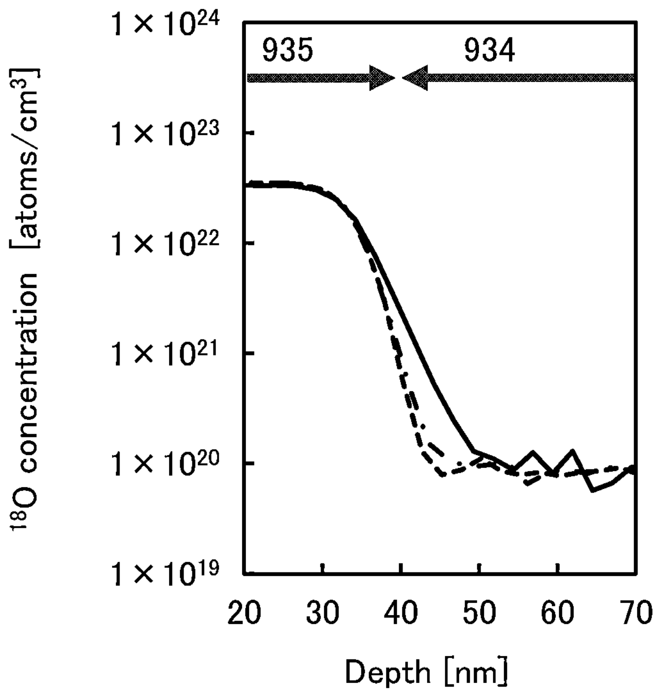
FIG. 42A and FIG. 42B are diagrams showing measurement results of SIMS measurement of samples.
Figure 42B:
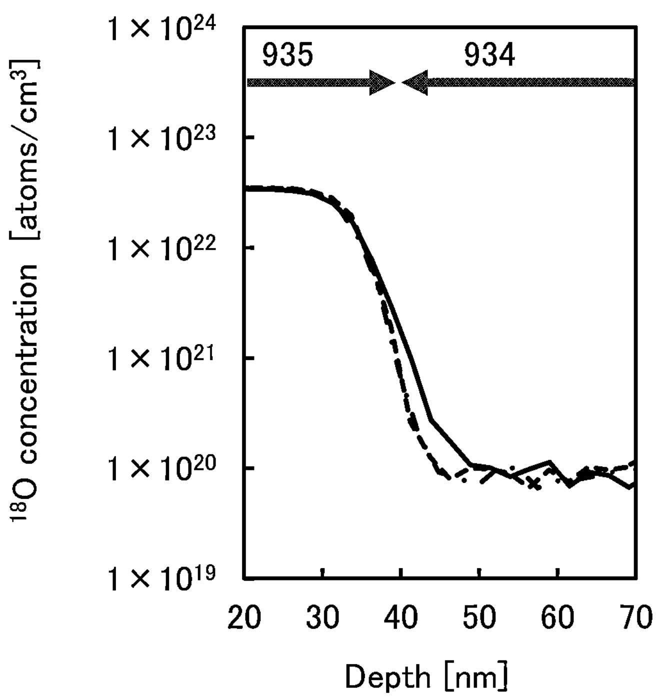
Figure 43:
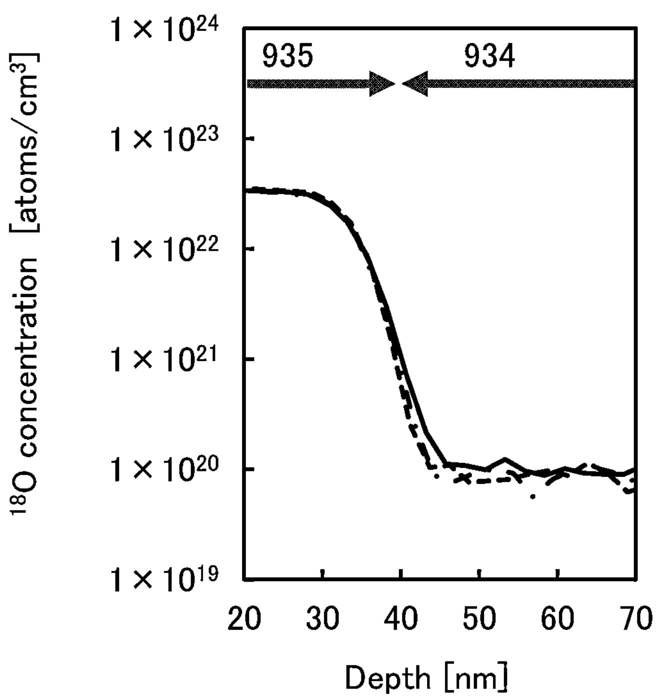
FIG. 43 is a diagram showing measurement results of SIMS measurement of samples.

FIG. 41A shows the analysis results of the Sample 3A group (the first heat treatment: not performed) and FIG. 41B shows the analysis results of the Sample 3B group (the first heat treatment temperature: 400° C.). FIG. 42A shows the analysis results of the Sample 3C group (the first heat treatment temperature: 450° C.) and FIG. 42B shows the analysis results of the Sample 3D group (the first heat treatment temperature: 500° C.). FIG. 43 shows the analysis results of the Sample 3E group (the first heat treatment temperature: 550° C.).

In FIG. 41A, FIG. 41B, FIG. 42A, FIG. 42B, and FIG. 43, the dotted lines denote the $^{18}O$ concentration profiles in the depth direction in the films of the Sample 3-1 group (the second heat treatment: not performed). The dashed-dotted lines denote the $^{18}O$ concentration profiles in the depth direction in the films of the Sample 3-2 group (the second heat treatment temperature: 400° C.). The solid lines denote the $^{18}O$ concentration profiles in the depth direction in the films of the Sample 3-3 group (the second heat treatment temperature: 500° C.).

From FIG. 41A, FIG. 41B, FIG. 42A, FIG. 42B, and FIG. 43, it was found that performing the first heat treatment inhibits diffusion of oxygen from the insulator 935 into the oxide 934 which would occur at the time of the second heat treatment. The first heat treatment performed at a higher temperature tended to inhibit more the diffusion of oxygen from the insulator 935 into the oxide 934 which would occur at the time of the second heat treatment.

Accordingly, it was confirmed that performing heat treatment after deposition of an oxide semiconductor film inhibits diffusion of oxygen into the oxide semiconductor which would be caused by the heat generated in the treatment in a later step.

The structures described above in this example can be used in appropriate combination with any of the other examples, embodiments, and the like.

REFERENCE NUMERALS

100: capacitor, 110: conductor, 112: conductor, 115: conductor, 120: conductor, 125: conductor, 130: insulator, 140: conductor, 142: insulator, 145: insulator, 150: insulator, 152: insulator, 153: conductor, 154: insulator, 156: insulator, 160: insulator, 162: insulator, 164: insulator, 166: conductor, 168: conductor, 200: transistor, **200_*n*: transistor, 200_1: transistor, 200*a*: transistor, 200A: transistor, 200*b*: transistor, 200T: transistor, 205: conductor, 205*a*: conductor, 205*b*: conductor, 210: insulator, 212: insulator, 214: insulator, 216: insulator, 217: insulator, 218: conductor, 222: insulator, 224: insulator, 230: oxide, 230*a*: oxide, 230A: oxide film, 230*b*: oxide, 230B: oxide film, 230*c*: oxide, 230C: oxide film, 230*d*: oxide, 230D: oxide film, 234: region, 236*a*: region, 236*b*: region, 240: conductor, 240*a*: conductor, 240*b*: conductor, 240*c*: conductor, 241: insulator, 241*a*: insulator, 241*b*: insulator, 241*c*: insulator, 242*a*: conductor, 242A: conductive film, 242*b*: conductor, 242B: conductive layer, 242*c*: conductor, 243*a*: oxide, 243A: oxide film, 243*b*: oxide, 243B: oxide layer, 246*a*: conductor, 246*b*: conductor, 250: insulator, 250*a*: insulator, 250A: insulating film, 250*b*: insulator, 254: insulator, 260: conductor, 260*a*: conductor, 260A: conductive film, 260*b*: conductor, 260B: conductive film, 265: sealing portion, 265*a*: sealing portion, 265*b*: sealing portion, 271*a*: insulator, 271*b*: insulator, 274: insulator, 280: insulator, 282: insulator, 283: insulator, 284: insulator, 286: insulator, 287: insulator, 290: memory device, 290_1: memory device, 290_5: memory device, 292: capacitor device, 292*a*: capacitor device, 292*b*: capacitor device, 293: insulator, 294: conductor, 296: insulator, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 411: element layer, 413: transistor layer, 415: memory device layer, 415_1: memory device layer, 415_3: memory device layer, 415_4: memory device layer, 420: memory device, 424: conductor, 440: conductor, 470: memory unit, 600: memory device, 700: electronic component, 702: printed circuit board, 704: circuit substrate, 711: mold, 712: land, 713: electrode pad, 714: wire, 720: storage device, 721: driver circuit layer, 722: storage circuit layer, 730: electronic component, 731: interposer, 732: package substrate, 733: electrode, 735: semiconductor device, 901: boundary region, 902: boundary region, 910: structure, 911: substrate, 912: insulator, 913: insulator, 914: oxide, 915*a*: conductor, 915*b*: conductor, 916: insulator, 921: substrate, 922: insulator, 923: insulator, 924: oxide, 925: insulator, 926: insulator, 931: substrate, 932: insulator, 933: insulator, 934: oxide, 935: insulator, 936: insulator, 1001: wiring, 1002: wiring, 1003: wiring, 1004: wiring, 1005: wiring, 1006: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: storage device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: stationary game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: door for refrigerator, 5803**: door for freezer.

The invention claimed is:

1. A metal oxide film comprising a c-axis aligned crystal, wherein the metal oxide film comprises indium, gallium, and zinc, wherein in the metal oxide film, an atomic ratio of indium, gallium, and zinc is 4:2:3 or in a range of ±30% thereof, wherein a diffusion length of hydrogen in the metal oxide film is 200 nm or less, wherein the diffusion length is calculated with a temperature being 400° C. and 1 hour, and wherein in the metal oxide film, absorption due to a localized state calculated by a constant photocurrent method (CPM) is $1\times10^{-2}$ $cm^{-1}$ or less.

2. A transistor comprising the metal oxide film according to claim 1 in a channel formation region.

3. A semiconductor device comprising:

a metal oxide layer;

a first conductor and a second conductor in contact with the metal oxide layer;

a third conductor overlapping the metal oxide layer; and an insulator positioned between the metal oxide layer and the third conductor, wherein the metal oxide layer comprises indium, gallium, and zinc, wherein the metal oxide layer comprises a c-axis aligned crystal, wherein in the metal oxide layer, an atomic ratio of indium, gallium, and zinc is 4:2:3 or in a range of ±30% thereof, wherein a diffusion length of hydrogen in the metal oxide layer is 200 nm or less, wherein the diffusion length is calculated with a temperature being 400° C. and 1 hour, and wherein in the metal oxide layer, absorption due to a localized state calculated by a constant photocurrent method (CPM) is $1\times10^{-2}$ $cm^{-1}$ or less.

4. A semiconductor device comprising:

a metal oxide layer;

a first conductor and a second conductor over the metal oxide layer;

an insulator positioned between the first conductor and the second conductor and positioned over the metal oxide layer; and a third conductor over the insulator, wherein the metal oxide layer comprises indium, gallium, and zinc, wherein the metal oxide layer comprises a c-axis aligned crystal, wherein in the metal oxide layer, an atomic ratio of indium, gallium, and zinc is 4:2:3 or in a range of ±30% thereof, wherein a diffusion length of hydrogen in the metal oxide layer is 200 nm or less, wherein the diffusion length is calculated with a temperature being 400° C. and 1 hour, and wherein in the metal oxide layer, absorption due to a localized state calculated by a constant photocurrent method (CPM) is $1\times10^{-2}$ $cm^{-1}$ or less.

5. The metal oxide film according to claim 1, wherein the localized state is in a range between a position at a distance of 0.5 eV from a valence band maximum of the metal oxide film toward a conduction band side and a position at a distance of 0.5 eV from a conduction band minimum of the metal oxide film toward a valence band side.

6. The semiconductor device according to claim 3, wherein the localized state is in a range between a position at a distance of 0.5 eV from a valence band maximum of the metal oxide layer toward a conduction band side and a position at a distance of 0.5 eV from a conduction band minimum of the metal oxide layer toward a valence band side.

7. The semiconductor device according to claim 4, wherein the localized state is in a range between a position at a distance of 0.5 eV from a valence band maximum of the metal oxide layer toward a conduction band side and a position at a distance of 0.5 eV from a conduction band minimum of the metal oxide layer toward a valence band side.

* * * * *